United States Patent
Otsuka et al.

(10) Patent No.: US 8,373,786 B2
(45) Date of Patent: Feb. 12, 2013

(54) SOLID-STATE IMAGING DEVICE, MANUFACTURING METHOD THEREOF, AND ELECTRONIC DEVICE

(75) Inventors: Yoichi Otsuka, Kanagawa (JP); Yoshiyuki Enomoto, Kanagawa (JP); Kazunori Nagahata, Kanagawa (JP); Tadayuki Kimura, Kanagawa (JP); Toshihiko Hayashi, Kanagawa (JP); Kenichi Aoyagi, Kanagawa (JP); Kiyotaka Tabuchi, Kanagawa (JP); Iwao Sugiura, Kanagawa (JP); Kensaku Maeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 413 days.

(21) Appl. No.: 12/434,340

(22) Filed: May 1, 2009

(65) Prior Publication Data

US 2009/0303359 A1     Dec. 10, 2009

(30) Foreign Application Priority Data

May 22, 2008  (JP) ................. 2008-134698
Apr. 8, 2009  (JP) ................. 2009-094304

(51) Int. Cl.
*H04N 5/335* (2011.01)
*H04N 9/083* (2006.01)
*H01L 31/113* (2006.01)
*H01L 21/311* (2006.01)

(52) U.S. Cl. ........ 348/308; 348/320; 348/280; 348/294; 257/294; 438/694

(58) Field of Classification Search .................. 348/280, 348/266, 272, 273, 294, 302, 308, 309; 257/294; 438/694

See application file for complete search history.

(56) References Cited

U.S. PATENT DOCUMENTS

| 5,874,188 A | * | 2/1999 | Roberts et al. | ................ 430/7 |
| 5,889,277 A | * | 3/1999 | Hawkins et al. | ............ 250/208.1 |
| 2006/0076591 A1 | * | 4/2006 | Sekine et al. | ................. 257/294 |

FOREIGN PATENT DOCUMENTS

| JP | 63-208803 A | 8/1988 |
| JP | 05-288922 A | 11/1993 |
| JP | 09-172153 A | 6/1997 |
| JP | 2000-241619 | 9/2000 |
| JP | 05-199114 | 9/2003 |
| JP | 2007-208051 | 9/2003 |
| JP | 2005-294647 A | 10/2005 |
| JP | 2006-163316 | 6/2006 |
| JP | 2006-253463 | 9/2006 |
| JP | 2006-295125 A | 10/2006 |
| JP | 2007-181209 | 7/2007 |
| JP | 2007-184422 | 7/2007 |

* cited by examiner

*Primary Examiner* — Sinh Tran
*Assistant Examiner* — Mark Monk
(74) *Attorney, Agent, or Firm* — Rader, Fishman & Grauer PLLC

(57) ABSTRACT

A solid-state imaging device has: an imaging region in which a plurality of pixels each having a photoelectric conversion element are arranged, and a color filter. The color filter includes: filter components of a first color (2G), filter components of a second color (2R) formed by self-alignment and each being surrounded by the filter components of the first color (2G), and filter components of a third color (2B) formed by self-alignment and each being surrounded by the filter components of the first color (2G).

22 Claims, 35 Drawing Sheets

(CROSS SECTION a – a')

(CROSS SECTION a – a')　　　(CROSS SECTION b – b')

(CROSS SECTION a – a')     (CROSS SECTION b – b')

(CROSS SECTION a – a')

(CROSS SECTION a - a')     (CROSS SECTION b - b')

(CROSS SECTION a - a')    (CROSS SECTION b - b')

(CROSS SECTION a – a')

(CROSS SECTION a - a')    (CROSS SECTION b - b')

(CROSS SECTION a - a')     (CROSS SECTION b - b')

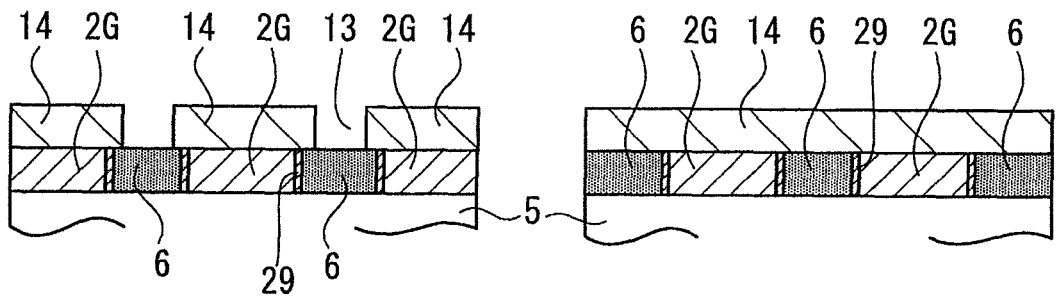
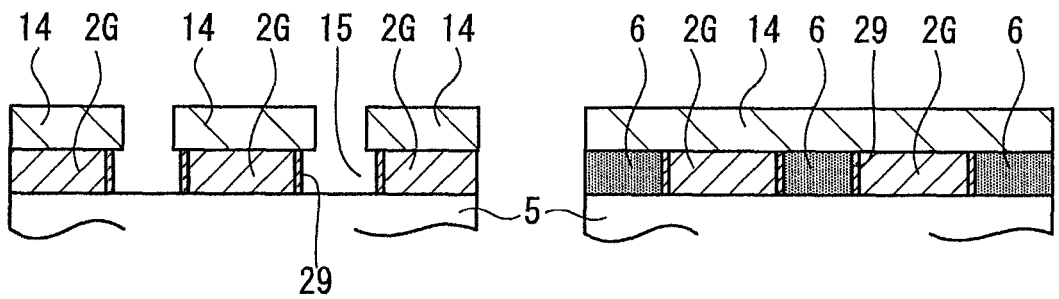
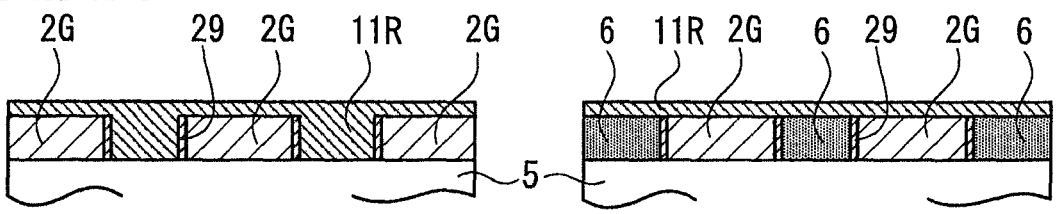
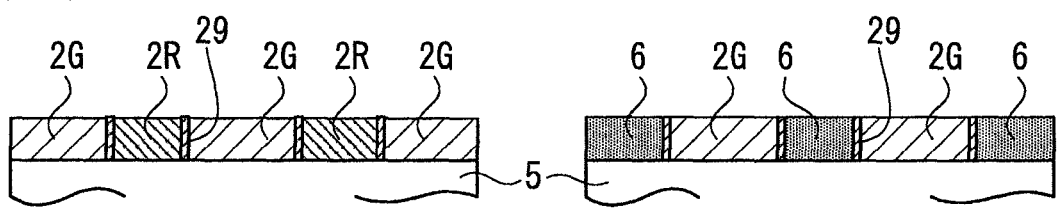
(CROSS SECTION a – a')  (CROSS SECTION b – b')

(CROSS SECTION a - a')　　　(CROSS SECTION b - b')

(CROSS SECTION a – a')          (CROSS SECTION b – b')

(CROSS SECTION a – a')　　　　(CROSS SECTION b – b')

(CROSS SECTION a - a')   (CROSS SECTION b - b')

(CROSS SECTION a – a')

(CROSS SECTION a - a')

(CROSS SECTION a – a')  (CROSS SECTION b – b')

(CROSS SECTION a – a')    (CROSS SECTION b – b')

(CROSS SECTION a - a')     (CROSS SECTION b - b')

(CROSS SECTION a – a')      (CROSS SECTION b – b')

(CROSS SECTION a – a')     (CROSS SECTION b – b')

(24, 29, 38, 55)

SOLID-STATE IMAGING DEVICE, MANUFACTURING METHOD THEREOF, AND ELECTRONIC DEVICE

BACKGROUND OF THE INVENTION

The present application contains subject matter related to that disclosed in the Japanese Patent Application No. JP 2008-134698 filed in the Japan Patent Office on May 22, 2008, and the Japanese Patent Application No. JP 2009-094304 filed in the Japan Patent Office on Apr. 8, 2009, the entire contents of all are hereby incorporated by reference.

FIELD OF THE INVENTION

The present invention relates to a solid-state imaging device, a manufacturing method thereof, and an electronic device having the solid-state imaging device.

DESCRIPTION OF THE RELATED ART

Solid-state imaging devices can be largely categorized as amplification type solid-state imaging devices and charge-transfer type solid-state imaging devices. The former are typified by Complementary Metal Oxide Semiconductor (CMOS) image sensors, and the latter are typified by Charge Coupled Device (CCD) image sensors.

A CMOS solid-state imaging device has an imaging region and a peripheral circuit arranged around the imaging region. A plurality of pixels, each composed of a photodiode (PD) which is a photoelectric conversion element and a plurality of pixel transistors (MOS transistors), are two-dimensionally arranged in the imaging region. A CCD solid-state imaging device has an imaging region composed of a plurality of photodiodes (PDs) which are photoelectric conversion elements and CCD-type vertical transfer registers. The photodiodes are two-dimensionally arranged, and the CCD-type vertical transfer registers are arranged corresponding to each row of the photodiodes. The CCD solid-state imaging device also has a peripheral circuit that constitutes a CCD-type horizontal transfer register (which transfers signal charges from the imaging region in the horizontal direction), an output portion, and a signal processing circuit.

Primary color (green (G)/red (R)/blue (B)) type color filters are generally used in these solid-state imaging devices typified by a digital still camera. A colorant-internally-added type photoresist, to which a colorant (a pigment or a dye) is internally added, is used as the material of these color filters. As related arts, Japanese Unexamined Patent Application Publication No. 2007-208051 (referred to as "Patent Document 1" hereinafter) and Japanese Unexamined Patent Application Publication No. H05-199114 (referred to as "Patent Document 2" hereinafter) disclose technologies for improving processing accuracy of color filters.

In a method of forming color filters described in Patent Document 1, a color filter material film of a first color is formed on a substrate, and a color filter layer of the first color is formed by dry-etching the color filter material film of the first color through a resist mask formed on the color filter material film of the first color. A color filter layer of a first color and a color filter layer of a third first color are respectively formed by repeating the same process.

In a method of forming the color filters described in Patent Document 2, a positive photoresist film is formed on a substrate, a portion corresponding to a first color of the positive photoresist film is exposed and developed so as to form a groove, and a pigment dispersion liquid of the first color is injected into the groove and cured. Thereafter, a portion corresponding to a second color of the positive photoresist film is exposed and developed so as to form a groove, and a pigment dispersion liquid of the second color is injected into the groove and cured. Thereafter, a portion corresponding to a third color of the positive photoresist film is exposed and developed so as to form a groove, and a pigment dispersion liquid of the third color is injected into the groove and cured. In this manner, color filters are formed.

SUMMARY OF THE INVENTION

In recent years, pixels of solid-state imaging devices are becoming more and more miniaturized. If the common colorant-internally-added type photoresists mentioned above are used as color filter materials, processing accuracy such as dimensional controllability of the materials are approaching their limits. These materials are patterned for each color in the order of, for example, red, green, and blue. In addition to the aforesaid processing accuracy problem, color mixture caused by misalignment of colors when the positive photoresist film is exposed is becoming another serious problem. In addition, as the pixels of solid-state imaging devices are becoming more and more miniaturized, it is necessary to reduce the film thickness of the color filters so as to maintain and improve the sensitivity characteristic of the solid-state imaging device. Thus, it is desired to develop breakthrough technologies to solve the aforesaid problems.

These breakthrough technologies include technologies for improving a composition ratio that contributes to a photolithography function by developing new photoresist base composition and composite and introducing new colorants having high absorbence. Further, these breakthrough technologies include technologies such as a method other than photolithography method, a combination of photolithography method and dry etching method for example, and a pattern forming technique using the combination.

On the other hand, the related arts disclosed in Patent Documents 1 and 2 are known as technologies for improving color filter processing accuracy. However, in the related art disclosed in Patent Document 1, the color filter of the first color is dry etched with a photosensitive photoresist mask, and therefore color filters of three colors can not be self-aligned. Thus, superposition accuracy will not likely be improved.

In Patent Document 2, a positive photoresist film is formed and a pattern is formed, and then a pigment dispersion material of the first color is injected and cured so as to form a color filter of the first color. At this point, it is necessary to cure the positive photoresist by heat or ultraviolet irradiation to prevent the positive photoresist and the color filter of the first color from mixing. However, since photosensitive agent contained in the positive photoresist is decomposed and therefore loses photosensitivity, it becomes impossible to from patterns of color filters. Thus, the technology disclosed in Patent Document 2 is not practical.

In view of the foregoing, it would be desirable to provide a solid-state imaging device in which processing accuracy of color filters can be improved and color mixture can be inhibited, a manufacturing method thereof, and an electronic device having the solid-state imaging device.

A solid-state imaging device according to an embodiment of the present invention includes: an imaging region in which a plurality of pixels each having a photoelectric conversion element are arranged; and a color filter, wherein the color filter includes: filter components of a first color; filter components of a second color formed by self-alignment and each being surrounded by the filter components of the first color, and filter components of a third color formed by self-alignment and each being surrounded by the filter components of the first color.

In the solid-state imaging device according to the embodiment of the present invention, since the filter components of the first color, the second color and the third color of the color filter are formed by are self-alignment, processing accuracy of the color filter can be improved. Further, since the filter components of each color are not superposed on each other, color mixture is inhibited. The filter components of the first color surround each of the filter components of second color and each of the filter components of the third color. Thus, the filter components of the first color are formed in one continuous piece and therefore have high adhesive strength to the base material, so that the color filter is unlikely to peel off.

A manufacturing method of a solid-state imaging device according to another embodiment of the present invention includes the steps of: forming either filter components of a first color, or filter components of a second color and filter components of a third color in openings of a hard mask formed on a substrate; and forming the filter components of remaining color in openings which are formed by removing the hard mask. The filter components of the second color and the filter components of the third color are each surrounded by the filter components of the first color so as to form a color filter.

In the manufacturing method of the solid-state imaging device according to the embodiment of the present invention, the filter components of the first color, the second color and the third color are formed by are self-alignment. Thus, a color filter having high dimensional accuracy and processing accuracy can be formed. Further, since superposition error of the filter components of the first color, the second color and the third color is caused, a solid-state imaging device having inhibited color mixture can be obtained.

A manufacturing method of a solid-state imaging device according to another embodiment of the present invention includes the steps of: forming filter components of a first color on a substrate, the filter components of the first color having openings formed therein and having an inorganic film on at least the top surface thereof; selectively forming filter components of a second first color and filter components of a third color in the openings, the filter components of the second color and the filter components of the third color being each surrounded by the filter components of the first color; and planarizing the filter components of the second first color and the filter components of the third color until the inorganic film is exposed.

In the manufacturing method of the solid-state imaging device according to the embodiment of the present invention, the filter components of the second color and the filter components of the third color are self-aligned to the filter components of the first color. Thus, a color filter having high dimensional accuracy and processing accuracy can be formed. Further, since superposition error of the filter components of the first color, the second color and the third color is caused, a solid-state imaging device having inhibited color mixture can be obtained.

An electronic device according to another embodiment of the present invention includes a solid-state imaging device; an optical system for guiding incident light into photoelectric conversion elements of the solid-state imaging device; and a signal processing circuit. The solid-state imaging device includes an imaging region in which a plurality of pixels each having a photoelectric conversion element are arranged. The solid-state imaging device includes further includes a color filter which has filter components of a first color, filter components of a second color each surrounded by the filter components of the first color, and filter components of a third color each surrounded by the filter components of the first color.

In the electronic device according to the embodiment of the present invention, since the solid-state imaging device has a highly accurately formed color filter, color mixture is inhibited.

With the solid-state imaging device according to the embodiment of the present invention, it is possible to improve the precessing accuracy of the color filter and inhibiting color mixture.

With the manufacturing method of the solid-state imaging device according to the embodiment of the present invention, it is possible to manufacture a solid-state imaging device whose color filter is formed with improved accuracy, and therefore color mixture can be inhibited.

With regard to the electronic device according to the embodiment of the present invention, since a solid-state imaging device having a highly accurately formed color filter with inhibited color mixture is obtained, it is possible to provide an electronic device with high picture quality and high performance.

BRIEF DESCRIPTION OF THE DRAWINGS

FIG. 21A to FIG. 21D show steps (part 2) for forming the color filter according to the fifth embodiment;

DETAILED DESCRIPTION OF THE PREFERRED EMBODIMENT(S)

Figure 1:
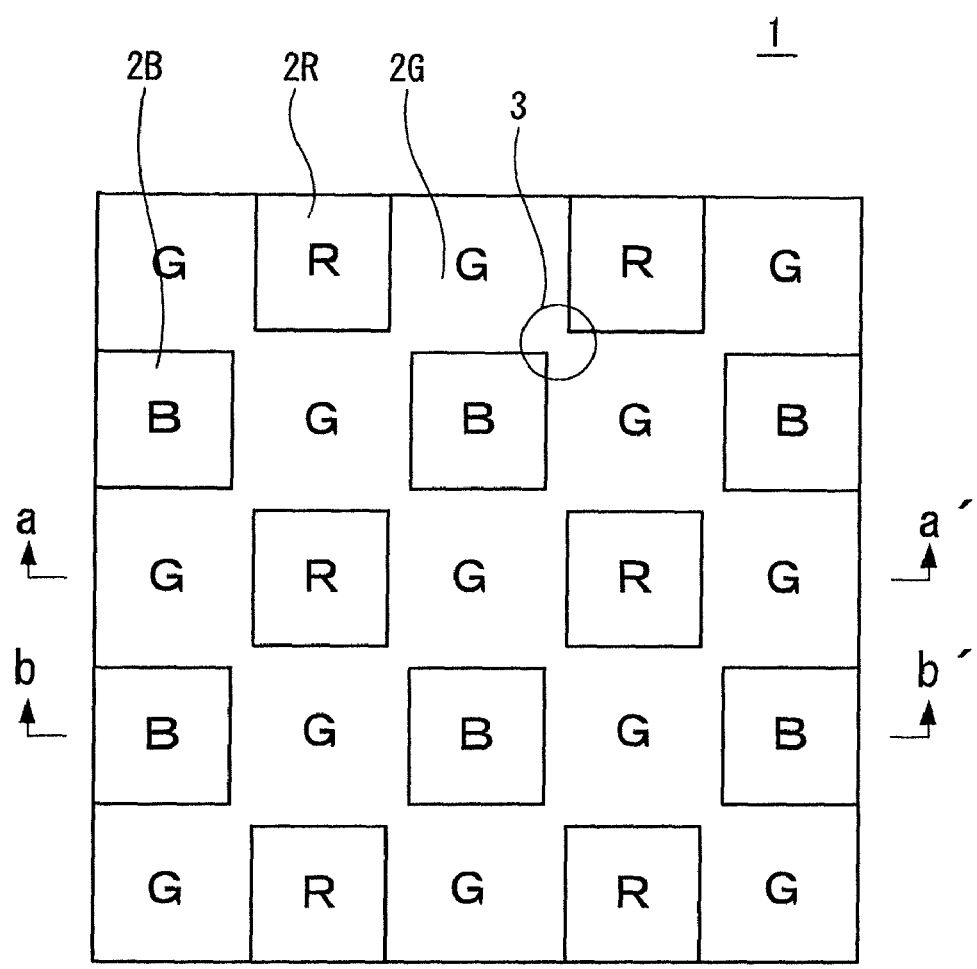
FIG. 1 shows the configuration of a color filter of a solid-state imaging device according to a first embodiment of the present invention.

Preferred embodiments of the present invention will be described with reference to the accompanying drawings.

The solid-state imaging device and the manufacturing method thereof according to the embodiments of the present invention feature the structure of a color filter and a manufacturing method thereof. The structure of the color filter and manufacturing method thereof according to the embodiments of the present invention can be applied, but not limited, to CMOS solid-state imaging devices and CCD solid-state imaging devices.

A configuration of a CMOS solid-state imaging device to which the embodiments of the present invention are applied will be schematically described below. This CMOS solid-state imaging device includes, though not shown in the drawings, an imaging region and a peripheral circuit portion. In the imaging region, a plurality of pixels each having a photoelectric conversion element are arranged two-dimensionally and regularly on a semiconductor substrate, such as a silicon substrate. Each of the pixels has, for example, a photodiode (which is a photoelectric conversion element) and a plurality of pixel transistors (which are so called "MOS transistors"). The plurality of pixel transistors may be configured by four transistors which are, for example, a transfer transistor, a reset transistor, an amplification transistor, and a selection transistor. Alternatively, the selection transistor may be omitted so that the plurality of Pixel transistors may be configured only by the rest three transistors. The peripheral circuit portion includes a vertical drive circuit, column signal processing circuits, a horizontal drive circuit, an output circuit and a control circuit.

The control circuit generates a clock signal, a control signal and the like to be referenced to operations of the vertical drive circuit, the column signal processing circuit, the horizontal drive circuit and the like, based on a vertical synchronizing signal, a horizontal synchronizing signal and a master clock. Such signals are inputted to the vertical drive circuit, the column signal processing circuit and the horizontal drive circuit.

The vertical drive circuit includes, for example, a shift resister. The vertical drive circuit selectively scans the respective pixels in the imaging region one-line at a time sequentially in a vertical direction. Then, through a vertical signal line, the vertical drive circuit supplies the column signal processing circuit with a pixel signal generated in a photoelectric conversion element (photodiode) of each pixel on the basis of signal charge in response to light intensity received.

The column signal processing circuit is arranged, for example, on each column of the pixels. The column signal processing circuit performs signal processing such as amplifying signal, removing noise from each pixel column using signals from black standard pixels (which are formed around an effective pixel region) and the like. A horizontal selecting switch is provided on an output stage of the column signal processing circuit to be connected between the circuit and horizontal signal lines.

The horizontal drive circuit includes, for example, a shift resister and sequentially outputs horizontal scanning pulses to select the respective column signal processing circuits in order, thereby allowing each of the column signal processing circuits to output a pixel signal to the horizontal signal line.

The output circuit performs signal processing on signals sequentially supplied from the respective column signal processing circuits through the horizontal signal line.

A multilayered wiring layer is formed on the substrate (on which the pixels are arranged) through interlayer insulating films. An on-chip color filter is formed on the multilayered wiring layer through a planarizing layer, and on-chip microlenses are formed on the on-chip color filter. A light-shielding film is formed in an area other than a pixel region of the imaging region, more specifically, in an area other than the peripheral circuit portion and photodiodes (namely, light-sensing parts) of the imaging region. The light-shielding film can be formed, for example, of a top wiring layer of the multilayered wiring layer.

An outlined structure of a CCD solid-state imaging device to which the embodiments of the present invention are applied will be described below. This CCD solid-state imaging device includes, though not shown in the drawings, a plurality of photoelectric conversion elements formed on a semiconductor substrate such as a silicon substrate, CCD-type vertical transfer registers corresponding to respective columns of the photoelectric conversion elements, a horizontal transfer register, an output portion, and a peripheral circuit portion that constitutes a signal processing circuit. The photoelectric conversion elements are each formed of, for example, a photodiode and are regularly two-dimensionally arranged. Each of the vertical transfer registers is formed by forming a transfer electrode on a transfer channel region of a diffuse layer through a gate insulation film. Each photodiode and the vertical transfer register corresponding to the photodiode constitute a unit pixel. The photodiodes and the vertical transfer registers constitute an imaging region. The horizontal transfer register is disposed at an end portion of each of the vertical transfer registers and is formed by forming a transfer electrode on a transfer channel region of a diffusion layer through a gate insulation film. The output portion is connected to the last stage of the horizontal transfer register. A light-shielding film is formed in an area other than a pixel region of the imaging region (more specifically, in an area other than the peripheral circuit section and photodiodes of the imaging region), in the horizontal transfer register, and in the output portion. The light-shielding film is formed such that it covers the transfer electrodes. On the light-shielding film, on-chip color filter and on-chip microlenses are successively formed through a planarizing film.

In the CCD solid-state imaging device, signal charges photoelectrically converted and generated by the photodiodes are read to the vertical transfer registers and transferred in the vertical direction, and signal charges for each line are transferred to the horizontal transfer register. In the horizontal transfer register, the signal charges are transferred in the horizontal direction, converted into a pixel signal through the output portion and outputted. The outputted pixel signal is obtained as an image signal through the signal processing circuit of the peripheral circuit portion. Although the aforesaid CCD solid-state imaging device is an inter-line transfer (IT) type solid-state imaging device, the CCD solid-state imaging device may also be applied to a frame interline transfer (FIT) type solid-state imaging device having a storage region made of only vertical transfer registers formed between the imaging region and the horizontal transfer register.

The solid-state imaging device and the manufacturing method thereof, particularly the color filter and the forming method thereof according to the embodiments of the present invention, can be applied to both the aforesaid CMOS solid-state imaging device and the aforesaid CCD solid-state imaging device. The color filter described in the following embodiments includes filter components of a first color, filter components of a second color, and filter components of a third color. Although the filter components of the first color, the filter components of the second color and the filter components of the third color are respectively green filter components, red filter components and blue filter components in the following embodiments, they are not necessary to be limited to such colors, but can be any colors.

First Embodiment

Configuration Example of Solid-State Imaging Device, Particularly Color Filter Thereof FIG. 1 shows a solid-state imaging device, particularly a color filter 1 thereof according to a first embodiment of the present invention. As previously described, in the solid-state imaging device according to the present embodiment, after an imaging region is formed, the color filter 1 shown in FIG. 1 is formed through a planarizing film. The color filter 1 includes red filter components 2R, green filter components 2G and blue filter components 2B arranged in a so-called Bayer array. In other words, the color filter 1 has a pattern in which the green filter components 2G are arranged checkerwise and in which rows of the red filter components 2R and blue filter components 2B are arranged every second row.

The color filter 1 is patterned such that the red filter components 2R and the blue filter components 2B are each surrounded by the green filter components 2G. In other words, the green filer components 2G, the red filter components 2R, and the blue filter components 2B are each formed in a square shape. Each of the green filter components 2G has four corners 3 thereof connected to adjacent corners 3 of other green filter components 2G, so that the green filter components 2G are formed in one continuous piece. Thus, each of the red filter components 2R and the blue filter components 2B is smaller than each of the green filter components 2G, and is independently formed surrounded by the green filter components 2G.

Further, as can be known from the manufacturing method which is to be described later, the red filter components 2R and blue filter components 2B are self-aligned to the green filters 2G using a hard mask. The filter components 2R, 2G, and 2B are each made of a material whose solid content contains no photosensitive component. The filter component material may be a photo-curing material composed of a pigment dispersion liquid, a binder resin, a monomer, a photo-polymerization initiator and a solvent. Alternatively, the filter component material may be a heat-curing material composed of a pigment dispersion liquid, a binder resin, a heat-curing agent and a solvent.

Examples of the binder resin include acrylic resin, novolac resin, styrenic resin, and a copolymerized resin thereof. Examples of the heat-curing agent include a melamine curing agent, a urea curing agent, and an epoxy curing agent. Examples of the solvent include ethyl lactate and dimethylformamide.

In the solid-state imaging device according to the present embodiment, the red filter components 2R and the blue filter components 2B are self-aligned to the green filter components 2G by using a hard mask. Thus, superposition error of the red filter components 2R, the green filter components 2G and the blue filter components 2B will not be caused, and as a result, the red filter components 2R, the green filter components 2G and the blue filter components 2B can be accurately formed without being superposed on each other. Further, since each of the green filter components 2G has four corners thereof connected to adjacent corners of other green filter components 2G so that the green filter components 2G are formed in one continuous piece, the green filter components 2G never peel off. Further, unlike the cases where a common lithography technique is used which may cause deterioration of peel strength due to insufficient exposure, since the filter components 2R, 2G, 2B are formed by coating the aforesaid photo-curing material or heat-curing material, they never peel off. Thus, processing accuracy of the color filter according to the present embodiment can be improved.

Since the filter components 2R, 2G, 2B are not superposed on each other, color mixture is inhibited. Further, material contains photosensitive component or material contains no photosensitive component is used as the filter component material. In the case where the material contains no photosensitive component is used as the filter component material, the film thickness of the filter can be reduced and thereby sensitivity characteristic can be improved accordingly.

[Method for Manufacturing Solid-state Imaging Device, Particularly Color Filter Thereof]

Next, a method for manufacturing the solid-state imaging device, particularly a color filter 1 thereof according to a first embodiment of the present invention will be described below with reference to FIG. 2A to FIG. 7. The cross sections shown in FIG. 2A to FIG. 4E correspond to those taken along line a-a' (green-red row) and along line b-b' (green-blue row) of FIG. 1.

First, as shown in FIG. 2A to FIG. 2F, filter components of a first color are formed. In the present embodiment, the green filter components 2G are formed as the filter components of the first color.

Figure 2A:
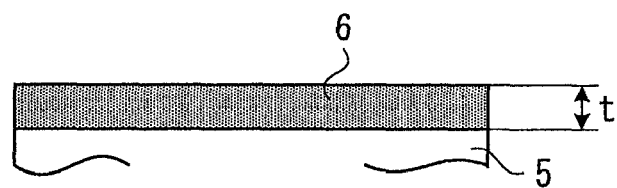
FIG. 2A to FIG. 2F show steps (part 1) for forming the color filter according to the first embodiment.

Specifically, as shown in FIG. 2A, a hard mask 6 having a predetermined thickness, namely, a thickness t corresponding to the thickness of the filter components of each color is formed on the entire surface of a substrate 5. The drawings show an imaging region. The planarizing film is formed on the outermost surface of the substrate 5 in order to form the color filter. Examples of the hard mask 6 include a polysilicon film, an amorphous silicon film, a silicon oxide film, a silicon nitride film, and a silicon oxide nitride film.

Figure 2B:
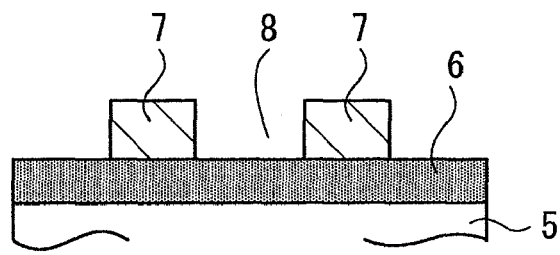

Thereafter, as shown in FIG. 2B (corresponding to the cross section taken along line a-a' shown in FIG. 1), a resist mask 7 is formed on the hard mask 6, the resist mask 7 having openings 8 formed in regions where the green filter components are to be formed. The resist mask 7 is a mask for dry-etching the hard mask 6. The resist mask 7 is formed by a so-called photolithography method wherein a photoresist film is formed, and the formed photoresist film is exposed through an optical mask having a desired pattern, and the pattern is developed.

Figure 2C:
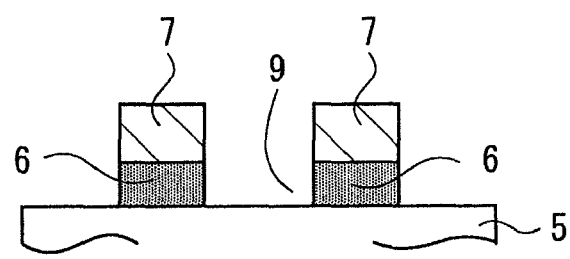

Thereafter, as shown in FIG. 2C, the hard mask 6 exposed from the opening portions 8 of the resist mask 7 is selectively removed by an anisotropic dry etching method such as reactive ion etching (RIE). By performing the selective etching, openings 9 are formed in the hard mask 6 in regions where the filter components of the first color are to be formed (i.e., regions where the green filter components are to be formed in the present embodiment).

Figure 2D:
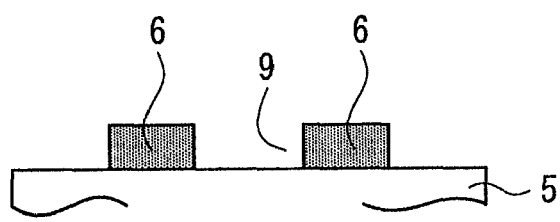

Thereafter, as shown in FIG. 2D, the resist mask 7 no longer required is removed by a method such as an ashing treatment, a wet cleaning and the like.

Figure 2E:
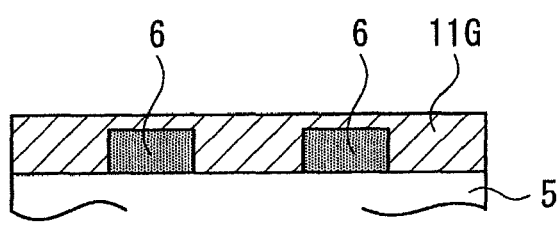

Thereafter, as shown in FIG. 2E, a green filter component material 11G is coated on the entire surface of the hard mask 6. The coating is performed, for example, by spin-coating. The green filter component material 11G is a material whose solid content contains no photosensitive component, and in the present embodiment, the aforesaid heat-curing material is used as the green filter component material 11G. After the green filter component material 11G is coated, the substrate is subjected to a heat treatment by being heated on a hot plate at a temperature in the range from 150° C. to 220° C. for 1 to 10 minutes so that the green filter component material 11G is heat-cured.

Figure 2F:
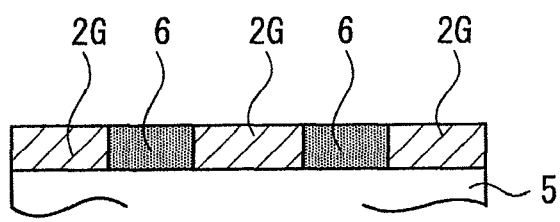
Figure 5:
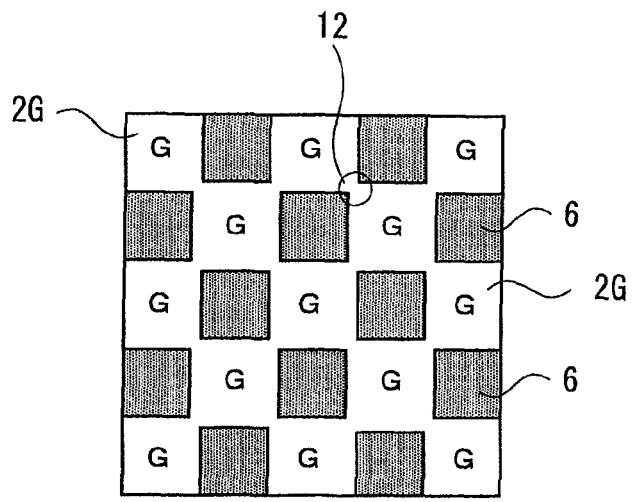
FIG. 5 is a plan view showing a filter component pattern formed in the step of FIG. 2F.

Thereafter, as shown in FIG. 2F, the entire surface of the green filter component material 11G is etched back or, alternatively, treated by chemical mechanical polishing (CMP) until the hard mask 6 is exposed from the green filter component material 11G. In such a manner, the green filter components 2G are formed. FIG. 5 is a plan view showing a pattern of the green filter components 2G formed in the step of FIG. 2F. As can be known from FIG. 5, although the green filter components 2G are each formed in a square shape and are arranged checkerwise as a whole, each of the green filter components 2G has four corners 12 thereof connected to adjacent corners 12 of other green filter components 2G, so that the green filter components 2G are formed in one continuous piece. The remaining hard mask 6 is surrounded by the green filter components 2G. The remaining hard mask 6 is formed such that when forming the red filter components and the blue filter components (respectively as filter components of a second color and filter components of a third color) in the following steps, the hard mask 6 can be separately etched for each color.

Thereafter, as shown in FIG. 3A to 3E, filter components of the second color are formed. Although the red filter components are regarded as the filter components of the second color in FIG. 3A to FIG. 3E, the blue filter components may be regarded as the filter components of the second color alternatively.

Figure 3A:
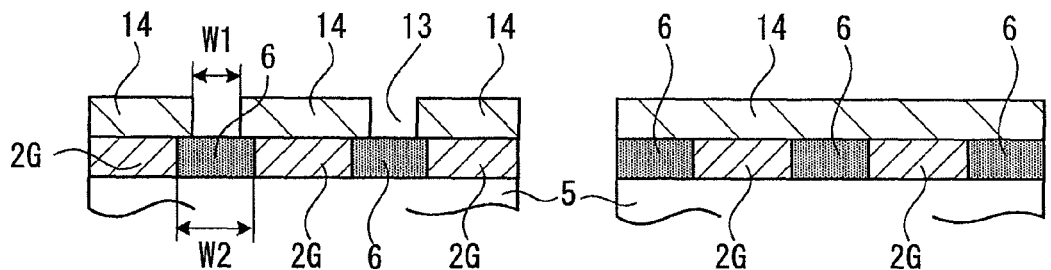
FIG. 3A to FIG. 3E show steps (part 2) for forming the color filter according to the first embodiment.

Specifically, as shown in FIG. 3A, in the state shown in FIG. 2F and FIG. 5, a resist mask 14 is formed on the surface including the green filter components 2G and the hard mask 6, the resist mask 14 having openings 13 formed in regions where the red filter components are to be formed. The green filter components 2G and the hard mask 6 corresponding to regions where the blue filter components are to be formed are covered with the resist mask 14. The resist mask 14 is formed using the aforesaid photolithography method. Herein, the resist mask 14 is patterned in such a manner that the edges of each of the openings 13 are formed inside the periphery of the corresponding region of the hard mask 6. In other words, the openings 13 are formed in such a manner that a width w1 of each of the openings 13 is smaller than a width w2 of the corresponding region of the hard mask 6 (i.e., w1<w2). The reason why each of the openings 13 is formed inside the periphery of the corresponding region of the hard mask 6 is because the green filter components 2G need to be protected from dry etching to be performed in the next step.

Figure 3B:
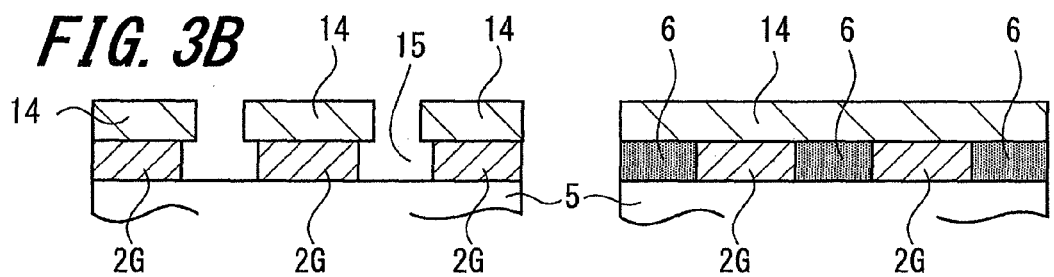

Next, as shown in FIG. 3B, the respective regions of the hard mask 6 exposed from the openings 13 are removed by isotropic dry etching through the resist mask 14. The dry etching is performed by a chemical dry etching (CDE) device. With this etching device, since etching gas easily spreads to the lower side of the resist mask 14 formed inside the periphery of the corresponding regions of the hard mask 6, the hard mask 6 can be completely etched. ($CF_4+O_2$) gas, ($CF_4+O_2+N_2$) gas and the like can be used as the etching gas. Openings 15 are formed by removing the hard mask 6.

Figure 3C:
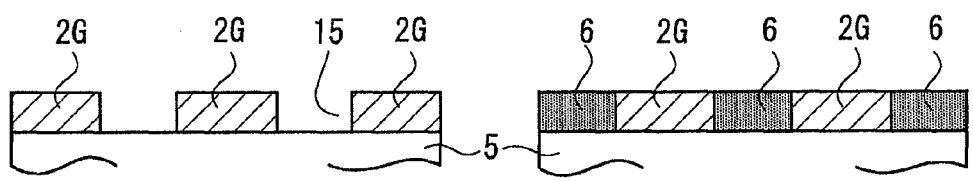

Thereafter, as shown in FIG. 3C, the resist mask 14 no longer required is removed using an organic solvent. When performing the step of removing the resist mask 14, it is necessary to consider the damage possible to be caused to the green filter components 2G. In the step of dry-etching the hard mask 6, a hardened layer (degenerated layer) is apt to form on the surface of the resist mask 14. Thus, in such a case, if the resist mask 14 is difficult to be removed with an organic agent due to presence of such a hardened layer, a gas containing fluorocarbon-based gas and oxygen may be used to remove the hardened layer first, and then the resist mask 14 is removed using the organic solvent.

Examples of the organic solvent include: N-methyl-2-pyr-roli-done, γ-butyrolactone, cyclopentanone, cyclohexanone, isophorone, N,N-dimethyl-acetamide, dimethylimidazolidinone, tetramethyl-urea, dimethyl sulfoxide, diethylene glycol dimethyl ether, diethylene glycol diethyl ether, diethyleneglycoldibutylether, propyleneglycol monomethylether, propyleneglycol monoethylether, dipropylene glycol monomethyl ether acetate, propyleneglycol monomethyletheracetate, methyl lactate, butyl lactate, methyl-1,3-butylene glycol acetate, 1,3-butylene glycol-3-monomethylether, methyl pyruvate, ethyl pyruvate, methyl-3-methoxypropionate and the like. These organic solvents can be used alone or as a mixed solvent of at least two thereof.

Figure 3D:
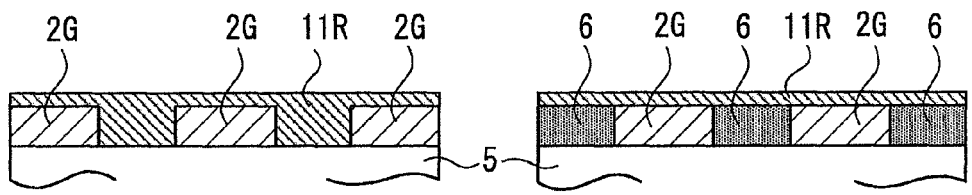

Next, as shown in FIG. 3D, a red filter component material 11R is coated on the entire surface (including the surface of the green filter components 2G, the surface of the hard mask 6, and the surface of the openings 15). The coating is performed, for example, by spin-coating. The red filter component material 11R is a material whose solid content contains no photosensitive component, and in the present embodiment, the aforesaid heat-curing material is used as the red filter component material 11R. After the red filter component material 11R is coated, the substrate is subjected to a heat treatment by being heated on a hot plate at a temperature in the range from 150° C. to 220° C. for 1 to 10 minutes so that the red filter component material 11R is heat-cured.

Figure 3E:
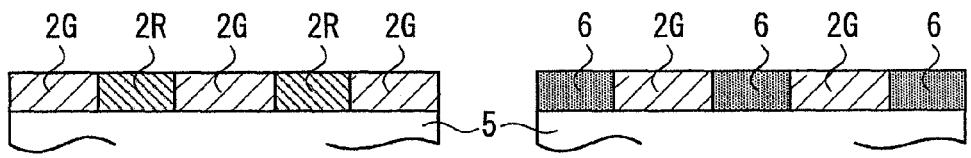
Figure 6:
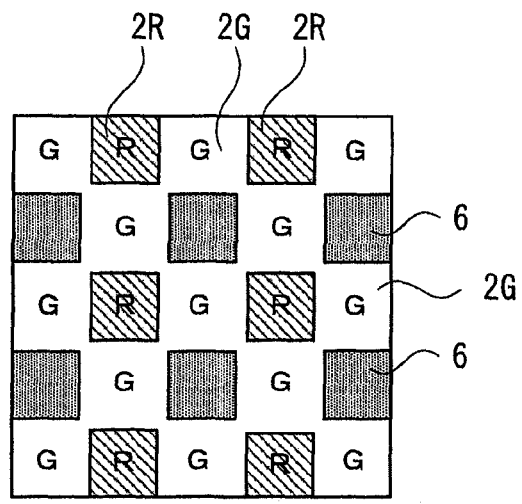
FIG. 6 is a plan view showing a filter component pattern formed in the step of FIG. 3E.

Thereafter, as shown in FIG. 3E, the entire surface of the red filter component material 11R is etched back or, alternatively, treated by chemical mechanical polishing (CMP) until the hard mask 6 and the green filter components 2G are exposed from the red filter component material 11R. In such a manner, the red filter components 2R are formed. FIG. 6 is a plan view showing a pattern of the red filter components 2R formed in the step of FIG. 3E and the green filter components 2G previously formed in the step shown in FIG. 2F. As can be known from FIG. 6, the red filter components 2R are each formed in a square shape and are each surrounded by the green filter components 2G.

The hard mask 6 remains in the regions where the blue filter components are to be formed.

Thereafter, as shown in FIG. 4A to 4E, filter components of a third color are formed. Although the blue filter components 2B are regarded as the filter components of the third color in FIG. 4A to FIG. 4E, the red filter components 2R may be regarded as the filter components of the third color alternatively.

Figure 4A:
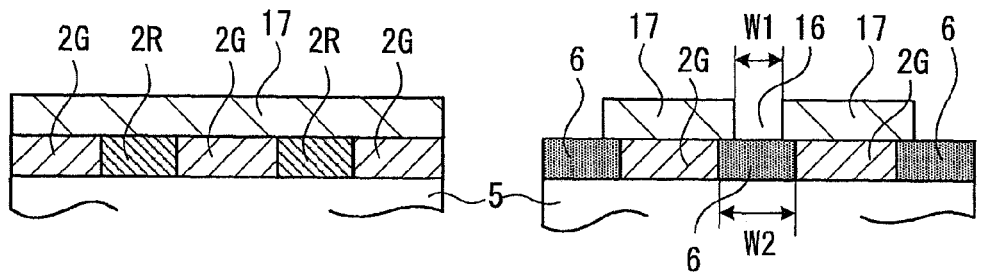
FIG. 4A to FIG. 4E show steps (part 3) for forming the color filter according to the first embodiment.

Specifically, as shown in FIG. 4A, in the state shown in FIG. 3E and FIG. 6, a resist mask 17 is formed on the surface including the green filter components 2G, the red filter components 2R and the hard mask 6, the resist mask 17 having openings 16 formed in regions corresponding to the remaining hard mask 6. The green filter components 2G and the red filter components 2R are covered with the resist mask 17. Similar to those described above, the resist mask 17 is formed using the photolithography method. The resist mask 17 is patterned in such a manner that the edges of each of the openings 16 are formed inside the periphery of the corresponding region of the hard mask 6. In other words, similar to the step shown in FIG. 3A, the openings 16 are formed in such a manner that a width w1 of each of the openings 16 is smaller than a width w2 of the corresponding region of the hard mask 6 (i.e., w1<w2). The reason why each of the openings 16 is formed inside the corresponding region of the hard mask 6 is because the green filter components 2G and the red filter components 2R need to be protected from dry-etching to be performed in the next step.

Figure 4B:
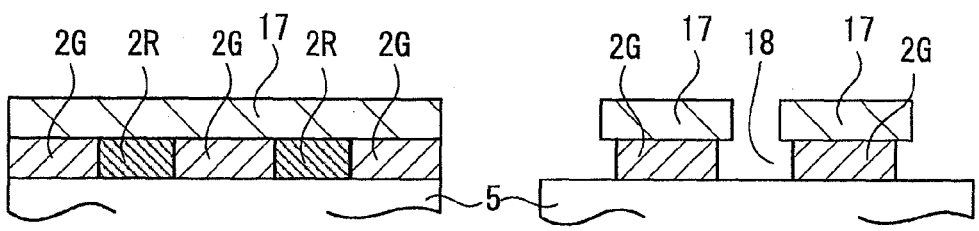

Next, as shown in FIG. 4B, the respective regions of the hard mask 6 exposed from the openings 16 are removed by isotropic dry etching through the resist mask 17. Similar to those described above, the dry etching is performed by the CDE device. The remaining hard mask 6 is completely removed and thereby openings 18 surrounded by the green filter components 2G are formed.

Figure 4C:
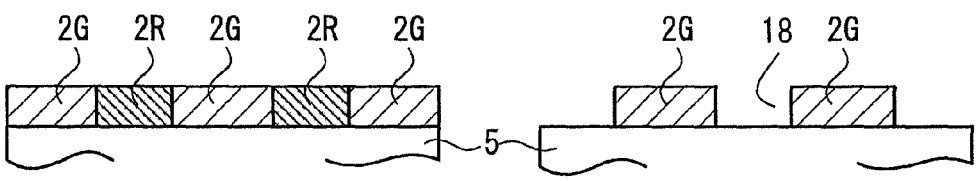

Thereafter, as shown in FIG. 4C, the resist mask 17 no longer required is removed using an organic solvent. The organic solvent may be the organic solvent described above. At this time, if the resist mask 17 is difficult to be removed with the organic agent due to presence of the hardened layer, a gas containing fluorocarbon-based gas and oxygen may be used to remove the hardened layer first, and then the resist mask 17 is removed using the organic solvent.

Figure 4D:
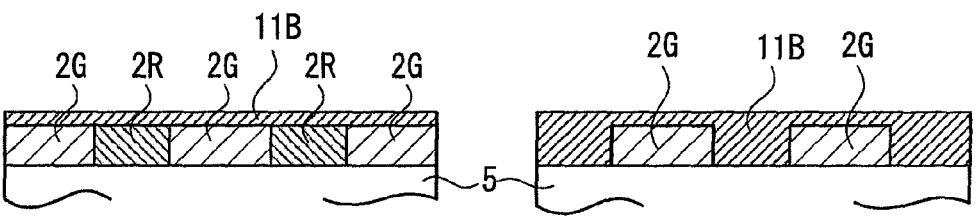

Next, as shown in FIG. 4D, a blue filter component material 11B is coated on the entire surface (including the surface of the green filter components 2G, the surface of the red filter components 2R and the surface of the openings 18). The coating is performed by spin-coating. The blue filter component material 11B is a material whose solid content contains no photosensitive component, and in the present embodiment, the aforesaid heat-curing material is used as the blue filter component material 11B. After the blue filter component material 11B is coated, the substrate is subjected to a heat treatment by being heated on a hot plate at a temperature in the range from 150° C. to 220° C. for 1 to 10 minutes so that the blue filter component material 11B is heat-cured.

Figure 4E:
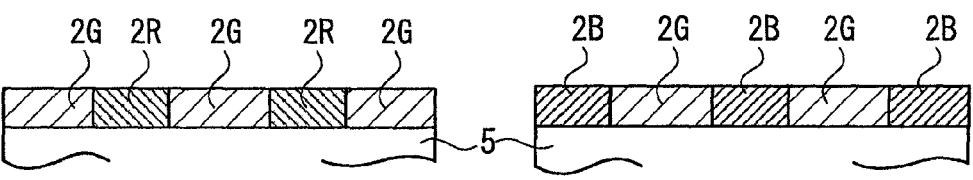

Thereafter, as shown in FIG. 4E, the entire surface of the blue filter component material 11B is etched back or, alternatively, treated by chemical mechanical polishing (CMP) until the green filter components 2G and the red filter components 2R are exposed from the blue filter component material 11B. Thus, the blue filter components 2B are formed.

Figure 7:
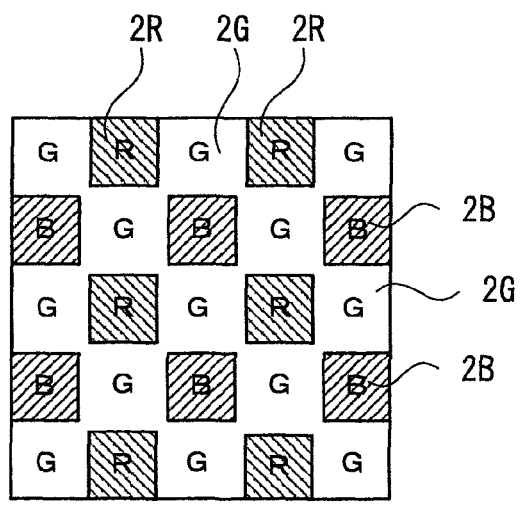
FIG. 7 is a plan view showing a filter component pattern formed in the step of FIG. 4E.

In such a manner, a primary-color Bayer array color filter 1 having the green filter components 2G, the red filter components 2R and the blue filter components 2B is obtained. FIG. 7 is a plan view showing a pattern of the red, green and blue filter components 2R, 2G, 2B formed in the step shown in FIG. 4E. As can be known from FIG. 7, the red filter components 2R and the blue filter components 2B are each formed in a square shape and are each surrounded by the green filter components 2G, and the green filter components 2G are connected to each other.

Although the heat-curing material is used as the red, green and blue filter component materials 11R, 11G, 11B in the present embodiment, the photo-curing material may alternatively be used. In the case where the photo-curing material is used as the red, green and blue filter component materials 11R, 11G, 11B, after the photo-curing material is spin-coated, the coated photo-curing material is irradiated by ultraviolet light or the like so as to be cured. The coated photo-curing material may also be subjected to a heat-treatment in addition to the light irradiation.

In the method for manufacturing the solid-state imaging device, particularly the color filter 1 thereof according to the present embodiment, the green filter components 2G, the red filter components 2R and the blue filter components 2B are self-aligned to the hard mask 6. Thus, dimension accuracy and superposition accuracy can be improved, and therefore color mixture of the solid-state imaging device can be inhibited.

Since pigment-dispersed photoresists of the related art contain pigment-based colorant, they are inferior in resolution characteristic compared to commonly-used photoresists used for semiconductor processing, ion-implantation and the like. In contrast, according to the present embodiment, since a high resolution resist can be used, the hard mask can be accurately patterned. Further, when a resist containing pigment-based colorant is aligned by a stepper, since the colorant absorbs the alignment light, the alignment accuracy will be deteriorated. However, these problems can be solved with the present embodiment.

Specifically, the color filter material of the related art, in which resists containing pigment-based colorant are used, is exposed by a stepper using ultraviolet light such as i-light, and developed so as to form a pattern. It is known that steppers using KrF or ArF excimer laser are superior to other type devices in alignment performance of an exposure apparatus. However, since the excimer laser light is affected by the colorant contained in the color filter material (namely affected by light absorption), exposure sensitivity of the excimer laser light will be remarkably deteriorated, and as a result, an excellent pattern can not be formed. In contrast, according to the present embodiment, since the filter component material has no photosensitivity, only the hard mask needs to be patterned, and therefore an excimer laser stepper having high alignment accuracy can be used. Thus, with the method of forming the color filter according to the present embodiment, processing accuracy of the color filter can be improved.

According to the present embodiment, since the red, green and blue filter component materials 11R, 11G, 11B use the heat-curing material or photo-curing material containing no photosensitive component, the film thickness of the red, green and blue filter components 2R, 2G, 2B can be reduced compared with the case where the photosensitive materials are patterned using the photolithography method of the related art. As a result, sensitivity characteristic of the solid-state imaging device can be improved, and luminance shading can be inhibited.

Since the green filter components 2G have adjacent corners thereof connected to each other so as to be continuously formed, the adhesive area of the green filter components 2G to the base material is large. Further, the red, green and blue filter component materials 2R, 2G, 2B are formed using the heat-curing material or photo-curing material, and therefore they are less susceptible to peeling off compared with the case where a pigment-dispersed photoresist according to the related art is used. Thus, the color filter according to the present embodiment has high adhesive strength to the base material.

Since the hard mask 6 is patterned so as to form a concave-convex shape (see FIG. 2A to FIG. 2F), and therefore adhesion of the green, red and blue filter component materials is increased. Further, the green, red and blue filter component materials can be cured by performing sufficient exposure or/and heat-treatment only, without performing a patterning process by exposure. Thus, adhesion of the green filter components 2G, the red filter components 2R and the blue filter components 2B is increased.

Second Embodiment

Configuration Example of Color Filter

Figure 8:
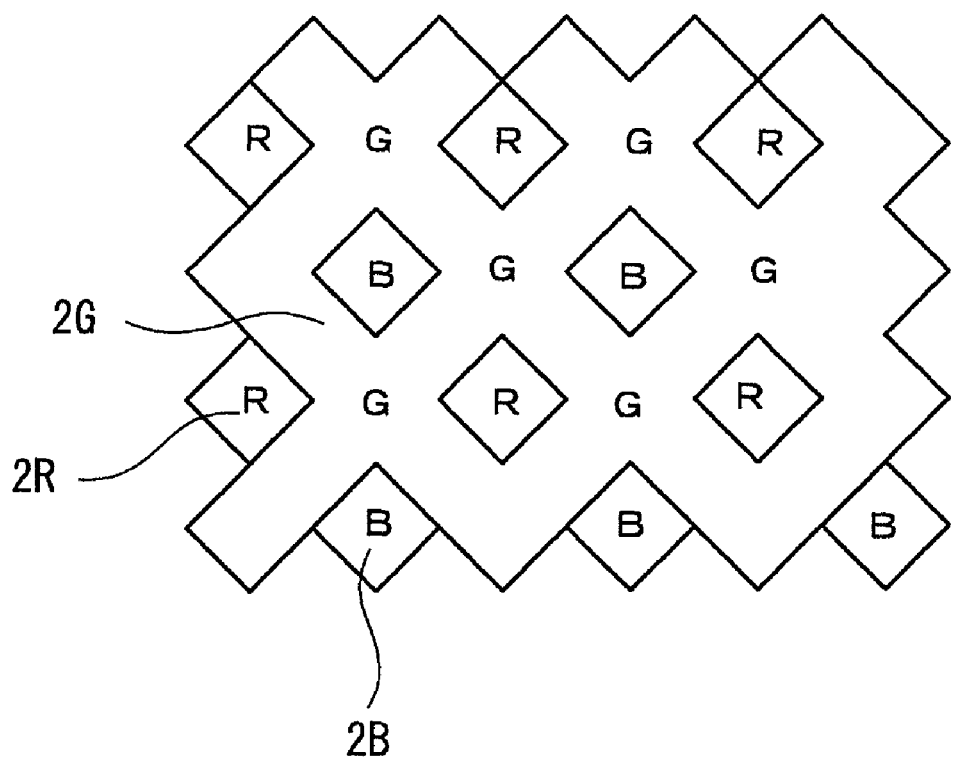
FIG. 8 shows the configuration of a color filter of a solid-state imaging device according to a second embodiment of the present invention.

FIG. 8 shows a color filter applied to a solid-state imaging device according to a second embodiment of the present invention. A color filter 21 according to the present embodiment is formed by obliquely arranging the red, green and blue filter components 2R, 2G, 2B. In the color filter 21 according to the present embodiment, rows of the green filter components 2G are arranged every second row such that they are inclined at 45 degrees to horizontal/vertical directions (to facilitate the description, these rows are referred to as first directional rows). Further, second directional rows of the green filter components 2G perpendicular to the first directional rows are arranged every second row such that the second directional rows are inclined at −45 degrees to the horizontal/vertical directions. Further, rows of the red filter components 2R and the blue filter components 2B are alternately arranged every second rows in the vertical direction such that they are placed in space regions surrounded by the green filter components 2G.

[Method for Manufacturing Color Filter]

The color filter 21 according to the present embodiment can be formed by the forming method of the color filter according to the first embodiment. The color filter 21 and forming method thereof have the same advantages as those described in the first embodiment.

Third Embodiment

Figure 9:
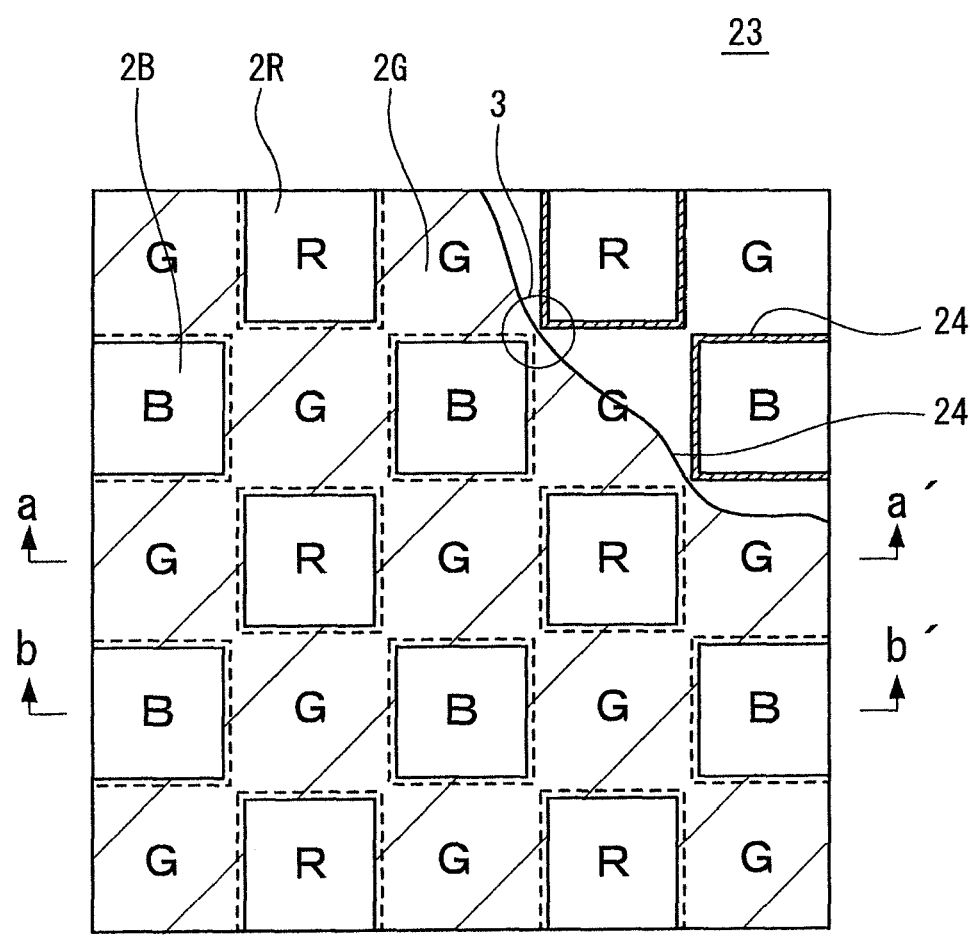
FIG. 9 shows the configuration of a color filter of a solid-state imaging device according to a third embodiment of the present invention.

Configuration Example of Solid-State Imaging Device, Particularly Color Filter Thereof FIG. 9 shows a solid-state imaging device, particularly a color filter thereof according to a third embodiment of the present invention. In the solid-state imaging device according to the present embodiment, in the same manner as previously described, after an imaging region is formed, a color filter 23 shown in FIG. 9 is formed through a planarizing film. Similar to the first embodiment, the color filter 23 includes red filter components 2R, green filter components 2G and blue filter components 2B arranged in a so-called Bayer array.

Similar to the first embodiment, the color filter 23 is patterned such that the red filter components 2R and the blue filter components 2B are each surrounded by the green filter components 2G. The green filer components 2G, the red filter components 2R, and the blue filter components 2B are each formed in a square shape. Each of the green filter components 2G has four corners 3 thereof connected to adjacent corners 3 of other green filter components 2G, so that the green filter components 2G are formed in one continuous piece. Thus, the red filter components 2R and the blue filter components 2B are each independently formed and surrounded by the green filter components 2G.

An inorganic film 24 substantially transparent to visual light range is continuously formed on the top surface and side surface of the green filter components 2G, and on the bottom surface of each of surindividually independent red filter components 2R and blue filter components 2B. As can be known from the manufacturing method to be described later, the inorganic film 24 has a function of a stopper film for planarizing the red filter components 2R and the blue filter components 2B. Examples of the inorganic film 24 include the following films formed by low temperature plasma CVD (Chemical Vapor Deposition) film-forming method: silicon oxide ($SiO_2$) film, silicon nitride (SiN) film, silicon oxycarbonitride (SiOC) film, silicon oxynitride (SiON) film and the like. Film-forming temperature is preferably 150° C. to 220° C., and suitable film thickness is 200 nm or less.

Further, as can be known from the manufacturing method to be described later, the red filter components 2R and blue filter components 2B are self-aligned to the green filters 2G using a hard mask. The green filter components 2G are made of the aforesaid material whose solid content contains photosensitive component or material whose solid content contains no photosensitive component. On the other hand, the red filter components 2R and blue filter components 2B are made of a photosensitive filter material.

In the solid-state imaging device according to the present embodiment, the red filter components 2R and the blue filter components 2B are self-aligned to the green filter components 2G by using a hard mask. Further, the inorganic film 24 functions as a stopper film for planarizing the red filter components 2R and the blue filter components 2B, so that the red filter components 2R and the blue filter components 2B can be precisely planarized to have a film thickness substantially equal to that of the green filter components 2G. Thus, superposition error of the red filter components 2R, the green filter components 2G and the blue filter components 2B will not be caused, and as a result, the red filter components 2R, the green filter components 2G and the blue filter components 2B can be accurately formed without being superposed on each other. Further, since each of the green filter components 2G has four corners 3 thereof connected to adjacent corners 3 of other green filter components 2G so that the green filter components 2G are formed in one continuous piece, the green filter components 2G never peel off. Thus, processing accuracy of the color filter according to the present embodiment can be improved.

Since the inorganic film 24 is formed at both the boundary between the red filter components 2R and the green filter components 2G and the boundary between the blue filter components 2B and the green filter components 2G, interdiffusion of colorant can be prevented; and also, since the filter components 2R, 2G, 2B are not superposed on each other, color mixture is inhibited. Further, in the case where the material contains no photosensitive component is used as the green filter component material, the film thickness of the color filter can be reduced and thereby sensitivity characteristic can be improved.

The inorganic film 24 is formed on the green filter components 2G. In the case where the green filter components 2G is made of a filter material containing a dye-based colorant with excellent spectral characteristics, the green filter can achieve improved light resistance owing to the inorganic film 24 formed thereon. The red filter components 2R and the blue filter components 2B can be made of a filter material containing a pigment-based colorant with better light resistance compared with the filter material containing the dye-based colorant.

[Method for Manufacturing Solid-State Imaging Device, Particularly Color Filter Thereof]

Next, a method for manufacturing the solid-state imaging device, particularly the color filter 23 thereof will be described below with reference to FIG. 10A to FIG. 15. The cross sections shown in FIG. 10A to FIG. 12C correspond to those taken along line a-a' (green-red row) and along line b-b' (green-blue row) of FIG. 9.

First, as shown in FIG. 10A to FIG. 10E, filter components of a first color are formed. In the present embodiment, the green filter components 2G are firstly formed as the filter components of the first color. The steps of forming the filter components of the first color are identical to those of the first embodiment.

Figure 10A:
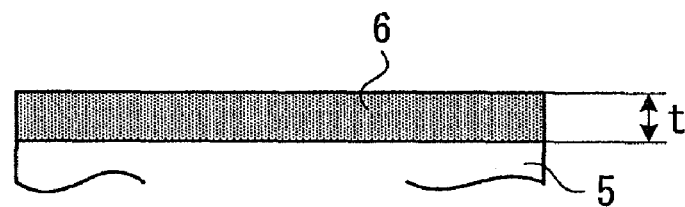
FIG. 10A to FIG. 10E show steps (part 1) for forming the color filter according to the third embodiment.

Specifically, as shown in FIG. 10A, a hard mask 6 having a thickness t corresponding to the thickness of the color filter is formed on the entire surface of a substrate 5. The planarizing film is formed on the outermost surface of the substrate 5 to form the color filter. Examples of the hard mask 6 include inorganic films such as a polysilicon film, an amorphous silicon film, a silicon oxide film, a silicon nitride film, and a silicon oxide nitride film and the like.

Figure 10B:
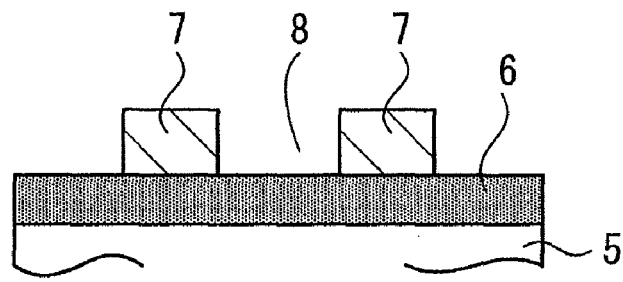

Thereafter, as shown in FIG. 10B, a resist mask 7 is formed on the hard mask 6, the resist mask 7 having openings 8 formed in regions where the green filter components are to be formed. The resist mask 7 is formed using the photolithography method.

Figure 10C:
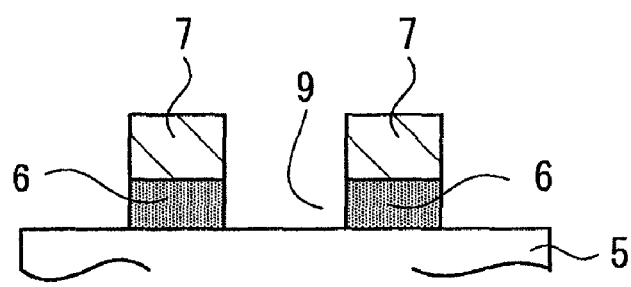

Thereafter, as shown in FIG. 10C, the hard mask 6 exposed from the opening portions 8 of the resist mask 7 is selectively removed by an anisotropic dry etching method such as reactive ion etching (RIE). By performing the selective etching, openings 9 are formed in regions where the green filter components are to be formed.

Figure 10D:
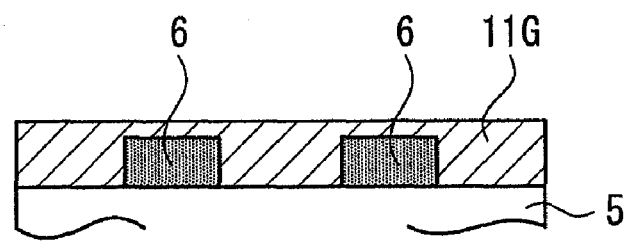

Thereafter, the resist mask 7 no longer required is removed by a method such as an ashing treatment, a wet cleaning and the like, and thereafter, as shown in FIG. 10D, the green filter component material 11G is coated on the entire surface of the hard mask 6. The coating is performed by spin-coating. In the case where a material whose solid content contains no photosensitive component is used as the green filter component material 11G, the aforesaid heat-curing material is used in the present embodiment. After the green filter component material 11G is coated, the substrate is subjected to a heat treatment by being heated on a hot plate at a temperature in the range from 150° C. to 220° C. for 1 to 10 minutes so that the green filter component material 11G is heat-cured. Further, in the case where a material whose solid content contains photosensitive component is used as the green filter component material 11G, the green filter component material 11G is photo-cured by ultraviolet irradiation.

Figure 10E:
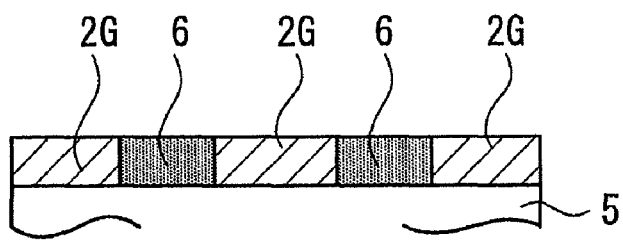
Figure 13:
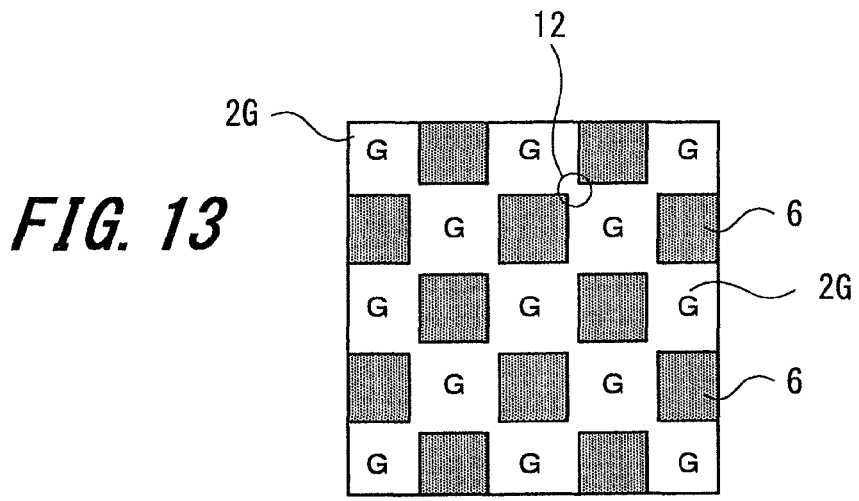
FIG. 13 is a plan view showing a filter component pattern formed in the step of FIG. 10D.

Thereafter, as shown in FIG. 10E, the entire surface of the green filter component material 11G is etched back or, alternatively, treated by chemical mechanical polishing (CMP) until the hard mask 6 is exposed from the green filter component material 11G. In such a manner, the green filter components 2G are formed. FIG. 13 is a plan view showing a pattern of the green filter components 2G formed in the step of FIG. 10E. Although the green filter components 2G are each formed in a square shape and are arranged checkerwise as a whole, each of the green filter components 2G has four corners 12 thereof connected to adjacent corners 12 of other green filter components 2G, so that the green filter components 2G are formed in one continuous piece. The remaining hard mask 6 is surrounded by the green filter components 2G.

Thereafter, as shown in FIG. 11A to 11E, filter components of a second color are formed. Although the red filter components are regarded as the filter components of the second color in FIG. 11A to FIG. 11E, the blue filter components may be regarded as the filter components of the second color alternatively.

Specifically, as shown in FIG. 3A, in the state shown in FIG. 10F and FIG. 13, a resist mask 14 is formed on the surface including the green filter components 2G and the hard mask 6, the resist mask 14 having openings 13 formed in regions corresponding to the hard mask 6. Further, the hard mask 6 is removed by isotropic dry etching through the resist mask 14. The openings 13 are formed in such a manner that a width w1 of each of the openings 13 is smaller than a width w2 of the corresponding region of the hard mask 6 (i.e., w1<w2). The reason why each of the openings 13 is formed inside the periphery of the corresponding region of the hard mask 6 is because the green filter components 2G need to be protected from dry etching.

Figure 11A:
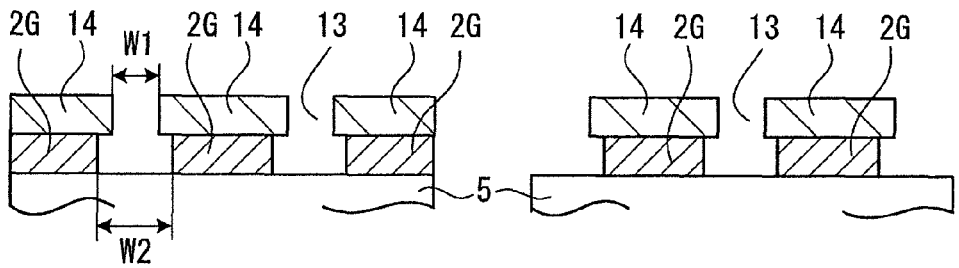
FIG. 11A to FIG. 11E show steps (part 2) for forming the color filter according to the third embodiment.
Figure 11B:
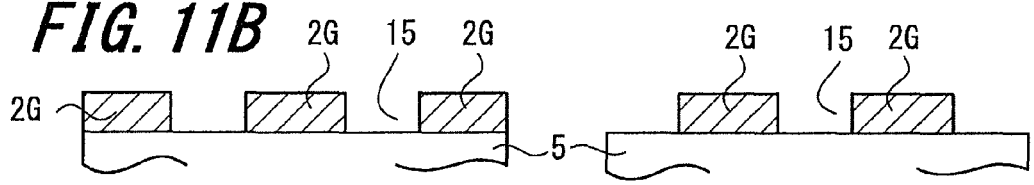

Thereafter, as shown in FIG. 11B, the resist mask 14 no longer required is removed using an organic solvent. The organic solvent described in the first embodiment is used for removing the resist mask 14. The steps shown in FIG. 11A to FIG. 11B are identical to those of the first embodiment.

Figure 11C:
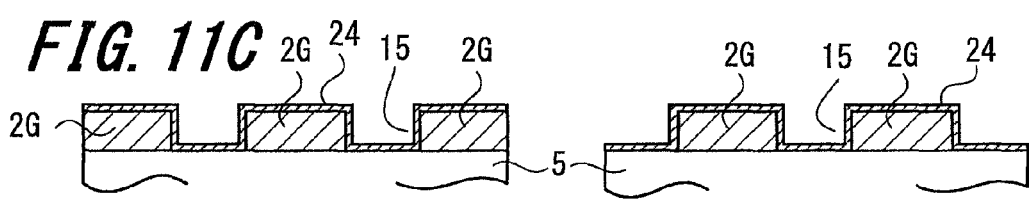
Figure 14:
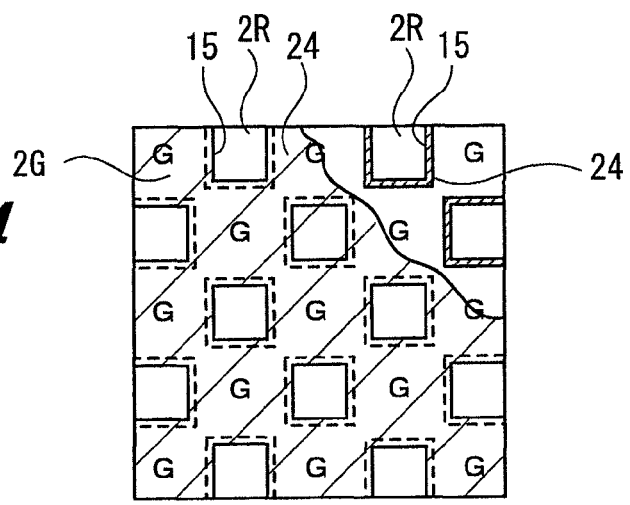
FIG. 14 is a plan view showing a filter component pattern formed in the step of FIG. 11C.

Next, as shown in FIG. 11C, the inorganic film 24 is formed on the entire surface (including the top surface and side surface of the green filter components 2G, and the bottom surface of the openings 15 formed by removing the hard mask 6). The inorganic film 24 has a film thickness of 200 nm or less, which is smaller than the film thickness of the filter components, and film-forming temperature is preferably 150° C. to 250° C. The inorganic film 24 has a function of a stopper film for planarizing the red filter components 2R and the blue filter components 2B in steps which are to be described later. Examples of the inorganic film 24 include the following films formed by low temperature plasma film-forming method: silicon oxide ($SiO_2$) film, silicon nitride (SiN) film, silicon oxynitride (SiON) film and the like. FIG. 14 is a plan view showing a pattern of the inorganic film 24 and green filter components 2G formed in the step of FIG. 11C.

Figure 11D:
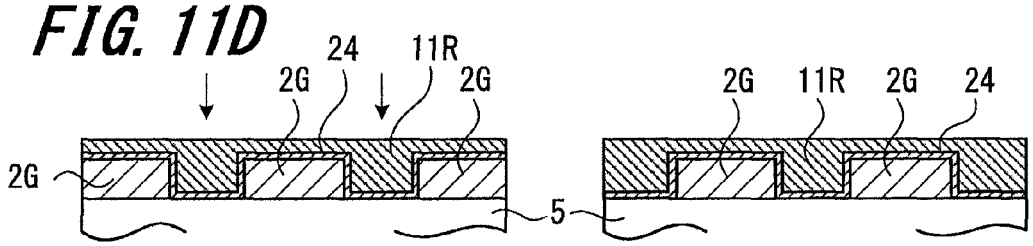

Next, as shown in FIG. 11D, a red filter component material 11R is coated on the entire surface (including the surface of the green filter components 2G and the surface of the openings 15) on which the inorganic film 24 has been covered, so that the openings 15 are filled with the coated red filter component material 11R. The coating is performed, for example, by spin-coating. The red filter component material 11R is a photosensitive filter material. The photosensitive filter material may either be a negative photosensitive material or be a positive photosensitive material. The photosensitive filter material used in the present embodiment is a negative photosensitive material, which is irradiated by the light so that the irradiated portion is cured.

Figure 11E:
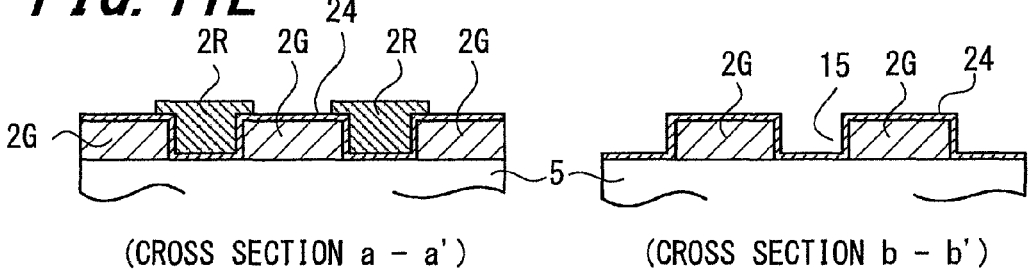

Thereafter, as shown in FIG. 11E, the red filter component material 11R is exposed through an optical mask which only allows the light to pass through regions where the red filter components are to be formed, and the exposed material is developed to form the red filter components 2R. At this time, since superposition error of the optical mask needs to be taken into consideration, the area of each of the exposed regions is slightly larger than that of each of the openings 15. Thus, the red filter components 2R partially overlap with the green filter components 2G through the inorganic film 24.

Figure 12A:
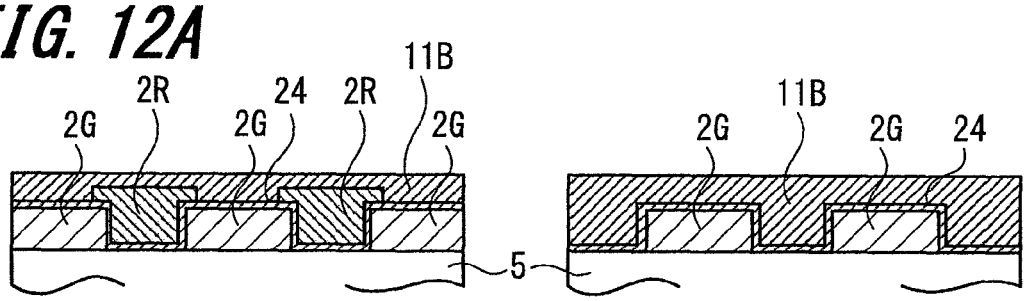
FIG. 12A to FIG. 12C show steps (part 3) for forming the color filter according to the third embodiment.
Figure 12B:
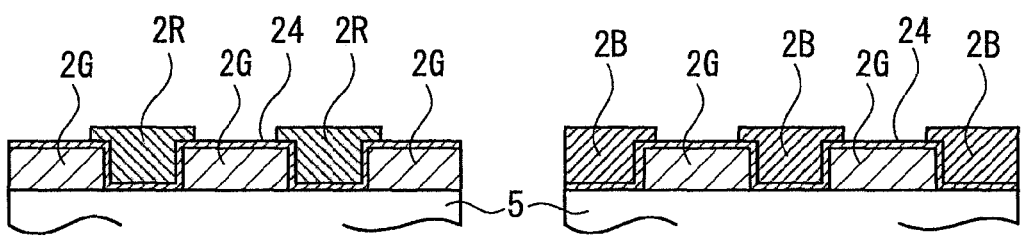
Figure 12C:
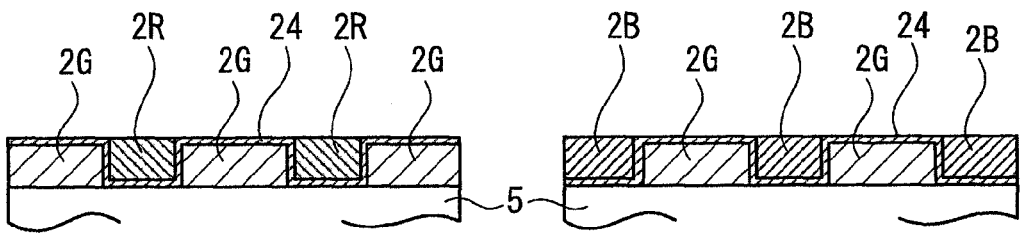

Thereafter, as shown in FIG. 12A to 12C, the blue filter components as filter components of a third color are formed. Although the blue filter components 2B are regarded as the filter components of the third color in FIG. 12A to FIG. 12C, the red filter components 2R may be regarded as the filter components of the third color alternatively.

Specifically, as shown in FIG. 12A, a blue filter component material 11B is coated on the entire surface (including the surface of the green filter components 2G, the surface of the red filter components 2R and the surface of the remaining openings 15) on which the inorganic film 24 has been covered, so that the remaining openings 15 are filled with the coated blue filter component material 11B. The coating is performed, for example, by spin-coating. The blue filter component material 11B is a photosensitive filter material. The photosensitive filter material may either be a negative photosensitive material or be a positive photosensitive material. The photosensitive filter material used in the present embodiment is a negative photosensitive material, which is irradiated by the light so that the irradiated portion is cured.

Thereafter, as shown in FIG. 12B, the blue filter component material 11B is exposed through an optical mask which only allows the light to pass through regions where the blue filter components are to be formed, and the exposed material is developed to form the blue filter components 2B. At this time, since superposition error of the optical mask needs to be taken into consideration, the area of each of the exposed regions is slightly larger than that of each of the openings 15. Thus, the blue filter components 2B partially overlap with the green filter components 2G through the inorganic film 24.

Next, as shown in FIG. 12C, the red filter components 2R and the blue filter components 2B are planarized by etching back or chemical mechanical polishing (CMP) method until the surface of the inorganic film 24 is exposed.

Figure 15:
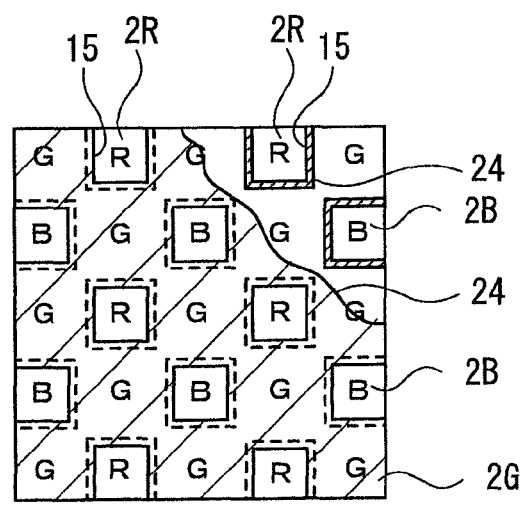
FIG. 15 is a plan view showing a filter component pattern formed in the step of FIG. 12C.

In such a manner, a primary-color Bayer array color filter 23 having the inorganic film 24, the green filter components 2G, the red filter components 2R and the blue filter components 2B is obtained. FIG. 15 is a plan view showing a pattern of the red, green and blue filter components 2R, 2G, 2B formed in the step shown in FIG. 12C. As can be known from FIG. 15, the red filter components 2R and the blue filter components 2B are each formed in a square shape and are each surrounded by the green filter components 2G, and the green filter components 2G are connected to each other.

In the method for manufacturing the solid-state imaging device, particularly the color filter 23 thereof according to the present embodiment, the green filter components 2G, the red filter components 2R and the blue filter components 2B are self-aligned to the hard mask 6. Further, the inorganic film 24 is formed before the red filter components 2R and blue filter components 2B are formed, and, after the red filter components 2R and blue filter components 2B are formed, the red filter components 2R and blue filter components 2B are planarized with the inorganic film 24 as a stopper film. Thus, dimension accuracy and superposition accuracy can be improved, and therefore color mixture of the solid-state imaging device can be inhibited.

Since each of the green filter components 2G has four corners thereof connected to adjacent corners of other green filter components 2G so that the green filter components 2G are formed in one continuous piece, the adhesive area of the green filter components 2G to the base material is large. Further, the green filter components 2G are formed using the heat-curing material or photo-curing material, and therefore they are less susceptible to peeling off compared with the case where a pigment-dispersed photoresist according to the related art is used. Thus, the color filter according to the present embodiment has high adhesive strength to the base material.

Similar to those described in the first embodiment, since the hard mask 6 is patterned so as to form a concave-convex shape (see FIG. 10A to FIG. 10E), and therefore adhesion of the green filter components 2G is increased. The red filter components 2R and the blue filter components 2B are filled into the openings after the green filter components 2G has been formed. Thus, the bottom surface and side surface of the red filter components 2R and the blue filter components 2B become tight contact surface, and therefore contact area is increased, and adhesion is improved.

Although the inorganic film 24 serving as a stopper is applied to the Bayer array color filter 23 in the present embodiment, it can also be applied to a color filter (though not shown in the drawings) wherein the red, green and blue filter components are arranged in the same manner as previously described in the second embodiment.

Fourth Embodiment

Figure 16:
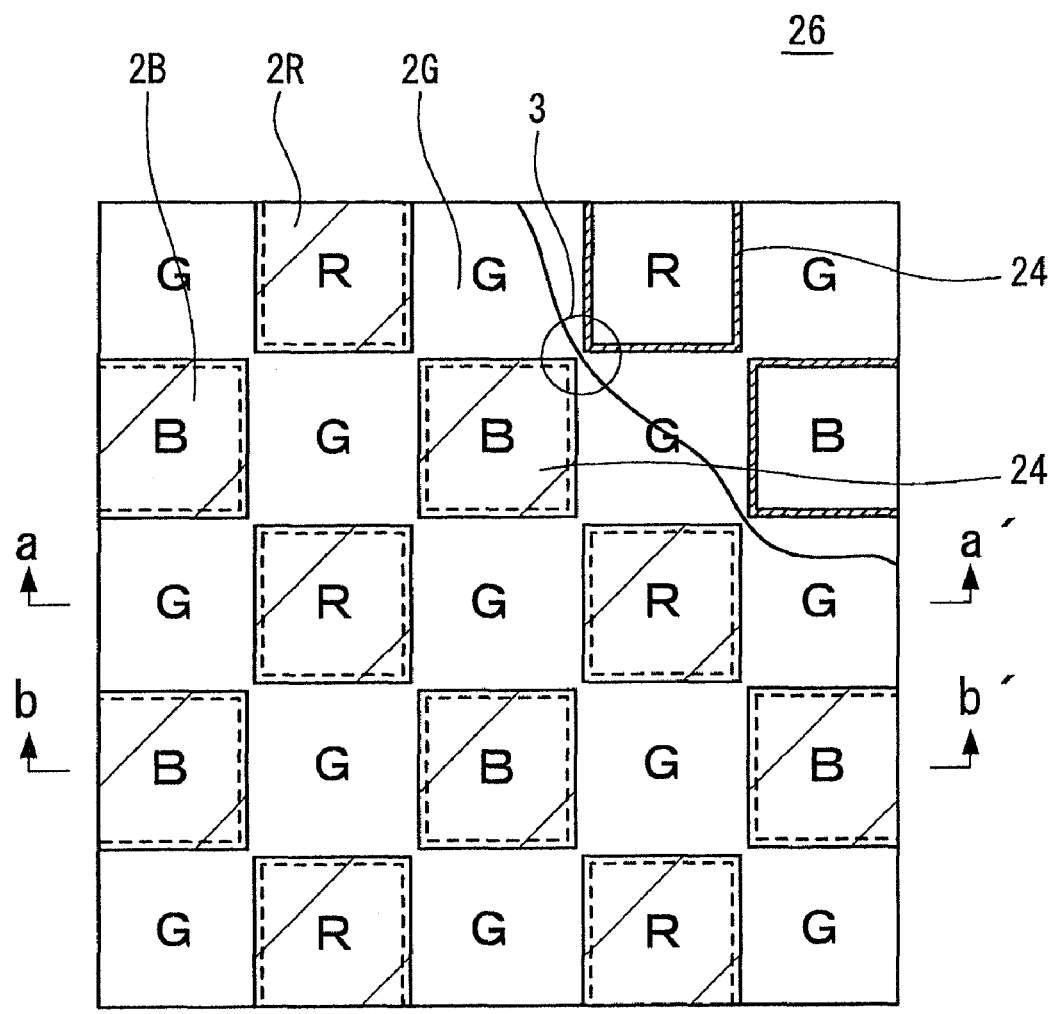
FIG. 16 shows the configuration of a color filter of a solid-state imaging device according to a fourth embodiment of the present invention.

Configuration Example of Solid-State Imaging Device, particularly Color Filter Thereof FIG. 16 shows a solid-state imaging device, particularly a color filter thereof according to a fourth embodiment of the present invention. In the solid-state imaging device according to the present embodiment, in the same manner as previously described, after an imaging region is formed, a color filter 26 shown in FIG. 16 is formed through a planarizing film. Similar to the first embodiment, the color filter 26 includes red filter components 2R, green filter components 2G and blue filter components 2B arranged in a so-called Bayer array.

Similar to the first embodiment, the color filter 26 is patterned such that the red filter components 2R and the blue filter components 2B are each surrounded by the green filter components 2G. The green filer components 2G, the red filter components 2R, and the blue filter components 2B are each formed in a square shape. Each of the green filter components 2G has four corners 3 thereof connected to adjacent corners 3 of other green filter components 2G, so that the green filter components 2G are formed in one continuous piece. Thus, the red filter components 2R and the blue filter components 2B are each independently formed and surrounded by the green filter components 2G.

An inorganic film 24 substantially transparent to visual light range is continuously formed on the top surface and side surface of each of the red filter components 2R and blue filter components 2B, and on the bottom surface of the green filter components 2G. As can be known from the manufacturing method to be described later, the inorganic film 24 has a function of a stopper film for planarizing the green filter components 2G. As previously described in the third embodiment, examples of the inorganic film 24 include the following films formed by low temperature plasma CVD film-forming method: silicon oxide ($SiO_2$) film, silicon nitride (SiN) film, silicon oxycarbonitride (SiOC) film, silicon oxynitride (SiON) film and the like. Film-forming temperature is preferably 150° C. to 220° C., and suitable film thickness is 200 nm or less.

Further, as can be known from the manufacturing method to be described later, the green filter components 2G are self-aligned to the red filter components 2R and blue filter components 2B using a hard mask. The green filter components 2G are made of the aforesaid material whose solid content contains photosensitive component or material whose solid content contains no photosensitive component. On the other hand, the red filter components 2R and blue filter components 2B are made of a photosensitive filter material.

In the solid-state imaging device according to the present embodiment, the green filter components 2G are self-aligned to the red filter components 2R and blue filter components 2B by using the hard mask. Further, the inorganic film 24 functions as a stopper film for planarizing the green filter components 2G, so that the green filter components 2G can be precisely planarized to have a film thickness substantially equal to that of the red filter components 2R and blue filter components 2B. Thus, superposition error of the red filter components 2R, the green filter components 2G and the blue filter components 2B will not be caused, and as a result, the red filter components 2R, the green filter components 2G and the blue filter components 2B can be accurately formed without being superposed on each other. Further, since each of the green filter components 2G has four corners thereof connected to adjacent corners of other green filter components 2G so that the green filter components 2G are formed in one continuous piece, the green filter components 2G never peel off. Thus, processing accuracy of the color filter according to the present embodiment can be improved.

Since the inorganic film 24 is formed at both the boundary between the red filter components 2R and the green filter components 2G and the boundary between the blue filter components 2B and the green filter components 2G, interdiffusion of colorant (pigment or dye) can be prevented; Also, since the filter components 2R, 2G, 2B are not superposed on each other, color mixture is inhibited. Further, since the green filter component material contains no photosensitive component, the film thickness of the color filter can be reduced and thereby sensitivity characteristic can be improved.

[Method for Manufacturing Solid-State Imaging Device, Particularly Color Filter Thereof]

Next, a method for manufacturing the solid-state imaging device, particularly the color filter 26 thereof according to the present embodiment will be described below with reference to FIG. 17A to FIG. 18F. The cross sections shown in FIG. 17A to FIG. 18F correspond to those taken along line a-a' (green-red row) and along line b-b' (green-blue row) of FIG. 16.

Figure 17A:
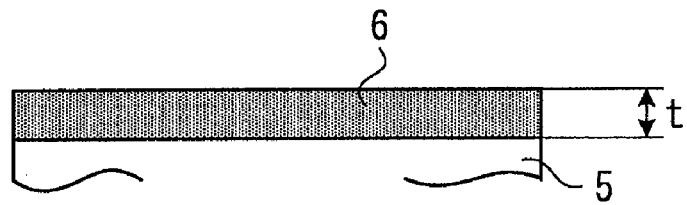
FIG. 17A to FIG. 17D show steps (part 1) for forming the color filter according to the fourth embodiment.

First, as shown in FIG. 17A, a hard mask 6 having a thickness t corresponding to the thickness of the color filter is formed on the entire surface of a substrate 5. The planarizing film is formed on the outermost surface of the substrate 5 to form the color filter. As previously described, examples of the hard mask 6 include inorganic films such as a polysilicon film, an amorphous silicon film, a silicon oxide film, a silicon nitride film, a silicon oxide nitride film and the like.

Figure 17B:
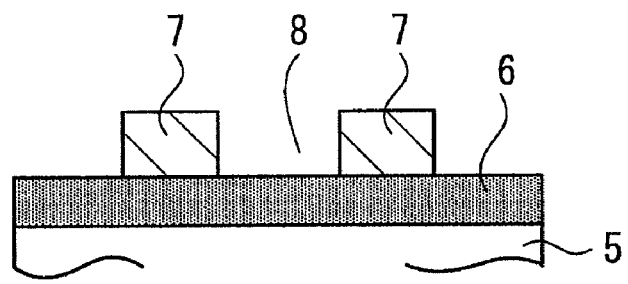

Thereafter, as shown in FIG. 17B, a resist mask 7 is formed on the hard mask 6, the resist mask 7 having openings 8 formed in regions where the green filter components are to be formed. The resist mask 7 is formed using the photolithography method.

Figure 17C:
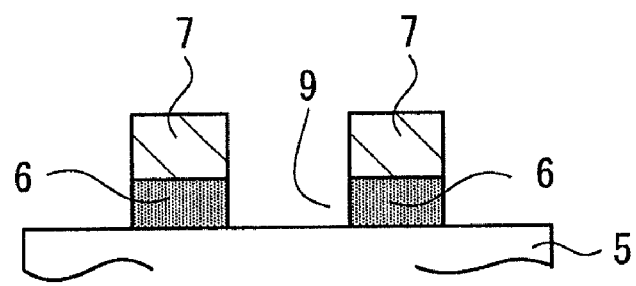
Figure 17D:
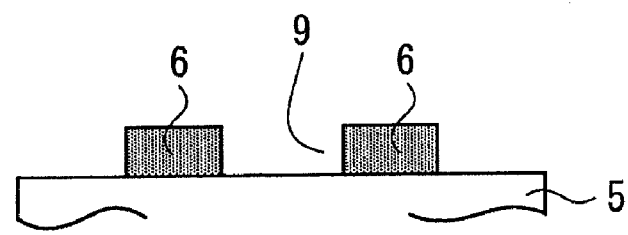

Thereafter, as shown in FIG. 17C, the hard mask 6 exposed from the opening portions 8 of the resist mask 7 is selectively removed by anisotropic dry etching such as reactive ion etching (RIE). By performing the selective etching, openings 9 are formed in regions where the green filter components are to be formed.

Thereafter, as shown in FIG. 2D, the resist mask 7 no longer required is removed by a method such as an ashing treatment, a wet cleaning and the like, and thereby the hard mask 6 having openings 9 formed in regions where the green filter components are to be formed.

Figure 18A:
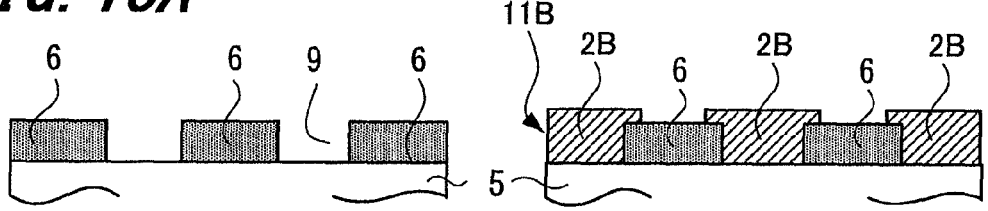
FIG. 18A to FIG. 18F show steps (part 2) for forming the color filter according to the fourth embodiment.
Figure 18B:
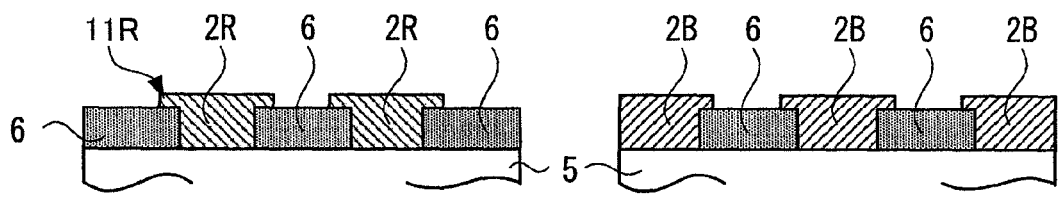

Next, as shown in FIG. 18A, a filter component material of the third color (for example, the blue filter component material 11B) is coated on the entire surface of the hard mask 6, so that the openings 9 are filled with the coated filter component material. The coating is performed by spin-coating. The blue filter component material 11B is a photosensitive filter material. The photosensitive filter material may either be a negative photosensitive material or be a positive photosensitive material. The photosensitive filter material used in the present embodiment is a negative photosensitive material, which is irradiated by the light so that the irradiated portion is cured.

Further, the blue filter component material 11B is exposed through an optical mask which only allows the light to pass through regions where the blue filter components are to be formed, and the exposed material is developed to form the blue filter components 2B. At this time, since superposition error of the optical mask needs to be taken into consideration, the area of each of the exposed regions is slightly larger than that of each of the openings 9. Thus, the blue filter components 2B partially overlap with the hard mask 6.

Next, as shown in FIG. 18A, a filter component material of the second color (for example, the red filter component material 11R) is coated on the entire surface (including the surface of the hard mask 6 and the surface of the blue filter components 2B), so that the remaining openings 9 are filled with the coated filter component material. The coating is performed by spin-coating. The red filter component material 11R is a photosensitive filter material. The photosensitive filter material may either be a negative photosensitive material or be a positive photosensitive material. The photosensitive filter material used in the present embodiment is a negative photosensitive material, which is irradiated by the light so that the irradiated portion is cured.

Further, the red filter component material 11R is exposed through an optical mask which only allows the light to pass through regions where the red filter components 2R are to be formed, and the exposed material is developed to form the red filter components 2R. At this time, since superposition error of the optical mask needs to be taken into consideration, the area of each of the exposed regions is slightly larger than that of each of the openings 9. Thus, the red filter components 2R partially overlap with the hard mask 6.

Figure 18C:
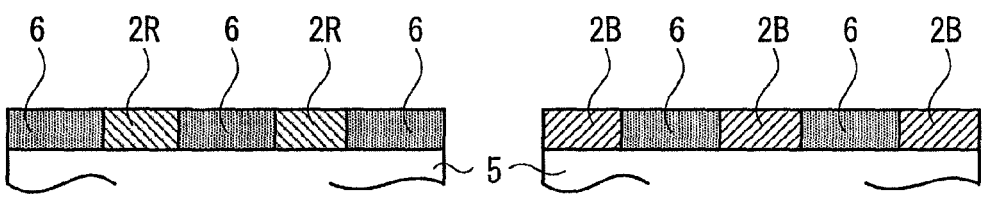

Thereafter, as shown in FIG. 18C, the surface of the blue filter components 2B and the surface of the red filter components 2R are etched back or, alternatively, treated by chemical mechanical polishing (CMP) until the surface of the hard mask 6 is entirely exposed from the blue filter components 2B and red filter components 2R. In such a manner, the blue filter components 2B and red filter components 2R are formed.

Figure 18D:
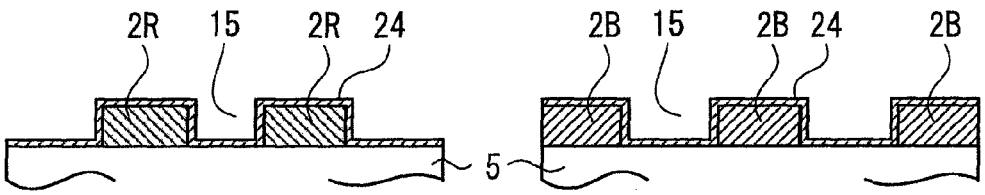

Thereafter, as shown in FIG. 18D, the hard mask 6 is removed. Although not shown in the drawings, the hard mask 6 is removed by isotropic dry etching through the resist mask in the same manner as previously described. Further, the inorganic film 24 is formed on the entire surface (including the top surface and side surface of the blue filter components 2B and red filter components 2R, and the bottom surface of the openings 15 formed by removing the hard mask 6). The inorganic film 24 has a film thickness of 200 nm or less, which is smaller than the film thickness of the filter components. The inorganic film 24 serves as a stopper film for planarizing the green filter components in steps which are to be described later. As previously described, examples of the inorganic film 24 include the following films formed by low temperature plasma film-forming method: silicon oxide ($SiO_2$) film, silicon nitride (SiN) film, silicon oxynitride (SiON) film and the like.

Figure 18E:
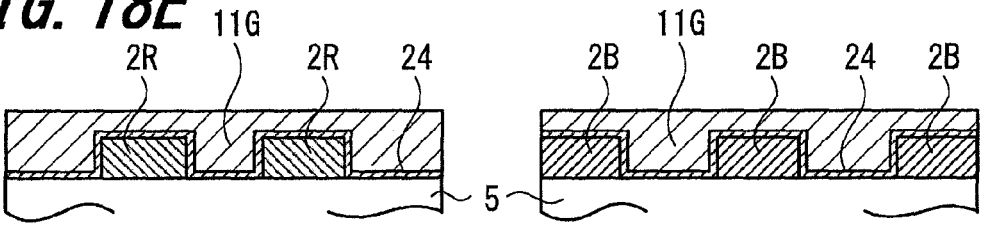

Thereafter, as shown in FIG. 18E, a green filter component material 11G is coated on the entire surface, so that the openings 15 are filled with the coated green filter component material 11G. The coating is performed by spin-coating. The green filter component material 11G is made of the aforesaid material whose solid content contains no photosensitive component.

Figure 18F:
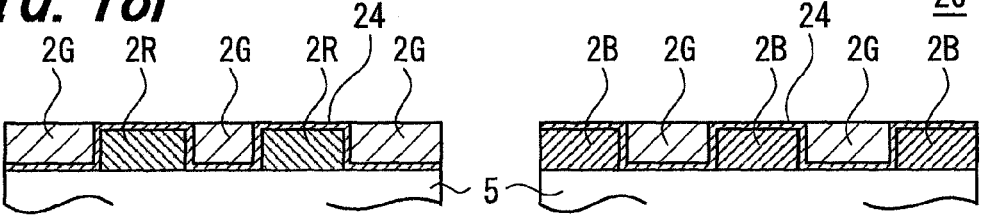

Next, as shown in FIG. 18F, the green filter component material 11G is planarized by etching back or chemical mechanical polishing (CMP) method until the surface of the inorganic film 24 is exposed.

In such a manner, a primary-color Bayer array color filter 26 having the inorganic film 24, the green filter components 2G, the red filter components 2R and the blue filter components 2B is obtained. As can be known from FIG. 17A to FIG. 17D, the red filter components 2R and the blue filter components 2B are each formed in a square shape and are each surrounded by the green filter components 2G, and the green filter components 2G are connected to each other.

In the method for manufacturing the solid-state imaging device, particularly the color filter 26 thereof according to the present embodiment, the green filter components 2G, the red filter components 2R and the blue filter components 2B are self-aligned to the hard mask 6. Further, the inorganic film 24 is formed after the blue filter components 2B and red filter components 2R are formed, and, after the green filter component material 11G is formed, the green filter component material 11G is planarized with the inorganic film 24 as a stopper film. Thus, dimension accuracy and superposition accuracy can be improved, and therefore color mixture of the solid-state imaging device can be inhibited.

Further, as previously described, since each of the green filter components 2G has four corners thereof connected to adjacent corners of other green filter components 2G so that the green filter components 2G are formed in one continuous piece, the adhesive area of the green filter components 2G to the base material is large. Further, the green filter components 2G are formed using the heat-curing material or photo-curing material, and therefore they are less susceptible to peeling off compared with the case where a pigment-dispersed photoresist according to the related art is used. Thus, the color filter according to the present embodiment has high adhesive strength to the base material.

Since the bottom surface and side surface of the red filter components 2R and the blue filter components 2B become tight contact surface with the openings 9 of the hard mask 6, and therefore contact area is increased, and adhesion is improved. The green filter components 2G is filled into the openings 15 between the red filter components 2R and the blue filter components 2B through the inorganic film 24. Thus, the bottom surface and side surface of the green filter components 2G become tight contact surface, and therefore contact area is increased. In addition, the green filter components 2G can be cured by performing sufficient exposure only, without performing a patterning process by exposure, and therefore adhesion is improved.

Although the inorganic film 24 serving as a stopper is applied to the Bayer array color filter 26 in the present embodiment, it can also be applied to a color filter (though not shown in the drawings) wherein the red, green and blue filter components are arranged in the same manner as described in the second embodiment.

Fifth Embodiment

Figure 19:
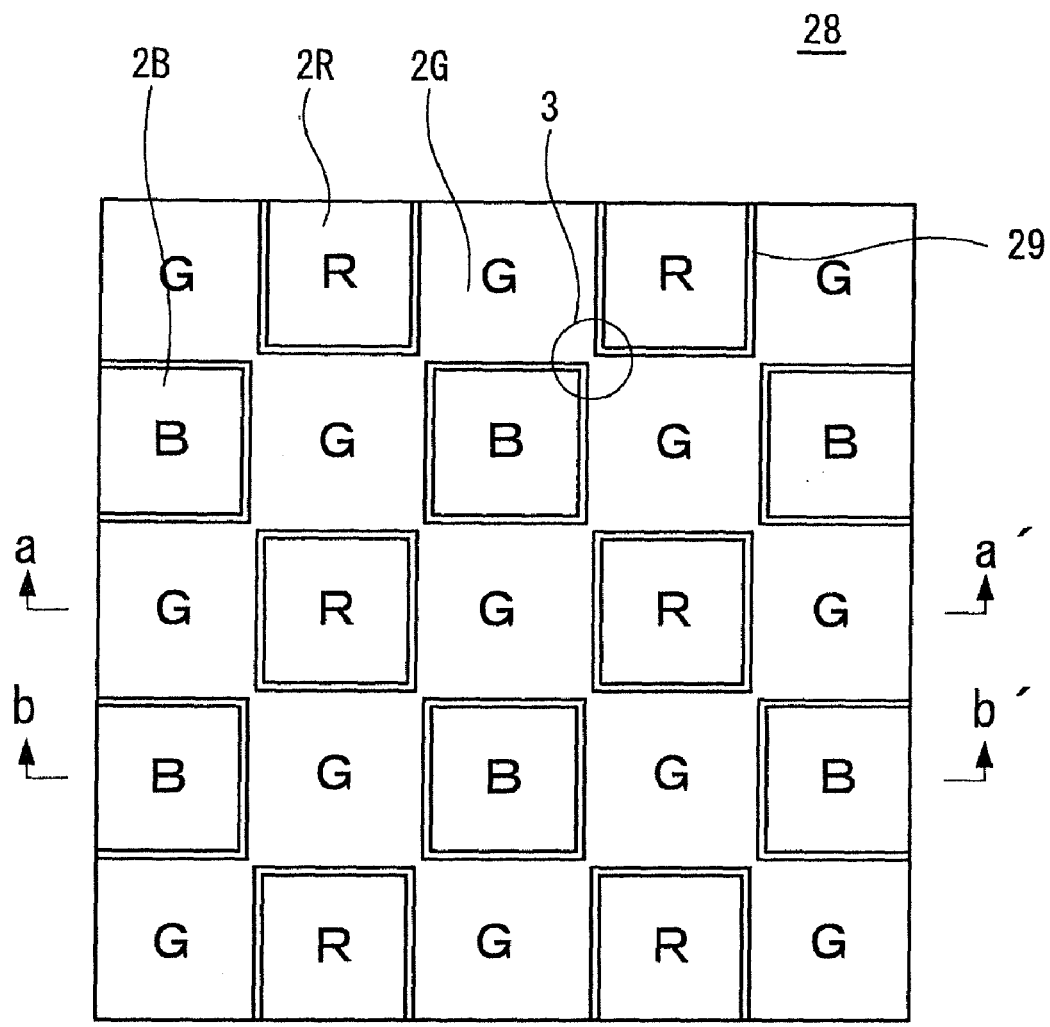
FIG. 19 shows the configuration of a color filter of a solid-state imaging device according to a fifth embodiment of the present invention.

Configuration Example of Solid-State Imaging Device, Particularly Color Filter Thereof FIG. 19 shows a solid-state imaging device, particularly a color filter thereof according to a fifth embodiment of the present invention. In the solid-state imaging device according to the present embodiment, in the same manner as previously described, after an imaging region is formed, a color filter 28 shown in FIG. 19 is formed through a planarizing film. Similar to the first embodiment, the color filter 28 includes red filter components 2R, green filter components 2G and blue filter components 2B arranged in a so-called Bayer array.

Similar to the first embodiment, the color filter 28 is patterned such that the red filter components 2R and the blue filter components 2B are each surrounded by the green filter components 2G. The green filer components 2G, the red filter components 2R, and the blue filter components 2B are each formed in a square shape. Each of the green filter components 2G has four corners 3 thereof connected to adjacent corners 3 of other green filter components 2G, so that the green filter components 2G are formed in one continuous piece. Thus, the red filter components 2R and the blue filter components 2B are each independently formed and surrounded by the green filter components 2G.

Further, in the present embodiment, light-shielding films 29 are formed at both the boundary between the green filter components 2G and red filter components 2R and the boundary between the green filter components 2G and blue filter components 2B. The light shielding films 29 are provided to prevent the light condensed by the on-chip microlenses and incident respectively on the red, green and blue filter components 2R, 2G, 2B from being incident on adjacent filter components. A metal film having excellent reflecting property and light-shading property such as W, Al, Ru, Mo, Ir, Rh, Cr, Co and the like is used as the light-shielding film 29. The film-forming temperature of the metal film is controlled by controlling the temperature of a substrate stage so that the temperature of the substrate is maintained at 100° C. or lower. Further, a metal film of tungsten (W) is preferred in the case where workability needs to be preferentially taken into consideration, and a metal film of aluminum (AL) is preferred in the case where light reflectivity needs to be preferentially taken into consideration. The suitable film thickness of the light-shielding film 29 is 100 nm or less. In the case where the light-shielding film 29 is formed of the metal film, the red, green and blue filter components 2R, 2G, 2B are each surrounded by the metal film and therefore function as a reflective waveguide.

Further, as can be known from the manufacturing method to be described later, the red filter components 2R and blue filter components 2B are self-aligned to the green filters 2G using a hard mask. As previously described in the first embodiment, the filter components 2R, 2G, and 2B are each made of a material whose solid content contains photosensitive component or a material whose solid content contains no photosensitive component.

In the solid-state imaging device according to the present embodiment, the red filter components 2R and the blue filter components 2B are self-aligned to the green filter components 2G by using a hard mask. Thus, superposition error of the red filter components 2R, the green filter components 2G and the blue filter components 2B will not be caused, and as a result, the red filter components 2R, the green filter components 2G and the blue filter components 2B can be accurately formed without being superposed on each other. Further, since each of the green filter components 2G has four corners thereof connected to adjacent corners of other green filter components 2G so that the green filter components 2G are formed in one continuous piece, the green filter components 2G never peel off. Thus, processing accuracy of the color filter according to the present embodiment can be improved.

Since the light-shielding films 29 are formed at both the boundary between the red filter components 2R and the green filter components 2G and the boundary between the blue filter components 2B and the green filter components 2G, due to the reflecting property and light-shading property of the light-shielding films 29 (such as the metal films), the light incident respectively on the red, green and blue filter components 2R, 2G, 2B can be prevented from being incident on adjacent filter components. In other words, color mixture between the adjacent pixels can be prevented by the light-shielding films 29.

Since the filter components 2R, 2G, 2B are not superposed on each other, color mixture is inhibited. Further, since the green filter component material contains no photosensitive component, the film thickness of the color filter can be reduced and thereby sensitivity characteristic can be improved.

[Method for Manufacturing Solid-State Imaging Device, particularly Color Filter Thereof]

Next, a method for manufacturing the solid-state imaging device, particularly the color filter 28 thereof according to the present embodiment will be described below with reference to FIG. 20A to FIG. 22D. The cross sections shown in FIG. 20A to FIG. 22D correspond to those taken along line a-a' (green-red row) and along line b-b' (green-blue row) of FIG. 19.

First, as shown in FIG. 20A to FIG. 20E, the green filter components 2G (as filter components of a first color) are formed.

Figure 20A:
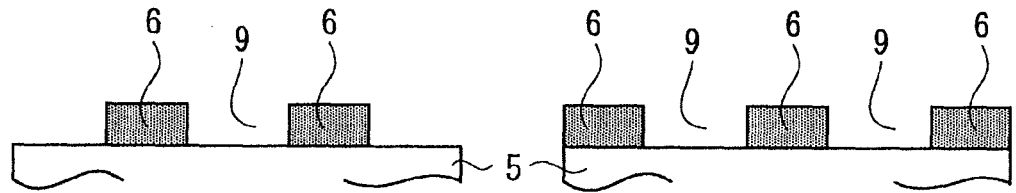
FIG. 20A to FIG. 20E show steps (part 1) for forming the color filter according to the fifth embodiment.

Specifically, as shown in FIG. 20A, a hard mask 6 is formed on the entire surface of the substrate 5 by the method previously described, the hard mask 6 having openings 9 formed in regions where the green filter components are to be formed.

Figure 20B:
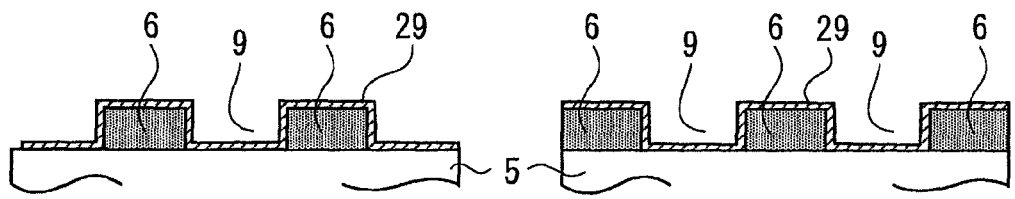

Next, as shown in FIG. 20B, a light-shielding film 29 is formed on the entire surface (including the surface of the hard mask 6 and surface of the openings 9). The aforesaid metal film is used as the light-shielding film 29. The film thickness of the light-shielding film 29 is 100 nm or less.

Figure 20C:
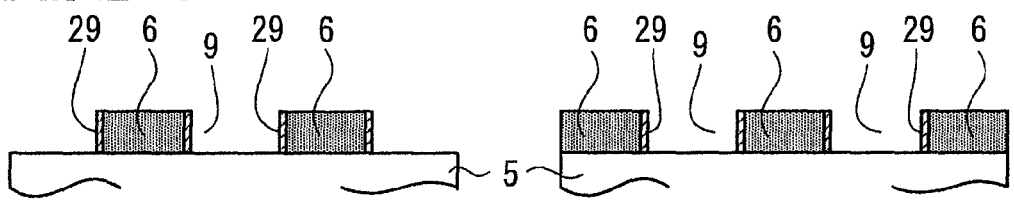

Thereafter, as shown in FIG. 20C, an anisotropic dry etching is performed to the light-shielding film 29, so that only the light-shielding film 29 formed on the inner wall surface of each of the openings 9 of the hard mask 6 is left.

Figure 20D:
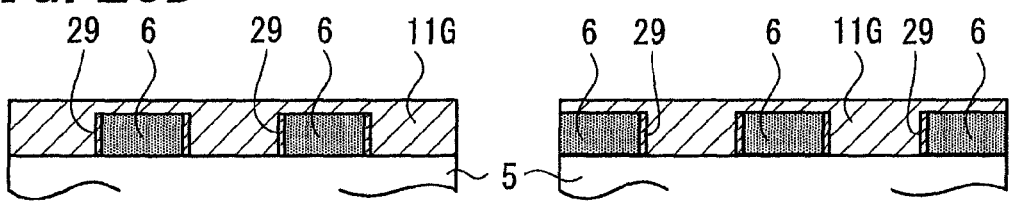

Thereafter, as shown in FIG. 20D, a green filter component material 11G is coated on the entire surface of the hard mask 6, so that the openings 9 are filled with the coated green filter component material 11G. The coating is performed by spin-coating. The green filter component material 11G is made of the aforesaid material whose solid content contains no photosensitive component.

Figure 20E:
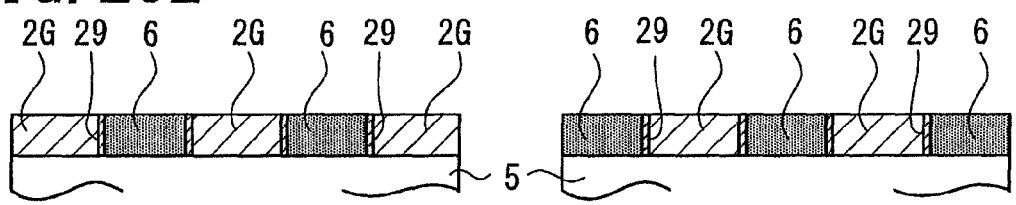

Thereafter, as shown in FIG. 20E, the entire surface of the green filter component material 11G is etched back or, alternatively, treated by chemical mechanical polishing (CMP) until the hard mask 6 is exposed from the green filter component material 11G. In such a manner, the green filter components 2G are formed. Although the green filter components 2G are each formed in a square shape and are arranged checkerwise as a whole, each of the green filter components 2G has four corners thereof connected to adjacent corners of other green filter components 2G, so that the green filter components 2G are formed in one continuous piece.

Thereafter, as shown in FIG. 21A to FIG. 21D, the red filter components 2R (as filter components of a second color) are formed. Incidentally, the blue filter components may also be regarded as the filter components of the second color alternatively. The red filter components 2R are formed in the same manner as described in the first embodiment.

Specifically, as shown in FIG. 21A, a resist mask 14 is formed on the surface including the green filter components 2G and the hard mask 6, the resist mask 14 having openings 13 formed in regions where the red filter components are to be formed. The width of each of the openings 13 is smaller than the width of the corresponding region of the hard mask 6.

Next, as shown in FIG. 21B, the respective regions of the hard mask 6 exposed from the openings 13 are removed by isotropic dry etching through the resist mask 14, so that openings 15 are formed.

Thereafter, the resist mask no longer required is removed and as shown in FIG. 21C, a red filter component material 11R is coated on the entire surface of the green filter components 2G and the hard mask 6, so that the openings 15 are filled with the coated red filter component material 11R. The coating is performed, for example, by spin-coating. The red filter component material 11R is made of the aforesaid material whose solid content contains no photosensitive component.

Thereafter, as shown in FIG. 21D, the entire surface of the red filter component material 11R is etched back or, alternatively, treated by chemical mechanical polishing (CMP) until the hard mask 6 and the green filter components 2G are exposed. In such a manner, the red filter components 2R are formed. The red filter components 2R are each formed in a square shape and are each surrounded by the green filter components 2G.

Figure 22A:
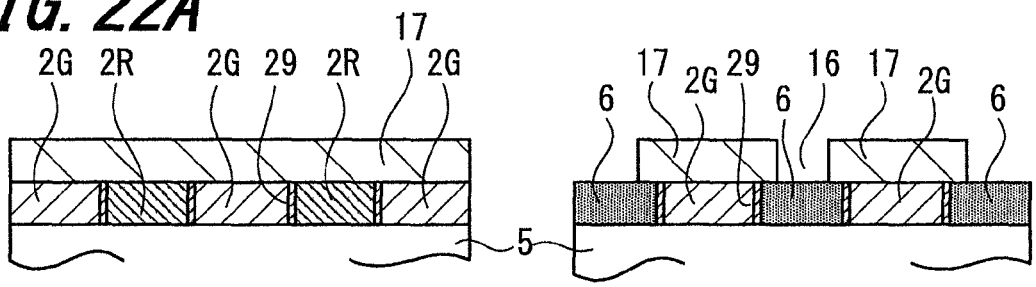
FIG. 22A to FIG. 22D show steps (part 3) for forming the color filter according to the fifth embodiment.

Thereafter, as shown in FIG. 22A, the blue filter components 2B as filter components of a third color are formed. Incidentally, the red filter components 2R may also be regarded as the filter components of the third color alternatively. The blue filter components 2B are formed in the same manner as described in the first embodiment.

Specifically, as shown in FIG. 22A, a resist mask 17 is formed on the surface including the green filter components 2G, red filter components 2R and the hard mask 6, the resist mask 17 having openings 16 formed in regions where the blue filter components are to be formed. The width of each of the openings 16 is smaller than the width of the corresponding region of the hard mask 6.

Figure 22B:
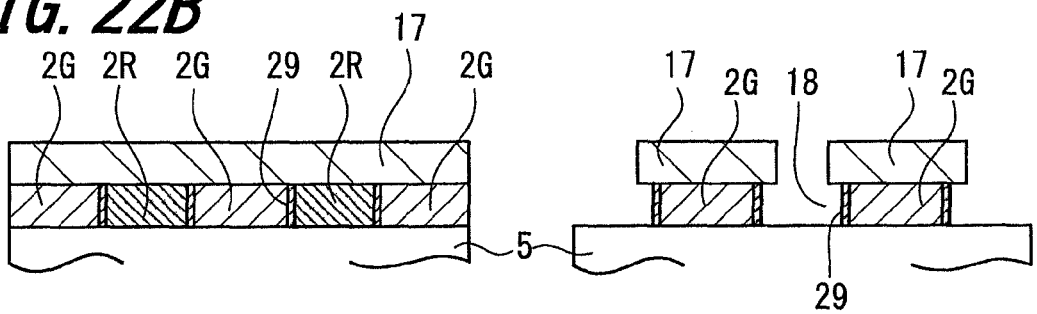

Next, as shown in FIG. 22B, the respective regions of the hard mask 6 exposed from the openings 16 are removed by isotropic dry etching through the resist mask 17, so that openings 15 are formed.

Figure 22C:
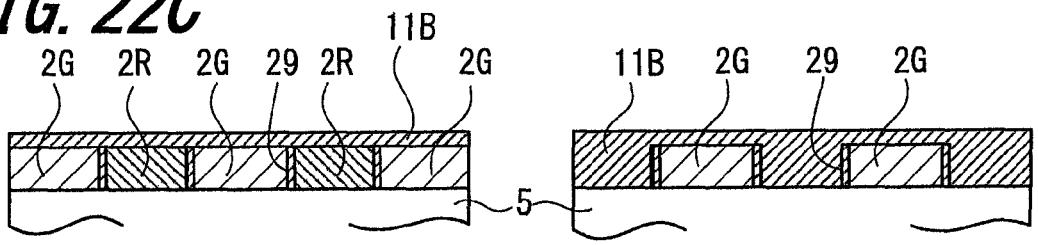

Thereafter, the resist mask no longer required is removed and as shown in FIG. 22C, a blue filter component material 11B is coated on the entire surface of the green filter components 2G, the red filter components 2R and the hard mask 6, so that the openings 18 are filled with the coated blue filter component material 11B. The coating is performed, for example, by spin-coating. The blue filter component material 11B is made of the aforesaid material whose solid content contains no photosensitive component.

Figure 22D:
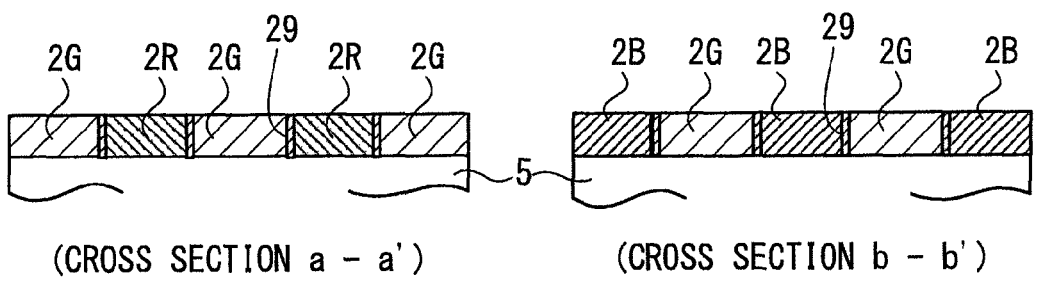

Thereafter, as shown in FIG. 22D, the entire surface of the blue filter component material 11B is etched back or, alternatively, treated by chemical mechanical polishing (CMP) until the green filter components 2G, the red filter components 2R and the light-shielding film 29 are exposed. Thus, the blue filter components 2B are formed. The blue filter components 2B are each formed in a square shape and are each surrounded by the green filter components 2G.

In such a manner, a primary-color Bayer array color filter 28 having light-shielding films 29 formed at both the boundary between the green filter components 2G and red filter components 2R and the boundary between the green filter components 2G and blue filter components 2B is obtained. As can be known from FIG. 19, the red filter components 2R and the blue filter components 2B are each formed in a square shape and are each surrounded by the green filter components 2G through the light-shielding film 29, and the green filter components 2G are connected to each other.

In the method for manufacturing the solid-state imaging device, particularly the color filter thereof according to the present embodiment, the green filter components 2G, the red filter components 2R and the blue filter components 2B are self-aligned to the hard mask 6. Further, the light-shielding film 29 is formed after the hard mask 6 having the openings 9 has been formed, then all the formed light-shielding film 29, except for that formed on the side wall surface of each of the openings 9, is etched back, and then the green filter components 2G, red filter components 2R and blue filter components 2B are respectively formed. In such a manner, since the light-shielding films 29 are formed at both the boundary between the green filter components 2G and red filter components 2R and the boundary between the green filter components 2G and blue filter components 2B, the light incident respectively on the red, green and blue filter components will not be incident on adjacent filter components. Thus, dimension accuracy and superposition accuracy can be improved, and therefore color mixture of the solid-state imaging device can be inhibited.

Further, as previously described, since each of the green filter components 2G has four corners thereof connected to adjacent corners of other green filter components 2G so that the green filter components 2G are formed in one continuous piece, the adhesive area of the green filter components 2G to the base material is large. Further, the red, green and blue filter component materials 2R, 2G, 2B are formed using the heat-curing material or photo-curing material, and therefore they are less susceptible to peeling off compared with the case where a pigment-dispersed photoresist according to the related art is used. Thus, the color filter according to the present embodiment has high adhesive strength to the base material.

Further, due to substantially the same reasons as described in the first, second, third and fourth embodiments, the green filter components 2G, the red filter components 2R and the blue filter components 2B have improved adhesion.

Although the light-shielding film 29 is applied to the Bayer array color filter 28 in the present embodiment, it can also be applied to a color filter (though not shown in the drawings) wherein the red, green and blue filter components are arranged in the same manner as described in the second embodiment.

Sixth Embodiment

Figure 23:
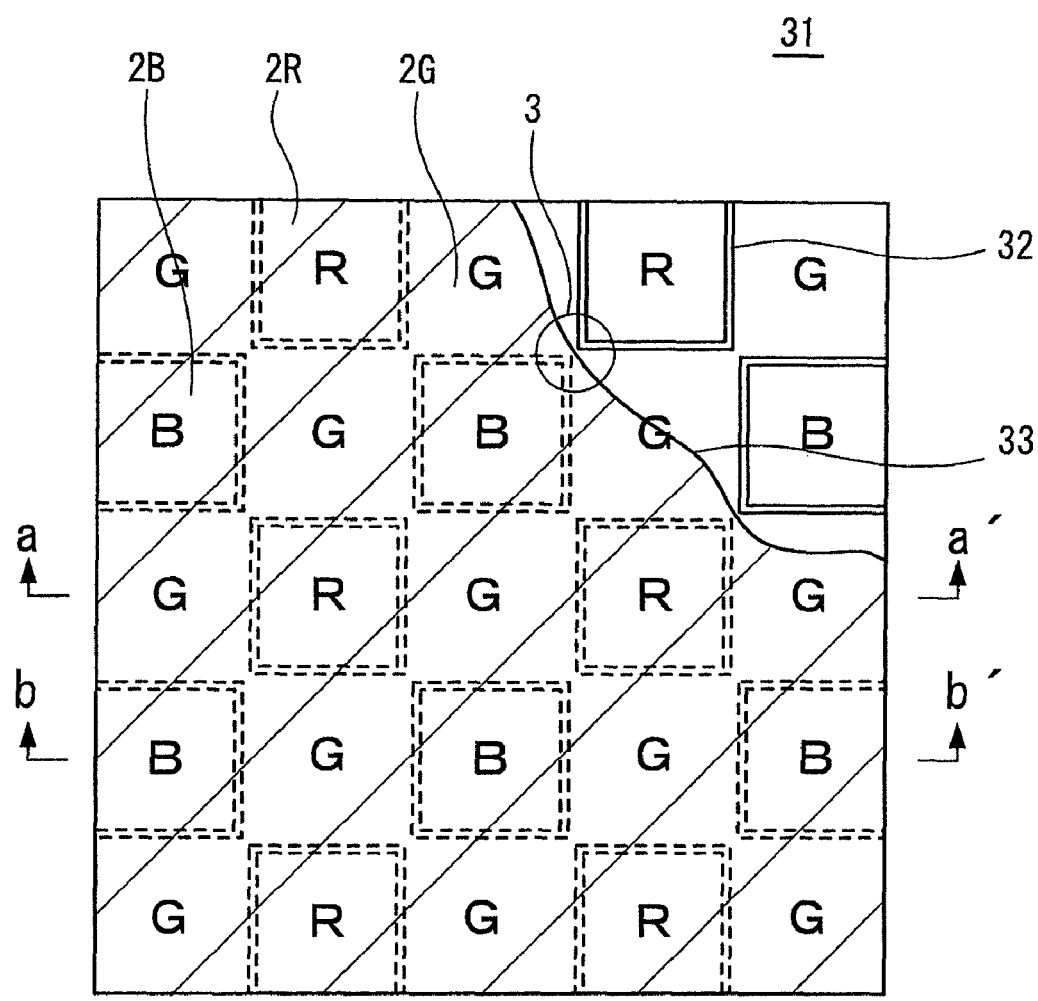
FIG. 23 shows the configuration of a color filter of a solid-state imaging device according to a sixth embodiment of the present invention.

Configuration Example of Solid-State Imaging Device, Particularly Color Filter Thereof FIG. 23 shows a solid-state imaging device, particularly a color filter thereof according to a sixth embodiment of the present invention. In the solid-state imaging device according to the present embodiment, in the same manner as previously described, after an imaging region is formed, a color filter 31 shown in FIG. 23 is formed through a planarizing film. Similar to the first embodiment, the color filter 31 includes red filter components 2R, green filter components 2G and blue filter components 2B arranged in a so-called Bayer array.

Similar to the first embodiment, the color filter 31 is patterned such that the red filter components 2R and the blue filter components 2B are each surrounded by the green filter components 2G. The green filer components 2G, the red filter components 2R, and the blue filter components 2B are each formed in a square shape. Each of the green filter components 2G has four corners 3 thereof connected to adjacent corners 3 of other green filter components 2G, so that the green filter components 2G are formed in one continuous piece. Thus, the red filter components 2R and the blue filter components 2B are each independently formed and surrounded by the green filter components 2G.

Further, in the present embodiment, hollow portions (i.e., air gaps 32) are formed at both the boundary between the green filter components 2G and red filter components 2R and the boundary between the green filter components 2G and blue filter components 2B. Further, an inorganic film 33 substantially transparent to visual light range is formed on the entire surface of the red, green and blue filter components 2R, 2G, 2B so as to cover the air gaps 32. Each of the red, green and blue filter components 2R, 2G, 2B surrounded by the air gap 32 functions as an air-gap waveguide. In other words, each of the red, green and blue filter components 2R, 2G, 2B surrounded by the air gap 32 constitutes a hollow light-total-reflecting waveguide. The width of the air gap 32, which configures a clad (a low-refractive-index region) of the light-total-reflecting waveguide, can be made very small, for example, substantially 100 nm.

Further, as can be known from the manufacturing method to be described later, the red filter components 2R and blue filter components 2B are self-aligned to the green filters 2G using a hard mask. As previously described in the first embodiment, the filter components 2R, 2G, and 2B are each made of a material whose solid content contains photosensitive component or a material whose solid content contains no photosensitive component.

In the solid-state imaging device according to the present embodiment, the red filter components 2R and the blue filter components 2B are self-aligned to the green filter components 2G by using a hard mask. Thus, superposition error of the red filter components 2R, the green filter components 2G and the blue filter components 2B will not be caused, and as a result, the red filter components 2R, the green filter components 2G and the blue filter components 2B can be accurately formed without being superposed on each other. Further, since each of the green filter components 2G has four corners thereof connected to adjacent corners of other green filter components 2G so that the green filter components 2G are formed in one continuous piece, the green filter components 2G never peel off. Thus, processing accuracy of the color filter 31 according to the present embodiment can be improved.

Since the air gap 32 is formed at both the boundary between the red filter components 2R and the green filter components 2G and the boundary between the blue filter components 2B and the green filter components 2G, and thereby refractive index difference is generated, so that each of the red, green and blue filter components 2R, 2G, 2B constitutes a light-total-reflecting waveguide. Thus, the light condensed by the on-chip microlenses and incident respectively on the red, green and blue filter components 2R, 2G, 2B is not incident on adjacent filter components, and therefore color mixture can be prevented.

Further, since the filter components 2R, 2G, 2B are not superposed on each other, color mixture is inhibited. Further, since the green filter component material contains no photosensitive component, the film thickness of the color filter can be reduced and thereby sensitivity characteristic can be improved.

Since the inorganic film 33 is formed on the surface of the red, green and blue filter components 2R, 2G, 2B, even if the red, green and blue filter components are formed of a filter material containing colorant (dye or pigment), light resistance of the red, green and blue filter components can be improved.

[Method for Manufacturing Solid-State Imaging Device, Particularly Color Filter Thereof]

Next, a method for manufacturing the solid-state imaging device, particularly the color filter thereof according to the present embodiment will be described below with reference to FIG. 24A to FIG. 26F. The cross sections shown in FIG. 24A to FIG. 26F correspond to those taken along line a-a' (green-red row) and along line b-b' (green-blue row) of FIG. 23.

First, as shown in FIG. 24A to FIG. 24E, the green filter components 2G (as filter components of a first color) are formed.

Figure 24A:
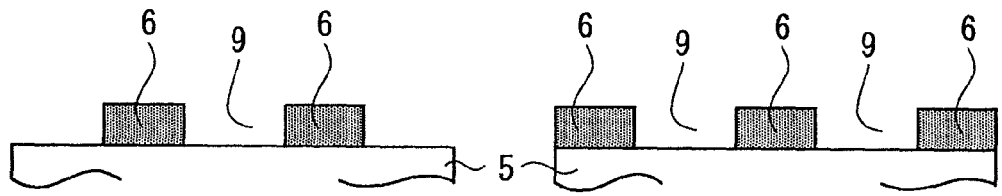
FIG. 24A to FIG. 24E show steps (part 1) for forming the color filter according to the sixth embodiment.

Specifically, as shown in FIG. 24A, a hard mask 6 is formed on the entire surface of the substrate 5 by the method previously described, the hard mask 6 having openings 9 formed in regions where the green filter components are to be formed.

Figure 24B:
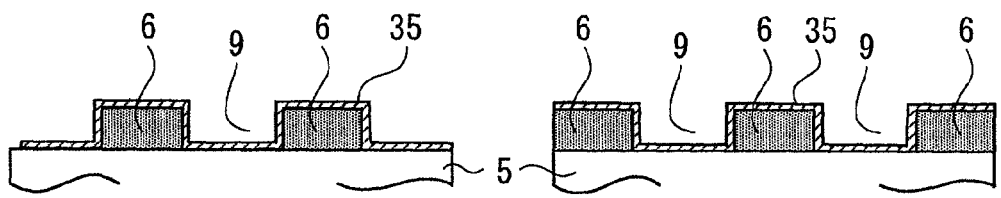

Next, as shown in FIG. 24B, an inorganic film 35 is formed on the entire surface (including the surface of the hard mask 6 and surface of the openings 9). Examples of the inorganic film 35 include the following films formed by low temperature plasma CVD film-forming method: SiN film, $SiO_2$ film, SiON film and the like. In the case where the hard mask 6 is formed of, for example, polysilicon film, amorphous silicon film and the like, the inorganic film 35 can be the SiN film. The film thickness of the inorganic film 35 is preferably about 100 nm.

Figure 24C:
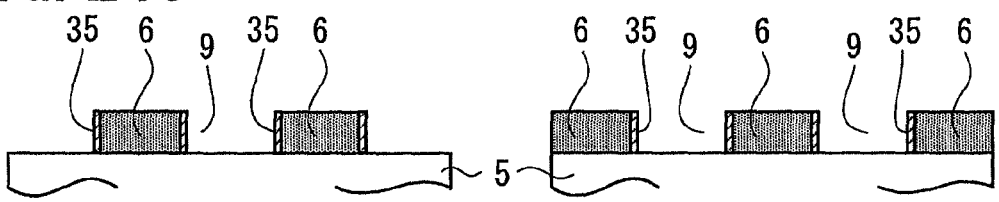

Thereafter, as shown in FIG. 24C, an anisotropic dry etching is performed to the inorganic film 35, so that only the inorganic film 35 formed on the inner wall surface of each of the openings 9 of the hard mask 6 is left.

Figure 24D:
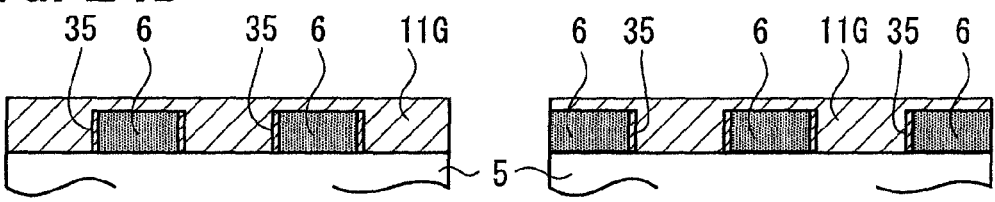

Thereafter, as shown in FIG. 24D, a green filter component material 11G is coated on the entire surface of the hard mask 6, so that the openings 9 are filled with the coated green filter component material 11G. The coating is performed by spin-coating. The green filter component material 11G is made of the aforesaid material whose solid content contains photosensitive component or material whose solid content contains no photosensitive component.

Figure 24E:
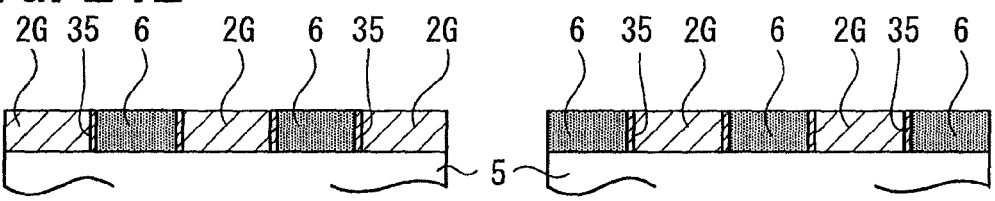

Thereafter, as shown in FIG. 24E, the entire surface of the green filter component material 11G is etched back or, alternatively, treated by chemical mechanical polishing (CMP) until the hard mask 6 is exposed from the green filter component material 11G. In such a manner, the green filter components 2G are formed. Although the green filter components 2G are each formed in a square shape and are arranged checkerwise as a whole, each of the green filter components 2G has four corners thereof connected to adjacent corners of other green filter components 2G, so that the green filter components 2G are formed in one continuous piece.

Thereafter, as shown in FIG. 25A to FIG. 25D, the red filter components 2R (as filter components of a second color) are formed. Incidentally, the blue filter components may also be regarded as the filter components of the second color alternatively. The red filter components 2R are formed in the same manner as described in the first embodiment.

Figure 25A:
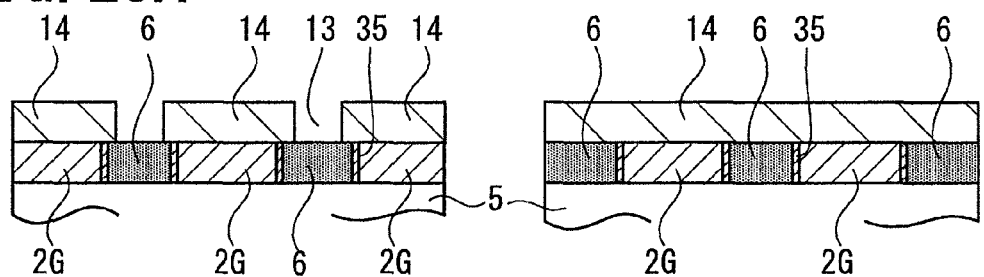
FIG. 25A to FIG. 25D show steps (part 2) for forming the color filter according to the sixth embodiment.

Specifically, as shown in FIG. 25A, a resist mask 14 is formed on the surface including the green filter components 2G and the hard mask 6, the resist mask 14 having openings 13 formed in regions where the red filter components are to be formed. The width of each of the openings 13 is smaller than the width of the corresponding region of the hard mask 6.

Figure 25B:
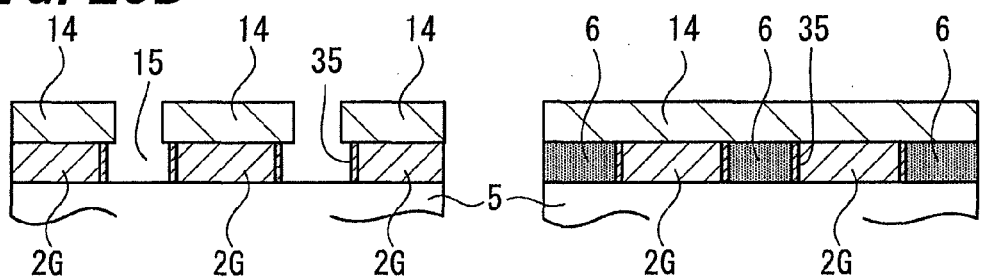

Next, as shown in FIG. 25B, the respective regions of the hard mask 6 exposed from the openings 13 are removed by isotropic dry etching through the resist mask 14, so that openings 15 are formed. Selective etching is performed so that the inorganic film 35 is not removed. A chemical dry etching (CDE) method using a mixture gas containing oxygen gas and a fluorocarbon-based gas such as $CF_4$ or a mixture gas containing oxygen gas, a fluorocarbon-based gas such as $CF_4$ and nitrogen gas is employed to perform the etching process.

Figure 25C:
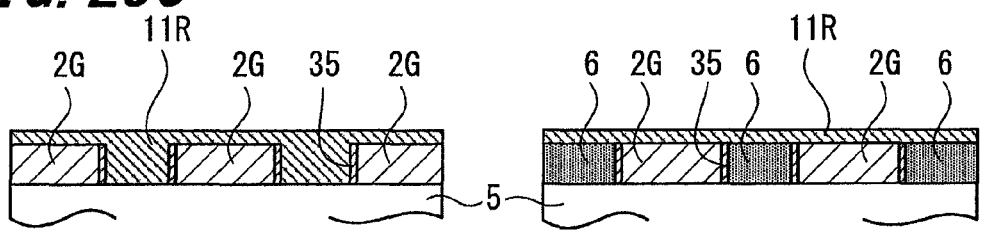

Thereafter, the resist mask no longer required is removed and as shown in FIG. 25C, a red filter component material 11R is coated on the entire surface of the green filter components 2G and the hard mask 6, so that the openings 15 are filled with the coated red filter component material 11R. The coating is performed, for example, by spin-coating. The red filter component material 11R is made of the aforesaid material whose solid content contains photosensitive component or material whose solid content contains no photosensitive component.

Figure 25D:
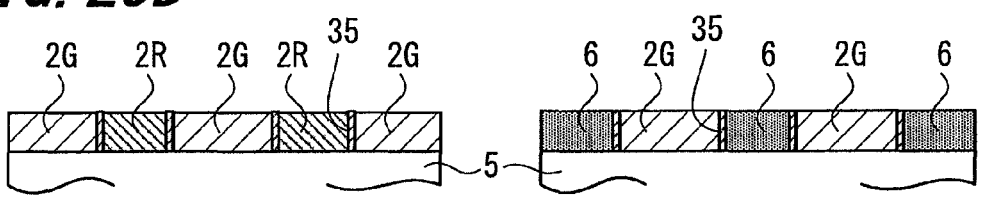

Thereafter, as shown in FIG. 25D, the entire surface of the red filter component material 11R is etched back or, alternatively, treated by chemical mechanical polishing (CMP) until the hard mask 6 and the green filter components 2G are exposed. In such a manner, the red filter components 2R are formed. The red filter components 2R are each formed in a square shape and are each surrounded by the green filter components 2G.

Figure 26A:
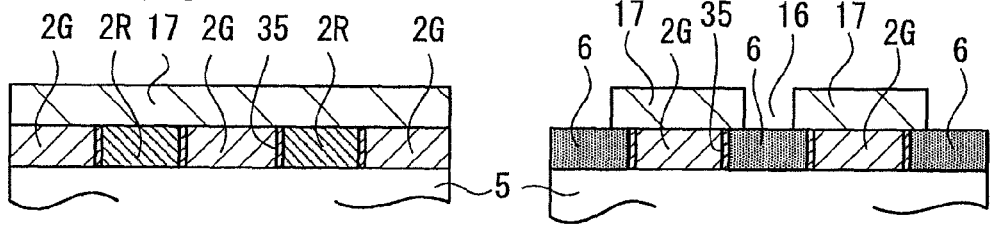
FIG. 26A to FIG. 26F show steps (part 3) for forming the color filter according to the sixth embodiment.

Thereafter, as shown in FIG. 26A, the blue filter components 2B as filter components of a third color are formed. Incidentally, the red filter components 2R may also be regarded as the filter components of the third color alternatively. The blue filter components 2B are formed in the same manner as described in the first embodiment.

Specifically, as shown in FIG. 26A, a resist mask 17 is formed on the surface including the green filter components 2G, red filter components 2R and the hard mask 6, the resist mask 17 having openings 16 formed in regions where the blue filter components are to be formed. The width of each of the openings 16 is smaller than the width of the corresponding region of the hard mask 6.

Figure 26B:
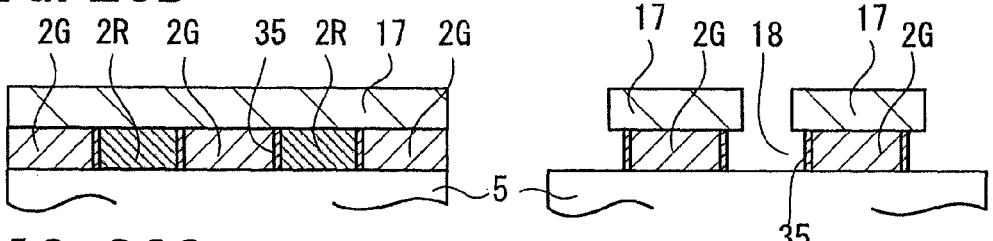

Next, as shown in FIG. 26B, the respective regions of the hard mask 6 exposed from the openings 16 are removed by isotropic dry etching through the resist mask 17, so that openings 15 are formed.

Figure 26C:
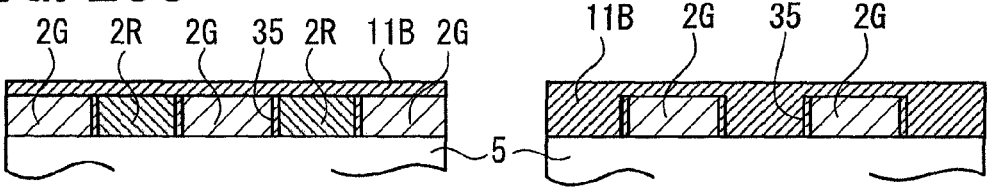

Thereafter, the resist mask no longer required is removed and as shown in FIG. 26C, a blue filter component material 11B is coated on the entire surface of the green filter components 2G, the red filter components 2R and the hard mask 6, so that the openings 18 are filled with the coated blue filter component material 11B. The coating is performed, for example, by spin-coating. The blue filter component material 11B is made of the aforesaid material whose solid content contains photosensitive component or material whose solid content contains no photosensitive component.

Figure 26D:
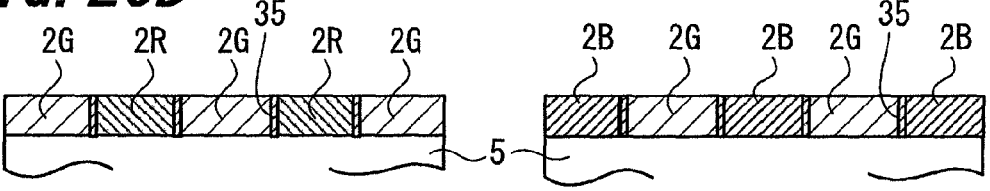

Thereafter, as shown in FIG. 26D, the entire surface of the blue filter component material 11B is etched back or, alternatively, treated by chemical mechanical polishing (CMP) until the green filter components 2G, the red filter components 2R and the light-shielding film 29 are exposed. Thus, the blue filter components 2B are formed. The blue filter components 2B are each formed in a square shape and are each surrounded by the green filter components 2G.

Figure 26E:
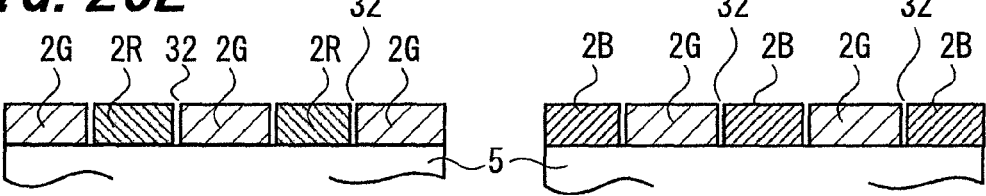

Thereafter, as shown in FIG. 26E, the inorganic films 35 are selectively removed by dry etching, so that air gaps 32 are formed at both the boundary between the green filter components 2G and red filter components 2R and the boundary between the green filter components 2G and blue filter components 2B. A chemical dry etching (CDE) method using a mixture gas containing oxygen gas and a fluorocarbon-based gas such as CF4 or a mixture gas containing oxygen gas, a fluorocarbon-based gas such as CF4 and nitrogen gas is employed to perform the etching process.

Figure 26F:
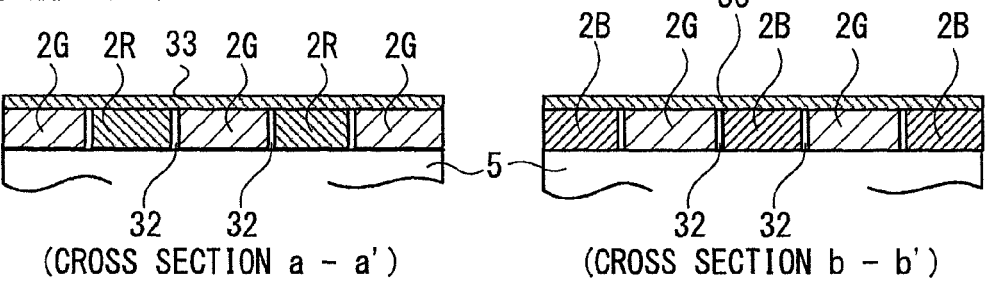

Next, as shown in FIG. 26F, an inorganic film 33 is formed on the entire surface including the red, green and blue filter components 2R, 2G, 2B. Since the inorganic film 33 seals the air gaps 32, it is formed of a film substantially transparent to visual light range. Examples of the inorganic film 33 include the following films formed by low temperature plasma film-forming method: SiN film, SiO$_2$ film, SiON film and the like. Film-forming temperature is preferably 150° C. to 220° C., and suitable film thickness is 200 nm or less.

In such a manner, a primary-color Bayer array color filter 31 having air gaps 32 formed at both the boundary between the green filter components 2G and red filter components 2R and the boundary between the green filter components 2G and blue filter components 2B is obtained. As can be known from FIG. 23, the red filter components 2R and the blue filter components 2B are each formed in a square shape and are each surrounded by the green filter components 2G through the air gaps 32, and the green filter components 2G are connected to each other.

In the method for manufacturing the solid-state imaging device, particularly the color filter thereof according to the present embodiment, the green filter components 2G, the red filter components 2R and the blue filter components 2B are self-aligned to the hard mask 6. Further, after the hard mask 6 having the openings 9 is formed, the green filter components 2G, the red filter components 2R and the blue filter components 2B are formed, and thereafter the air gaps 32 are formed by removing the inorganic film 33, so that the light-total-reflecting waveguide is formed for each of the filter components. Thus, dimension accuracy and superposition accuracy can be improved, and therefore color mixture of the solid-state imaging device can be inhibited.

Further, as previously described, since each of the green filter components 2G has four corners thereof connected to adjacent corners of other green filter components 2G so that the green filter components 2G are formed in one continuous piece, the adhesive area of the green filter components 2G to the base material is large. Further, the red, green and blue filter component materials 2R, 2G, 2B are formed using the heat-curing material or photo-curing material, and therefore they are less susceptible to peeling off compared with the case where a pigment-dispersed photoresist according to the related art is used. Thus, the color filter according to the present embodiment has high adhesive strength to the base material.

Further, due to substantially the same reasons as described in the first, second, third and fourth embodiments, the green filter components 2G, the red filter components 2R and the blue filter components 2B have improved adhesion.

Although the air gap 32 is applied to the Bayer array color filter 31 in the present embodiment, it can also be applied to a color filter (though not shown in the drawings) wherein the red, green and blue filter components are arranged in the same manner as described in the second embodiment.

Seventh Embodiment

Figure 27:
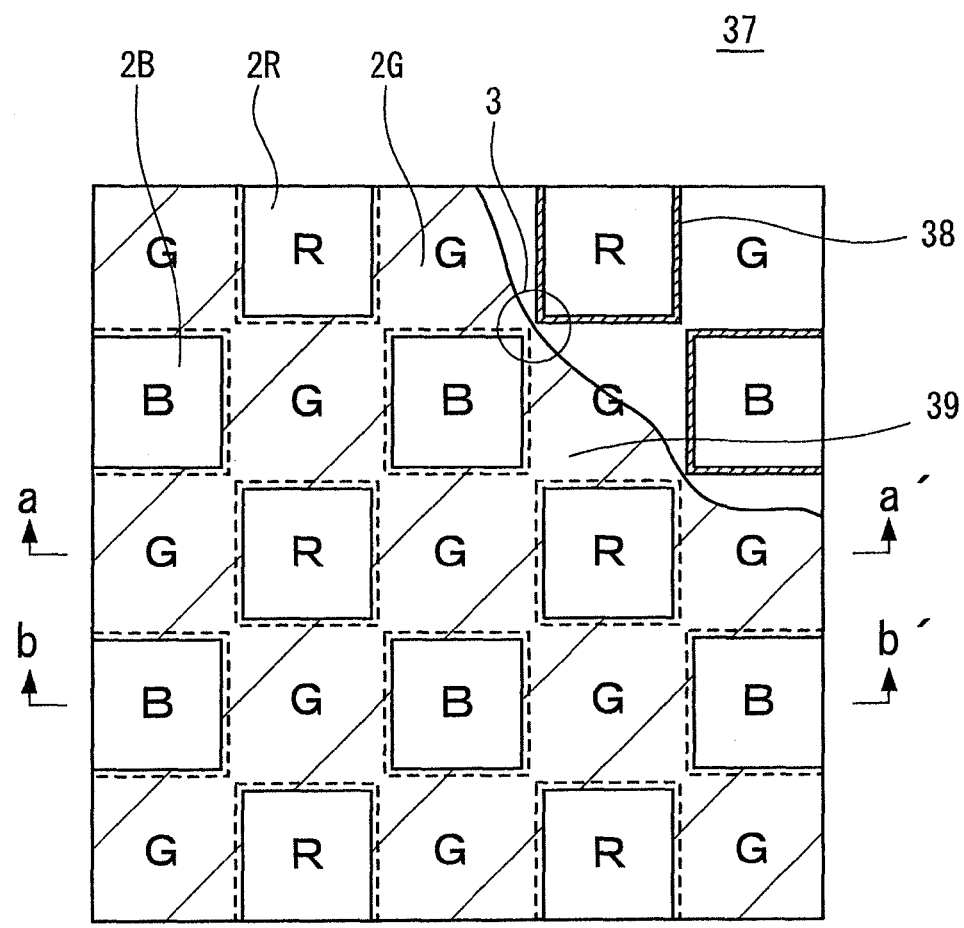
FIG. 27 shows the configuration of a color filter of a solid-state imaging device according to a seventh embodiment of the present invention.

Configuration Example of Solid-State Imaging Device, Particularly Color Filter Thereof FIG. 27 shows a solid-state imaging device, particularly a color filter thereof according to a seventh embodiment of the present invention. In the solid-state imaging device according to the present embodiment, in the same manner as previously described, after an imaging region is formed, a color filter 37 shown in FIG. 27 is formed through a planarizing film. Similar to the first embodiment, the color filter 37 includes red filter components 2R, green filter components 2G and blue filter components 2B arranged in a so-called Bayer array.

Similar to the first embodiment, the color filter 37 is patterned such that the red filter components 2R and the blue filter components 2B are each surrounded by the green filter components 2G. The green filer components 2G, the red filter components 2R, and the blue filter components 2B are each formed in a square shape. Each of the green filter components 2G has four corners 3 thereof connected to adjacent corners 3 of other green filter components 2G, so that the green filter components 2G are formed in one continuous piece. Thus, the red filter components 2R and the blue filter components 2B are each independently formed and surrounded by the green filter components 2G.

Further, in the present embodiment, light-shielding film 38 is formed at both the boundary between the green filter components 2G and red filter components 2R and the boundary between the green filter components 2G and blue filter components 2B, and inorganic film 39 is formed on both the green filter components 2G and the light-shielding film 38. The light-shielding film 38 is preferably formed using a metal film which is a hard mask described in manufacturing method to be discussed later. The metal light-shielding film 38 is made of, for example, W, Al, Ru, Mo, Ir, Rh, Cr, Co and the like, and has a function of a reflective film. The light-shielding film 38 may also be formed of an organic film. The inorganic film 39 serves as a stopper film in a planarizing step to be described later. Examples of the inorganic film 39 include the following films formed by low temperature plasma CVD film-forming method: silicon oxide (SiO$_2$) film, silicon nitride (SiN) film, silicon oxycarbonitride (SiOC) film, silicon oxynitride (SiON) film and the like. Film-forming temperature is preferably 150° C. to 250° C., and more preferably 200° C. or lower. The suitable film thickness of the inorganic film 39 is 200 nm or less.

Further, as can be known from the manufacturing method to be described later, the red filter components 2R and blue filter components 2B are self-aligned to the green filters 2G using a hard mask. The green filter components 2G are made of the aforesaid material whose solid content contains photosensitive component or material whose solid content contains no photosensitive component. On the other hand, the red filter components 2R and blue filter components 2B are made of a photosensitive filter material.

In the solid-state imaging device according to the present embodiment, the red filter components 2R and the blue filter components 2B are self-aligned to the green filter components 2G by using a hard mask. Further, the inorganic film 39 functions as a stopper film for planarizing the red filter components 2R and the blue filter components 2B, so that the red filter components 2R and the blue filter components 2B can be precisely planarized to have a film thickness substantially equal to that of the green filter components 2G. Thus, superposition error of the red filter components 2R, the green filter components 2G and the blue filter components 2B will not be caused, and as a result, the red filter components 2R, the green filter components 2G and the blue filter components 2B can be accurately formed without being superposed on each other. Further, since each of the green filter components 2G has four corners thereof connected to adjacent corners of other green filter components 2G so that the green filter components 2G are formed in one continuous piece, the green filter components 2G never peel off. Thus, processing accuracy of the color filter according to the present embodiment can be improved.

Since the light-shielding film 38 is formed at both the boundary between the red filter components 2R and the green filter components 2G and the boundary between the blue filter components 2B and the green filter components 2G, the incident respectively on the red, green and blue filter components will not be incident on adjacent filter components, and therefore interdiffusion of colorant (pigment or dye) can be prevented. Further, since the red, green and blue filter components 2R, 2G, 2B are formed by self-alignment, the red, green and blue filter components 2R, 2G, 2B will not be superposed on each other. Thus, color mixture is inhibited. Further, in the case where the material contains no photosensitive component is used as the green filter component material, the film thickness of the color filter can be reduced and thereby sensitivity characteristic can be improved.

Since the inorganic film 39 is formed on the green filter components 2G, even if the green filter components are formed of a filter material containing dye, light resistance of the green filter components can be improved. The red filter components 2R and the blue filter components 2B can be made of a filter material containing a pigment-based colorant with better light resistance compared with the filter material containing dye.

[Method for Manufacturing Solid-State Imaging Device, Particularly Color Filter Thereof]

Next, a method for manufacturing the solid-state imaging device, particularly the color filter 37 thereof according to the present embodiment will be described below with reference to FIG. 28A to FIG. 30C. The cross sections shown in FIG. 28A to FIG. 30C correspond to those taken along line a-a' (green-red row) and along line b-b' (green-blue row) of FIG. 27.

Figure 28A:
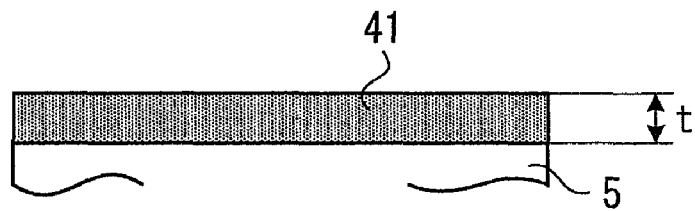
FIG. 28A to FIG. 28E show steps (part 1) for forming the color filter according to the seventh embodiment.

First, as shown in FIG. 28A, a hard mask 41 having a thickness t corresponding to the thickness of the color filter is formed on the entire surface of a substrate 5. The planarizing film is formed on the outermost surface of the substrate 5 to form the color filter. The hard mask 41 according to the present embodiment is formed of a metal film.

Figure 28B:
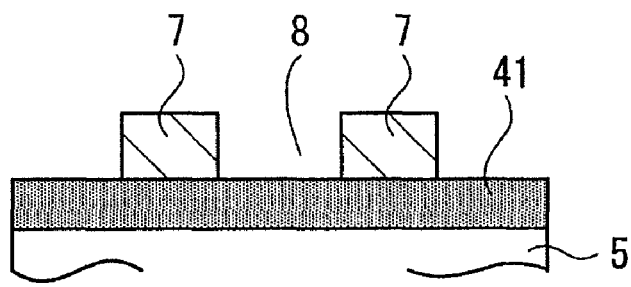

Thereafter, as shown in FIG. 28B, a resist mask 7 is formed on the hard mask 41, the resist mask 7 having openings 8 formed in regions where the green filter components are to be formed. The resist mask 7 is formed using the photolithography method.

Figure 28C:
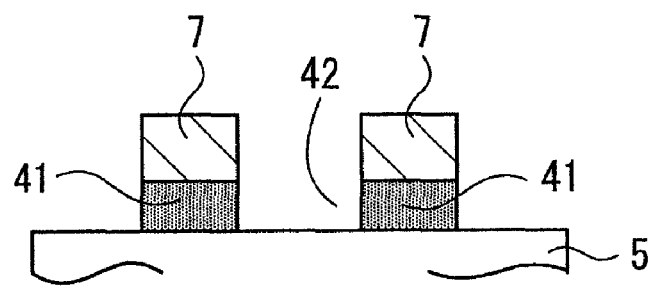

Thereafter, as shown in FIG. 28C, the hard mask 41 exposed from the opening portions 8 of the resist mask 7 is selectively removed by anisotropic dry etching. By performing the selective etching, openings 42 are formed in regions where the green filter components are to be formed.

Figure 28D:
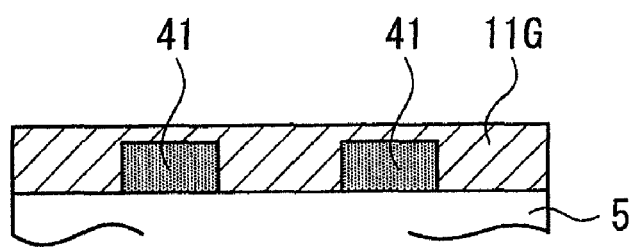

Then the resist mask 7 no longer required is removed. Thereafter, as shown in FIG. 28D, a green filter component material 11G is coated on the entire surface of the hard mask 41, so that the openings 42 are filled with the coated green filter component material 11G. The coating is performed by spin-coating. The green filter component material 11G is made of the aforesaid material whose solid content contains photosensitive component or material whose solid content contains no photosensitive component. The green filter component material 11G is coated and cured.

Figure 28E:
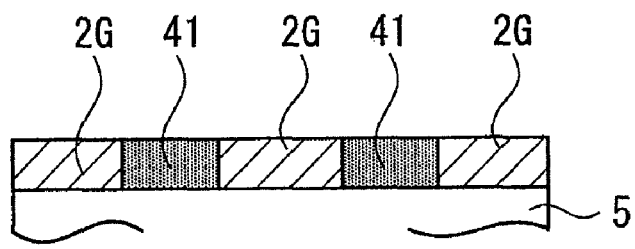

Thereafter, as shown in FIG. 28E, the entire surface of the green filter component material 11G is etched back or, alternatively, treated by chemical mechanical polishing (CMP) until the hard mask 41 is exposed from the green filter component material 11G. In such a manner, the green filter components 2G are formed. Although the green filter components 2G are each formed in a square shape and are arranged checkerwise as a whole, each of the green filter components 2G has four corners thereof connected to adjacent corners of other green filter components 2G, so that the green filter components 2G are formed in one continuous piece. The remaining hard mask 41 is surrounded by the green filter components 2G.

Figure 29A:
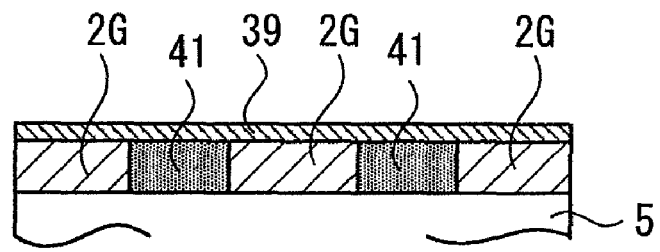
FIG. 29A to FIG. 29C show steps (part 2) for forming the color filter according to the seventh embodiment.

Next, as shown in FIG. 29A, the inorganic film 39 is formed on the entire surface of both the green filter components 2G and the hard mask 41. Examples of the inorganic film 39 include the following films formed by low temperature plasma CVD film-forming method: SiN film, $SiO_2$ film, SiON film and the like. Film-forming temperature is preferably 150° C. to 250° C., and more preferably 200° C. or lower. The film thickness of the inorganic film 39 is 200 nm or less.

Figure 29B:
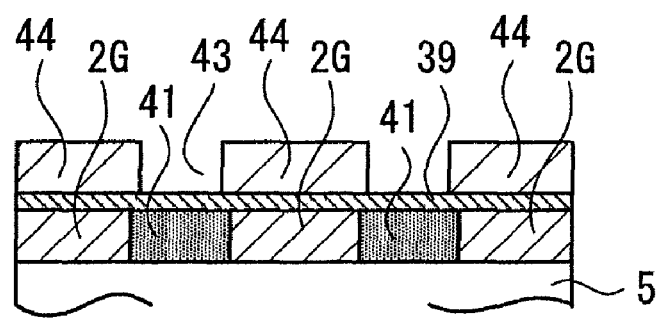

Thereafter, as shown in FIG. 29B, a resist mask 44 is formed on the inorganic film 39, the resist mask 44 having openings 43 formed in regions corresponding to the hard mask 41. The area of each of the openings 43 is smaller than the area of the corresponding hard mask 41 by an area corresponding to the width d of the light-shielding film.

Figure 29C:
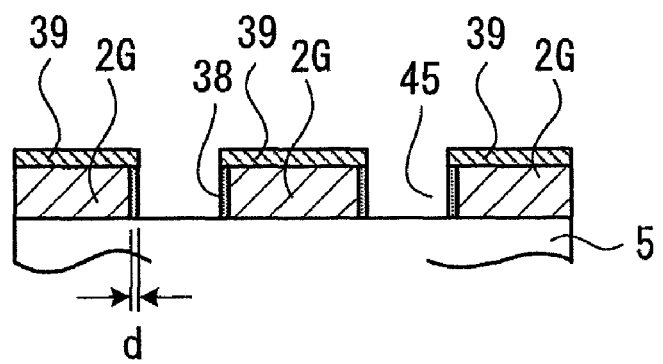

Next, as shown in FIG. 29C, the inorganic film 39 and the hard mask 41 are selectively removed by anisotropic dry etching through the resist mask 44, so that openings 45 are formed. By performing the selective etching, light-shielding film 38 is formed on side wall of the green filter components 2G. In other words, the hard mask 41 left after the selective etching has been performed becomes the light-shielding film 38.

Figure 30A:
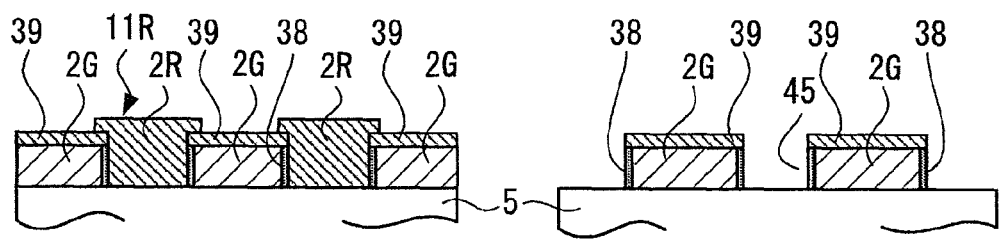
FIG. 30A to FIG. 30C show steps (part 3) for forming the color filter according to the seventh embodiment.

Thereafter, as shown in FIG. 30A, a red filter component material 11R (as filter component material of a second color) is coated on the entire surface, so that the openings 45 are filled with the coated red filter component material 11R. The coating is performed by spin-coating. The red filter component material 11R is a photosensitive filter material. The photosensitive filter material may either be a negative photosensitive material or be a positive photosensitive material. The photosensitive filter material used in the present embodiment is a negative photosensitive material, which is irradiated by the light so that the irradiated portion is cured.

Further, the red filter component material 11R is exposed through an optical mask which only allows the light to pass through regions where the red filter components 2R are to be formed, and the exposed material is developed to form the red filter components 2R. At this time, since superposition error of the optical mask needs to be taken into consideration, the area of each of the exposed regions is slightly larger than that of each of the openings 45. Thus, the red filter components 2R partially overlap with the green filter components 2G.

Figure 30B:
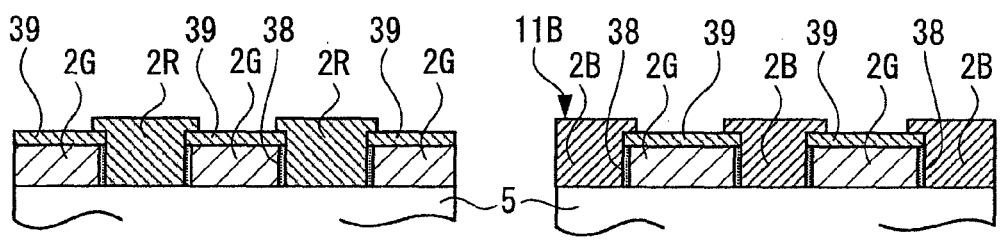

Thereafter, as shown in FIG. 30B, a blue filter component material 11B (as filter component material of a third color) is coated on the entire surface, so that the remaining openings 45 are filled with the coated blue filter component material 11B. The coating is performed by spin-coating. The blue filter component material 11B is a photosensitive filter material. The photosensitive filter material may either be a negative photosensitive material or be a positive photosensitive material. The photosensitive filter material used in the present embodiment is a negative photosensitive material, which is irradiated by the light so that the irradiated portion is cured.

Further, the blue filter component material 11B is exposed through an optical mask which only allows the light to pass through regions where the blue filter components are to be formed, and the exposed material is developed to form the blue filter components 2B. At this time, since superposition error of the optical mask needs to be taken into consideration, the area of each of the exposed regions is slightly larger than that of each of the openings 45. Thus, the blue filter components 2B partially overlap with the green filter components 2G.

Figure 30C:
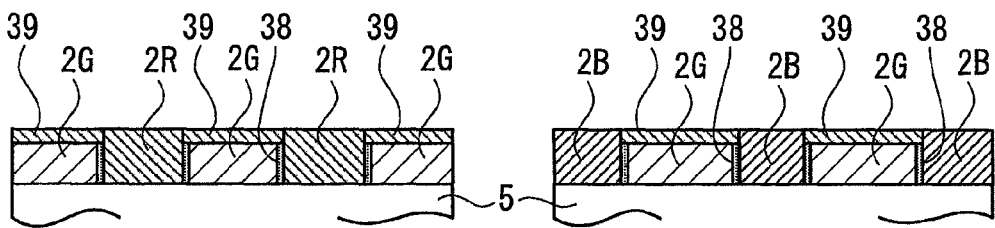

Thereafter, as shown in FIG. 30C, the red filter components 2R and the blue filter components 2B are planarized by etching back or chemical mechanical polishing (CMP) method until the surface of the inorganic film 39 is exposed.

In such a manner, a primary-color Bayer array color filter having the metal light-shielding film 38 formed at the boundary between respective filter components and having the inorganic film 39 formed on the green filter components 2G is obtained. As can be known from FIG. 27, the red filter components 2R and the blue filter components 2B are each formed in a square shape and are each surrounded by the green filter components 2G through the light-shielding film 38, and the green filter components 2G are connected to each other.

In the method for manufacturing the solid-state imaging device, particularly the color filter 37 thereof according to the present embodiment, the green filter components 2G, the red filter components 2R and the blue filter components 2B can be self-aligned to the metal hard mask 41. Further, the light-shielding film 38 can be formed by: forming the inorganic film 39, then performing a selective etching to allow the hard mask 41 to be partly left on the side wall of the green filter components 2G to form the light-shielding film 38. Thus, the red, green and blue filter components 2R, 2G, 2B having reflective waveguide structure can be formed, and therefore color mixture of the solid-state imaging device can be inhibited.

Further, as previously described, since each of the green filter components 2G has four corners thereof connected to adjacent corners of other green filter components 2G so that the green filter components 2G are formed in one continuous piece, the adhesive area of the green filter components 2G to the base material is large. Further, the green filter components 2G are formed using the heat-curing material or photo-curing material, and therefore they are less susceptible to peeling off compared with the case where a pigment-dispersed photoresist according to the related art is used. Thus, the color filter according to the present embodiment has high adhesive strength to the base material.

Further, due to substantially the same reasons as described in the first, second, third and fourth embodiments, the green filter components 2G, the red filter components 2R and the blue filter components 2B have improved adhesion.

Since the inorganic film 39 is formed on the surface of the green filter components 2G, the light resistance of the green filter components 2G can be improved. Thus, the green filter components 2G can be formed by a filter component material containing a dye with excellent spectral characteristics.

Although the metal light-shielding film 38 is formed at the boundary between the respective filter components (i.e., formed on the side wall of the respective filter components) in the present embodiment, a light-shielding film made of an organic film may also be formed at the boundary between the respective filter components instead. In such a case, the organic film may either be a film whose refractive index is smaller than that of the color filter, or be a film made of light-absorptive material. In such a case, the color filter can also be formed using the method shown in FIG. 28A to FIG. 30C. However, the hard mask 41 made of a metal film needs to be replaced by a hard mask made of an organic film. The organic film having small refractive index can be made of a fluorine-containing resin such as a fluorine-containing acrylic resin, a fluorine-containing siloxane resin or the like. Further, by using a resin which disperses porous silica fine particles into the aforesaid resins, refractive index can be further reduced. The light-absorptive organic film can be made of, for example, a carbon black-containing acrylic resin or the like.

In the case where such an organic film is used, the same advantages as described in the seventh embodiment may also be achieved.

Although the light-shielding film 38 and the inorganic film 39 are applied to the Bayer array color filter 37 in the present embodiment, they can also be applied to a color filter (though not shown in the drawings) wherein the red, green and blue filter components are arranged in the same manner as described in the second embodiment.

Eighth Embodiment

Figure 31:
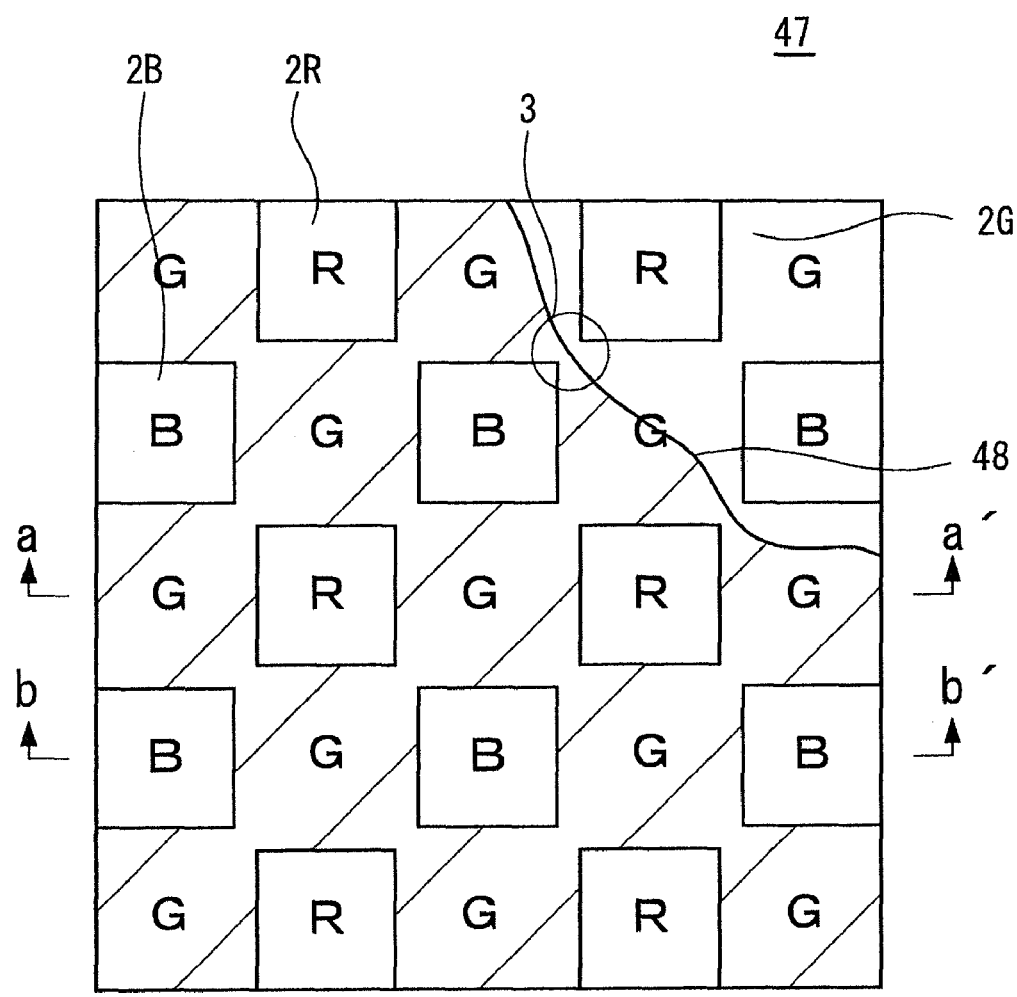
FIG. 31 shows the configuration of a color filter of a solid-state imaging device according to an eighth embodiment of the present invention.

Configuration Example of Solid-State Imaging Device, Particularly Color Filter Thereof FIG. 31 shows a solid-state imaging device, particularly a color filter thereof according to an eighth embodiment of the present invention. In the solid-state imaging device according to the present embodiment, in the same manner as previously described, after an imaging region is formed, a color filter 47 shown in FIG. 31 is formed through a planarizing film. Similar to the first embodiment, the color filter 47 includes red filter components 2R, green filter components 2G and blue filter components 2B arranged in a so-called Bayer array.

Similar to the first embodiment, the color filter 47 is patterned such that the red filter components 2R and the blue filter components 2B are each surrounded by the green filter components 2G. The green filer components 2G, the red filter components 2R, and the blue filter components 2B are each formed in a square shape. Each of the green filter components 2G has four corners 3 thereof connected to adjacent corners 3 of other green filter components 2G, so that the green filter components 2G are formed in one continuous piece. Thus, the red filter components 2R and the blue filter components 2B are each independently formed and surrounded by the green filter components 2G.

Further, in the present embodiment, the inorganic film 48 substantially transparent to visual light range is formed on the green filter components 2G. The inorganic film 48 serves as a stopper film in a planarizing step to be described later. Examples of the inorganic film 48 include the following films formed by low temperature plasma CVD film-forming method: silicon oxide ($SiO_2$) film, silicon nitride (SiN) film, silicon oxycarbonitride (SiOC) film, silicon oxynitride (SiON) film and the like. Film-forming temperature is preferably 150° C. to 250° C., and more preferably 200° C. or lower. The suitable film thickness of the inorganic film 48 is 200 nm or less.

Further, as can be known from the manufacturing method to be described later, the filter components of the second color and the filter components of the third color (for example, the red filter components and the blue filter components) are formed by being self-aligned to the filter components of the first color (for example, the green filter components). The green filer components 2G are made of a filter material contains photosensitive component or a filter material contains no photosensitive component, the red filter components 2R, and the blue filter components 2B are each made of a filter material contains photosensitive component.

In the solid-state imaging device according to the present embodiment, the red filter components 2R and the blue filter components 2B are formed by being self-aligned to the green filter components 2G. Thus, superposition error of the red filter components 2R, the green filter components 2G and the blue filter components 2B will not be caused, and as a result, the red filter components 2R, the green filter components 2G and the blue filter components 2B can be accurately formed without being superposed on each other. Further, since each of the green filter components 2G has four corners thereof connected to adjacent corners of other green filter components 2G so that the green filter components 2G are formed in one continuous piece, the green filter components 2G never peel off. Thus, processing accuracy of the color filter according to the present embodiment can be improved.

Since the inorganic film 48 is formed on the green filter components 2G, even if the green filter components 2G are formed of a filter material containing dye, light resistance of the green filter components can be improved. The red filter components 2R and the blue filter components 2B can be made of a filter material containing a pigment-based colorant with better light resistance compared with the filter material containing dye.

[Method for Manufacturing Solid-State Imaging Device, Particularly Color Filter Thereof]

Next, a method for manufacturing the solid-state imaging device, particularly the color filter thereof according to the present embodiment will be described below with reference to FIG. 32A to FIG. 32G. The cross sections shown in FIG. 32A to FIG. 32G correspond to those taken along line a-a' (green-red row) and along line b-b' (green-blue row) of FIG. 31.

Figure 32A:
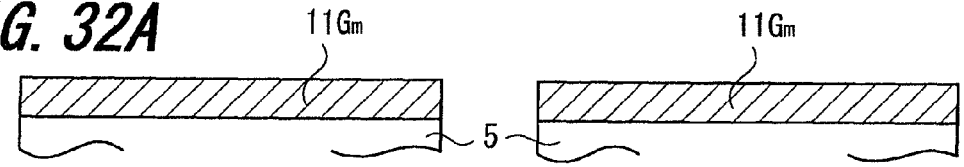
FIG. 32A to FIG. 32G show steps for forming the color filter according to the eighth embodiment.

First, as shown in FIG. 32A, a filter component material film of the first color, such as a green filter component material film 11Gm, having a predetermined thickness is formed on the substrate 5. The planarizing film is formed on the outermost surface of the substrate 5 to form the color filter. The green filter component material can be, for example, a photosensitive filter material. The photosensitive filter material may either be a negative photosensitive material or be a positive photosensitive material. The photosensitive filter material used in the present embodiment is a negative photosensitive material. Incidentally, the green filter component material film 11Gm may also be made of the aforesaid material whose solid content contains no photosensitive component.

The green filter component material film 11Gm is formed on the entire surface of the substrate 5 (i.e., is formed on the entire surface of a semiconductor wafer before being cut into the chips).

Figure 32B:
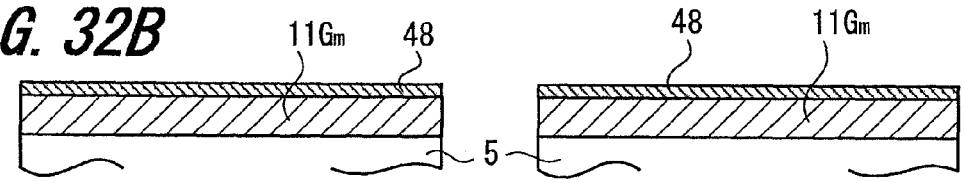

Thereafter, as shown in FIG. 32B, an inorganic film 48 is formed on the entire surface of the green filter component material film 11Gm. Examples of the inorganic film 48 include the following films formed by low temperature plasma film-forming method: SiN film, $SiO_2$ film, SiON film and the like. Film-forming temperature is preferably 150° C. to 250° C., and more preferably 200° C. or lower. The film thickness of the inorganic film 48 is 200 nm or less.

Figure 32C:
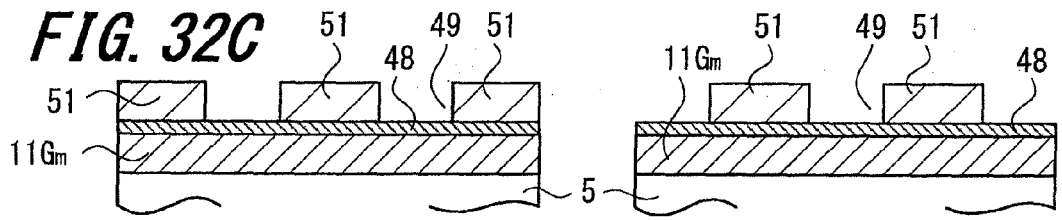

Thereafter, as shown in FIG. 32C, a resist mask 51 is formed on the inorganic film 48, the resist mask 51 having openings 49 formed in regions where the filter components of the second color and the filter components of the third color (for example, the red filter components and the blue filter components) are to be formed.

Figure 32D:
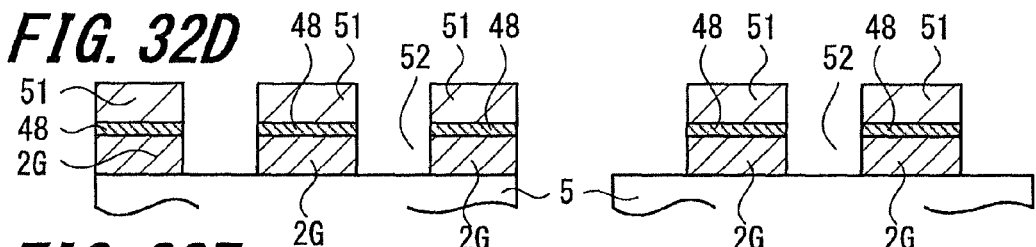

Next, as shown in FIG. 32D, the inorganic film 48 and the green filter component material film 11Gm are selectively removed by anisotropic dry etching through the resist mask 51, so that the green filter components 2G are formed. Openings 52 are formed in regions where the red filter components and the blue filter components are to be formed.

Figure 32E:
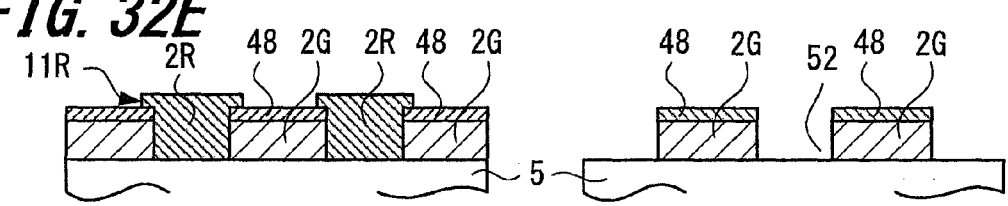

Thereafter, as shown in FIG. 32E, a red filter component material 11R (as filter component material of a second color) is coated on the entire surface, so that the openings 52 are filled with the coated red filter component material 11R. The red filter component material 11R is a photosensitive filter material.

Further, the red filter component material 11R is exposed through an optical mask which only allows the light to pass through regions where the red filter components 2R are to be formed, and the exposed material is developed to form the red filter components 2R. At this time, since superposition error of the optical mask needs to be taken into consideration, the area of each of the exposed regions is slightly larger than that of each of the openings 52. Thus, the red filter components 2R partially overlap with the green filter components 2G.

Figure 32F:
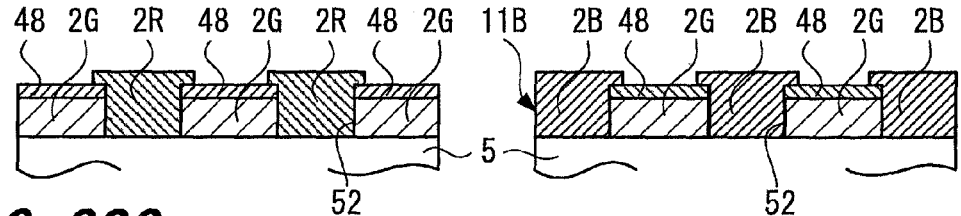

Thereafter, as shown in FIG. 32F, a blue filter component material 11B (as filter component material of a third color) is coated on the entire surface, so that the remaining openings 52 are filled with the coated blue filter component material 11B. The blue filter component material 11B is a photosensitive filter material.

Further, the blue filter component material 11B is exposed through an optical mask which only allows the light to pass through regions where the blue filter components are to be formed, and the exposed material is developed to form the blue filter components 2B. At this time, since superposition error of the optical mask needs to be taken into consideration, the area of each of the exposed regions is slightly larger than that of each of the openings 52. Thus, the blue filter components 2B partially overlap with the green filter components 2G.

Figure 32G:
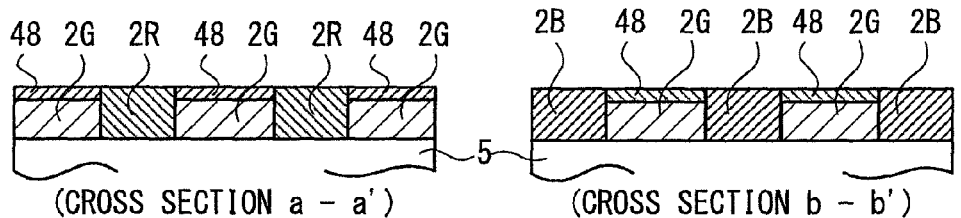

Thereafter, as shown in FIG. 32G, the red filter components 2R and the blue filter components 2B are planarized by etching back or chemical mechanical polishing (CMP) method until the surface of the inorganic film 48 is exposed.

In such a manner, a primary-color Bayer array color filter 47 having the inorganic film 48 formed on the green filter components 2G is obtained. As can be known from FIG. 31, the red filter components 2R and the blue filter components 2B are each formed in a square shape and are each surrounded by the green filter components 2G, and the green filter components 2G are connected to each other.

The photosensitive filter material, by which the aforesaid filter component materials of each color are formed, may either be a negative photosensitive material or be a positive photosensitive material. The photosensitive filter material used in the present embodiment is a negative photosensitive material, which is irradiated by the light so that the irradiated portion is cured.

In the method for manufacturing the solid-state imaging device, particularly the color filter 47 thereof according to the present embodiment, the red filter components 2R and the blue filter components 2B can be self-aligned to the green filter components 2G. Thus, the filter components 2R, 2G, 2B are not superposed on each other, and therefore color mixture can be inhibited. Since the green filter components 2G have adjacent corners thereof connected to each other so as to be continuously formed and therefore never peel off, a highly reliable color filter can be formed. Thus, a color filter having high adhesive strength to the base material can be formed.

Further, due to substantially the same reasons as described in the first, second, third and fourth embodiments, the green filter components 2G, the red filter components 2R and the blue filter components 2B have improved adhesion.

Since the inorganic film 48 is formed on the surface of the green filter components 2G, the light resistance of the green filter components 2G can be improved. Thus, the green filter components 2G can be formed by a filter component material containing a dye with excellent spectral characteristics.

Although the inorganic film 48 is applied to the Bayer array color filter 47 in the present embodiment, it can also be applied to a color filter (though not shown in the drawings) wherein the red, green and blue filter components are arranged in the same manner as described in the second embodiment.

Ninth Embodiment

Figure 33:
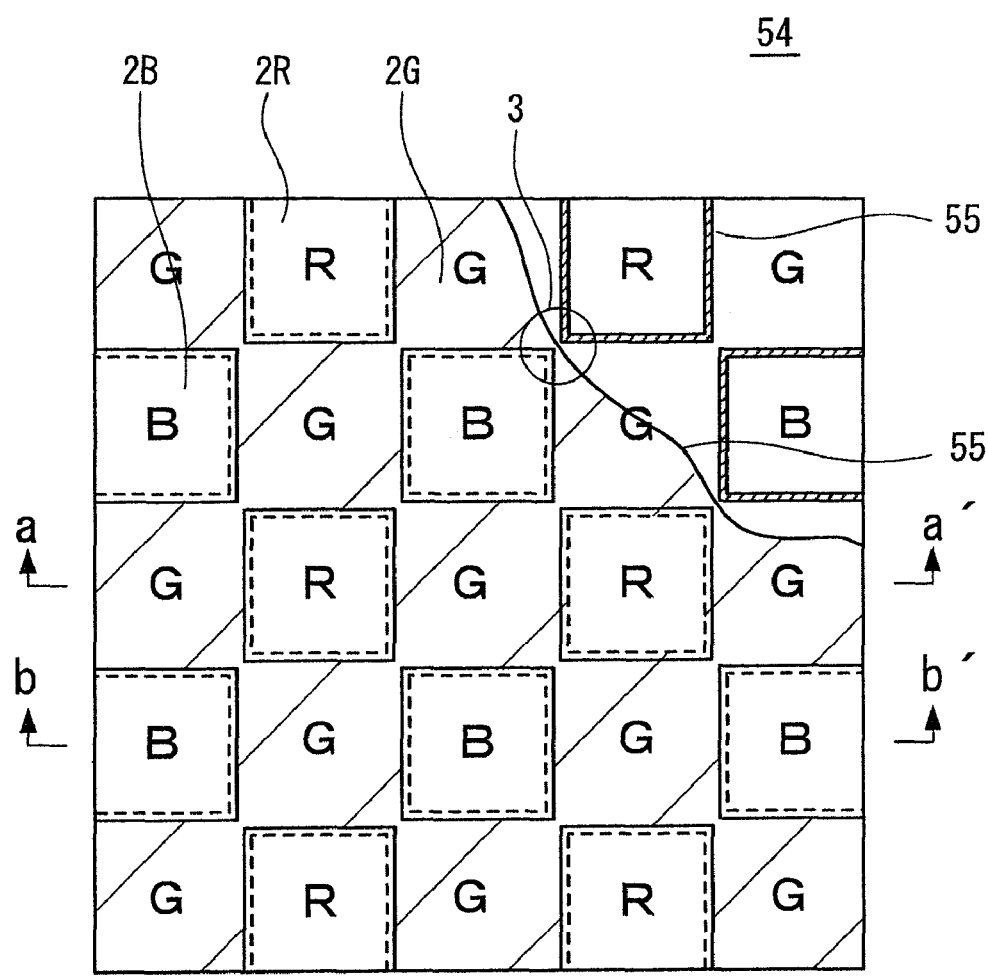
FIG. 33 shows the configuration of a color filter of a solid-state imaging device according to a ninth embodiment of the present invention.

Configuration Example of Solid-State Imaging Device, Particularly Color Filter Thereof FIG. 33 shows a solid-state imaging device, particularly a color filter thereof according to a ninth embodiment of the present invention. In the solid-state imaging device according to the present embodiment, in the same manner as previously described, after an imaging region is formed, a color filter 54 shown in FIG. 33 is formed through a planarizing film. Similar to the first embodiment, the color filter 54 includes red filter components 2R, green filter components 2G and blue filter components 2B arranged in a so-called Bayer array.

Similar to the first embodiment, the color filter 54 is patterned such that the red filter components 2R and the blue filter components 2B are each surrounded by the green filter components 2G. The green filer components 2G, the red filter components 2R, and the blue filter components 2B are each formed in a square shape. Each of the green filter components 2G has four corners 3 thereof connected to adjacent corners 3 of other green filter components 2G, so that the green filter components 2G are formed in one continuous piece. Thus, the red filter components 2R and the blue filter components 2B are each independently formed and surrounded by the green filter components 2G.

An inorganic film 55 substantially transparent to visual light range is continuously formed on the top surface and side surface of the green filter components 2G, and on the bottom surface of each of surindividually independent red filter components 2R and blue filter components 2B. The inorganic film 55 serves as a stopper film in a planarizing step to be described later. Examples of the inorganic film 55 include the following films formed by low temperature plasma film-forming method: silicon oxide ($SiO_2$) film, silicon nitride (SiN) film, silicon oxynitride (SiON) film and the like. Film-forming temperature is preferably 1500-C to 250° C., and more preferably 200° C. or lower. The suitable film thickness of the inorganic film 48 is 200 nm or less.

Further, as can be known from the manufacturing method to be described later, the filter components of the second color and the filter components of the third color (for example, the red filter components and the blue filter components) are formed by being self-aligned to the filter components of the first color (for example, the green filter components). The green filer components 2G, the red filter components 2R, and the blue filter components 2B are made of photosensitive filter material.

In the solid-state imaging device according to the present embodiment, the red filter components 2R and the blue filter components 2B are formed by being self-aligned to the green filter components 2G. Thus, superposition error of the red filter components 2R, the green filter components 2G and the blue filter components 2B will not be caused, and as a result, the red filter components 2R, the green filter components 2G and the blue filter components 2B can be accurately formed without being superposed on each other. Further, since each of the green filter components 2G has four corners thereof connected to adjacent corners of other green filter components 2G so that the green filter components 2G are formed in one continuous piece, the green filter components 2G never peel off. Thus, processing accuracy of the color filter according to the present embodiment can be improved.

Since the inorganic film 55 is formed on the green filter components 2G, even if the green filter components 2G are formed of a filter material containing dye, light resistance of the green filter components can be improved. The red filter components 2R and the blue filter components 2B can be made of a filter material containing a pigment-based colorant with better light resistance compared with the filter material containing dye.

Further, since the inorganic film 48 is formed at both the boundary between the red filter components 2R and the green filter components 2G and the boundary between the blue filter components 2B and the green filter components 2G, interdiffusion of colorant (pigment or dye) can be prevented, and therefore color mixture can be inhibited.

[Method for Manufacturing Solid-State Imaging Device, Particularly Color Filter Thereof]

Next, a method for manufacturing the solid-state imaging device, particularly the color filter thereof according to the present embodiment will be described below with reference to FIG. 34A to FIG. 34G. The cross sections shown in FIG. 34A to FIG. 34G correspond to those taken along line a-a' (green-red row) and along line b-b' (green-blue row) of FIG. 33.

Figure 34A:
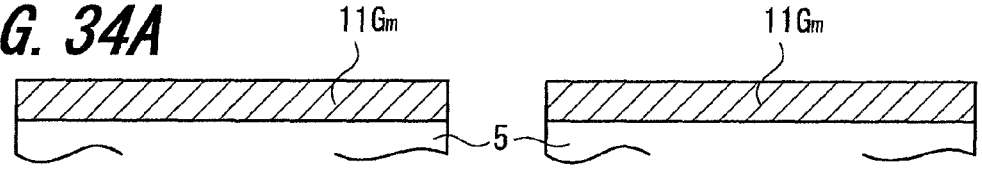
FIG. 34A to FIG. 34G show steps for forming the color filter according to the ninth embodiment.

First, as shown in FIG. 34A, a filter component material film of the first color, such as a green filter component material film 11Gm, having a predetermined thickness is formed on the substrate 5. The planarizing film is formed on the outermost surface of the substrate 5 to form the color filter. The green filter component material can be, for example, a photosensitive filter material. The photosensitive filter material may either be a negative photosensitive material or be a positive photosensitive material. The photosensitive filter material used in the present embodiment is a negative photosensitive material. Incidentally, the green filter component material film 11Gm may also be made of the aforesaid material whose solid content contains no photosensitive component.

Figure 34B:
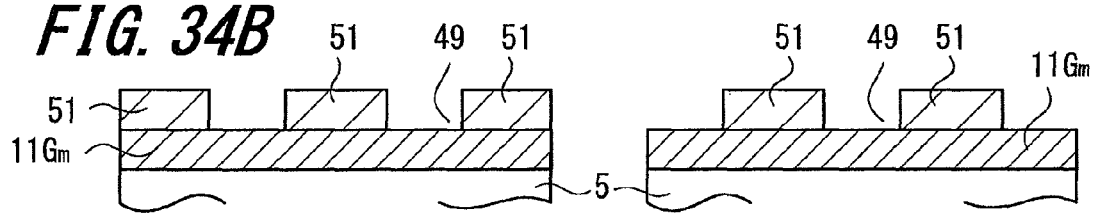

Thereafter, as shown in FIG. 34B, a resist mask 51 is formed on the green filter component material film 11Gm, the resist mask 51 having openings 49 formed in regions where the filter components of the second color and the filter components of the third color (for example, the red filter components and the blue filter components) are to be formed.

Figure 34C:
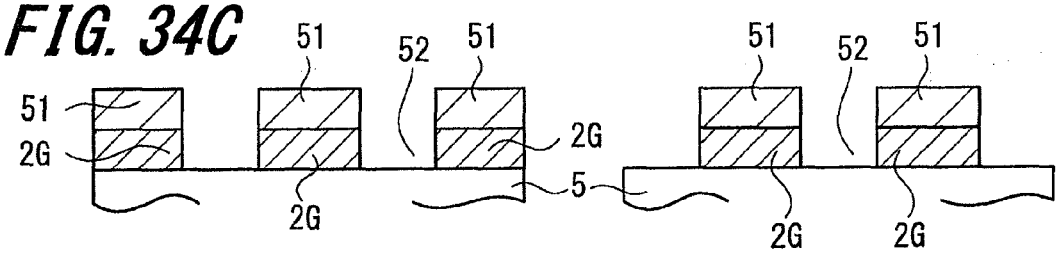

Next, as shown in FIG. 34C, the green filter component material film 11Gm are selectively removed by anisotropic dry etching through the resist mask 51, so that the green filter components 2G are formed. Openings 52 are formed in regions where the red filter components and the blue filter components are to be formed.

Figure 34D:
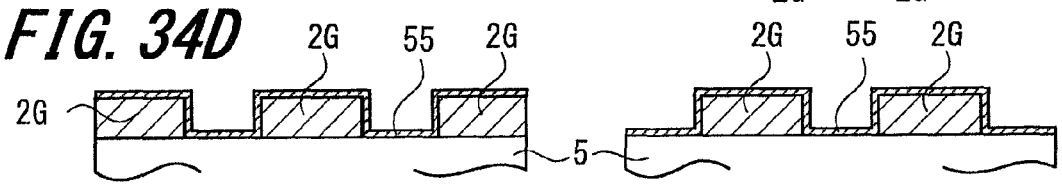

Next, after the resist mask 51 is removed, as shown in FIG. 34D, an inorganic film 55 is formed on the entire surface (including the surface of the green filter components 2G and inner wall surface of the openings 52). Examples of the inorganic film 55 include the following films formed by low temperature plasma film-forming method: SiN film, $SiO_2$ film, SiON film and the like. Film-forming temperature is preferably 150° C. to 250° C., and more preferably 200° C. or lower. The film thickness of the inorganic film 55 is 200 nm or less.

Figure 34E:
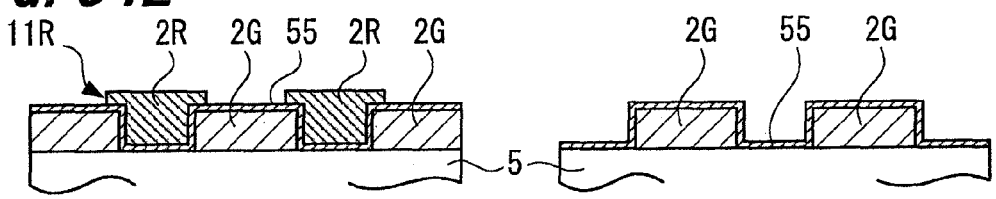

Thereafter, as shown in FIG. 34E, a red filter component material 11R (as filter component material of a second color) is coated on the entire surface, so that the openings 52 are filled with the coated red filter component material 11R. The red filter component material 11R is a photosensitive filter material.

Further, the red filter component material 11R is exposed through an optical mask which only allows the light to pass through regions where the red filter components 2R are to be formed, and the exposed material is developed to form the red filter components 2R. At this time, since superposition error of the optical mask needs to be taken into consideration, the area of each of the exposed regions is slightly larger than that of each of the openings 52. Thus, the red filter components 2R partially overlap with the green filter components 2G.

Figure 34F:
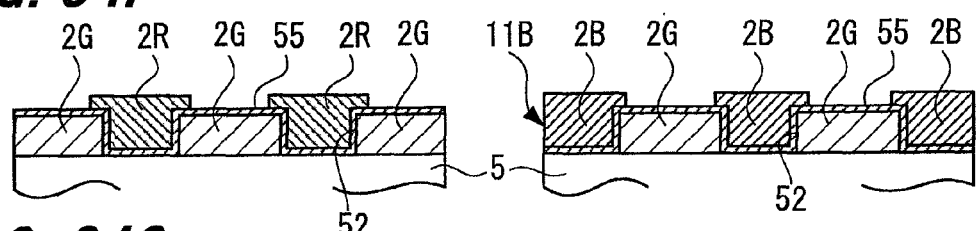

Thereafter, as shown in FIG. 34F, a blue filter component material 11B (as filter component material of a third color) is coated on the entire surface, so that the remaining openings 52 are filled with the coated blue filter component material 11B. The blue filter component material 11B is a photosensitive filter material.

Further, the blue filter component material 11B is exposed through an optical mask which only allows the light to pass through regions where the blue filter components are to be formed, and the exposed material is developed to form the blue filter components 2B. At this time, since superposition error of the optical mask needs to be taken into consideration, the area of each of the exposed regions is slightly larger than that of each of the openings 52. Thus, the blue filter components 2B partially overlap with the green filter components 2G.

Figure 34G:
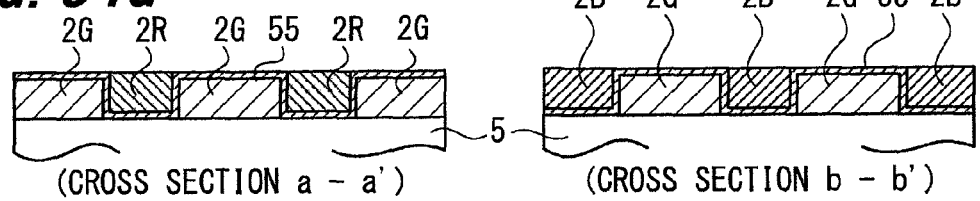

Thereafter, as shown in FIG. 34G, the red filter components 2R and the blue filter components 2B are planarized by etching back or chemical mechanical polishing (CMP) method until the surface of the inorganic film 55 is exposed.

In such a manner, a primary-color Bayer array color filter 54 having the inorganic film 55 is obtained. As can be known from FIG. 33, the red filter components 2R and the blue filter components 2B are each formed in a square shape and are each surrounded by the green filter components 2G, and the green filter components 2G are connected to each other.

The photosensitive filter material, by which the aforesaid filter component materials of each color are formed, may either be a negative photosensitive material or be a positive photosensitive material. The photosensitive filter material used in the present embodiment is a negative photosensitive material, which is irradiated by the light so that the irradiated portion is cured.

In the method for manufacturing the solid-state imaging device, particularly the color filter 54 thereof according to the present embodiment, the red filter components 2R and the blue filter components 2B can be self-aligned to the green filter components 2G. Thus, the filter components 2R, 2G, 2B are not superposed on each other, and therefore color mixture can be inhibited. Since the green filter components 2G have adjacent corners thereof connected to each other so as to be continuously formed and therefore never peel off, a highly reliable color filter can be formed. Thus, the color filter according to the present embodiment has high adhesive strength to the base material.

Further, due to substantially the same reasons as described in the first, second, third and fourth embodiments, the green filter components 2G, the red filter components 2R and the blue filter components 2B have improved adhesion.

Since the inorganic film 55 is formed at both the boundary between the red filter components 2R and the green filter components 2G and the boundary between the blue filter components 2B and the green filter components 2G, it is possible to form a color filter wherein interdiffusion of colorant (pigment or dye) can be prevented, and therefore color mixture can be inhibited.

Since the inorganic film 55 is formed on the surface of the green filter components 2G, the light resistance of the green filter components 2G can be improved. Thus, the green filter components 2G can be formed by a filter component material containing a dye with excellent spectral characteristics.

Although the inorganic film 55 is applied to the Bayer array color filter 54 in the present embodiment, it can also be applied to a color filter (though not shown in the drawings) wherein the red, green and blue filter components are arranged in the same manner as described in the second embodiment.

Tenth Embodiment

Method for Manufacturing Solid-State Imaging Device, Particularly Color Filter Thereof FIG. 35A to FIG. 35G show a manufacturing method of a solid-state imaging device, particularly a color filter thereof according to a tenth embodiment of the present invention. The present embodiment is a modification of the manufacturing method of the color filter according to the ninth embodiment, and the color filter formed by the manufacturing method according to the present embodiment has the same configuration as that of the color filter shown in FIG. 33. The cross sections shown in FIG. 35A to FIG. 35G correspond to those taken along line a-a' (green-red row) and along line b-b' (green-blue row) of FIG. 33.

Figure 35A:
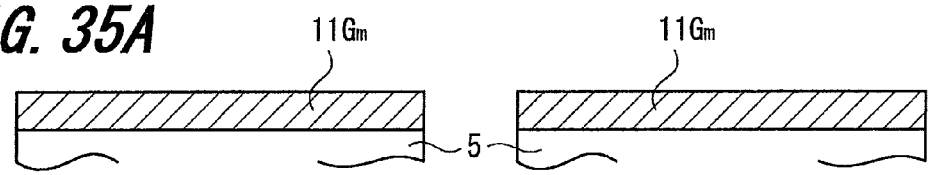
FIG. 35A to FIG. 35G show steps for forming a color filter according to a tenth embodiment of the present invention.

First, as shown in FIG. 35A, a filter component material film of the first color, such as a green filter component material film 11Gm, having a predetermined thickness is formed on the substrate 5. The planarizing film is formed on the outermost surface of the substrate 5 to form the color filter. The green filter component material can be, for example, a photosensitive filter material. The photosensitive filter material may either be a negative photosensitive material or be a positive photosensitive material. The photosensitive filter material used in the present embodiment is a negative photosensitive material. Incidentally, the green filter component material film 11Gm may also be made of the aforesaid material whose solid content contains no photosensitive component.

Figure 35B:
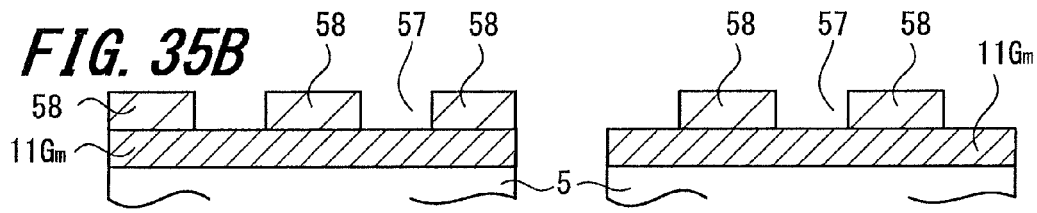

Thereafter, as shown in FIG. 35B, a resist mask 58 is formed on the green filter component material film 11Gm, the resist mask 58 having openings 57 formed in regions where the filter components of the second color and the filter components of the third color (for example, the red filter components and the blue filter components) are to be formed. The film thickness of the resist mask 58 is set so that no residual resist mask will be left after anisotropic dry etching has been performed to selectively remove the green filter component material film 11Gm in the next step shown in FIG. 35C.

Figure 35C:
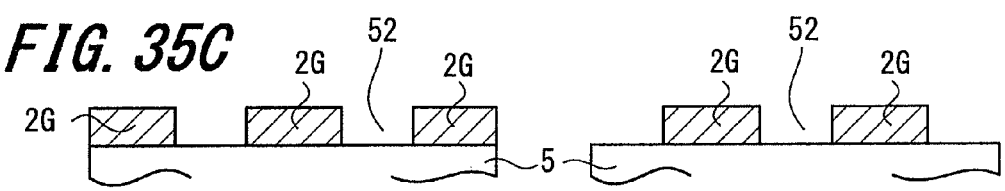
Figure 35D:
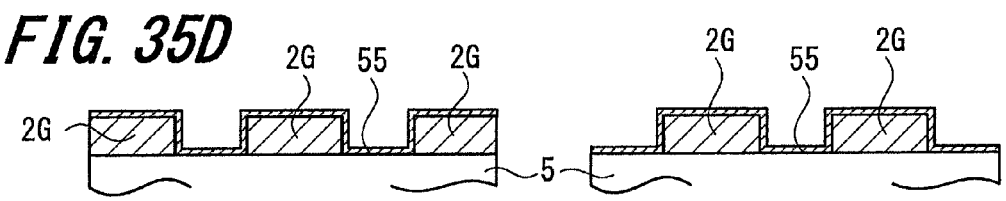
Figure 35E:
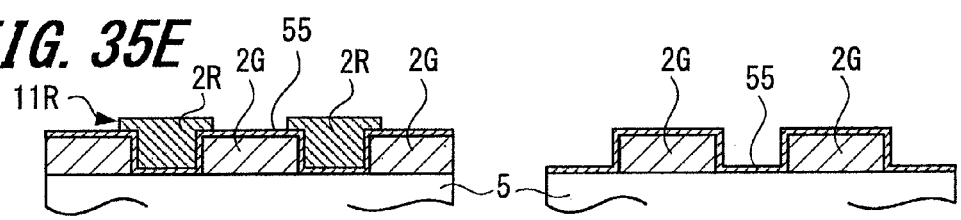
Figure 35F:
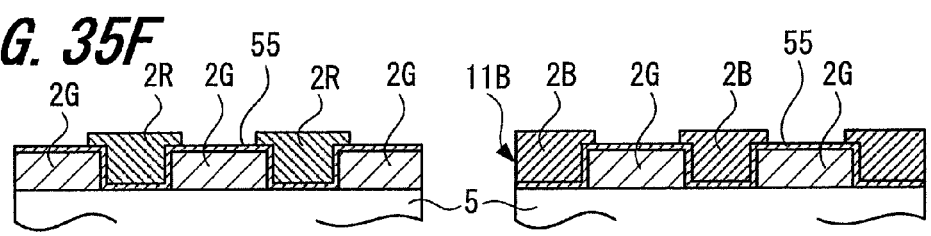
Figure 35G:
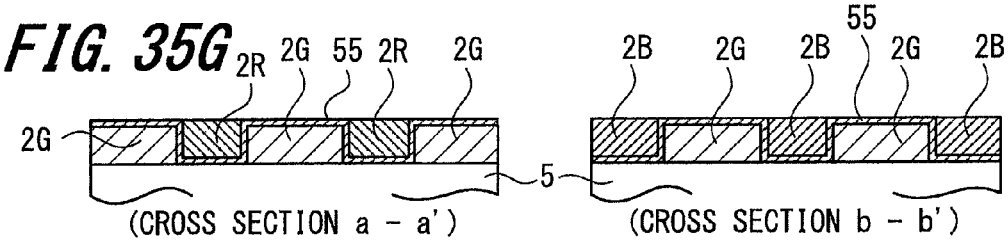

Next, as shown in FIG. 35C, the green filter component material film 11Gm are selectively removed by anisotropic dry etching through the resist mask 58, so that the green filter components 2G are formed. By performing the anisotropic dry etching, the green filter component material film 11Gm is patterned, and at the same time the resist mask 58 is completely removed. Openings 52 are formed in regions where the red filter components and the blue filter components are to be formed.

Incidentally, in the case where the resist mask 58 is left after the dry etching is performed, the residual resist mask may be removed using organic solvent.

Note that, since the steps shown in FIG. 35D to FIG. 35G are identical to those shown in FIG. 34D to FIG. 34G, like components shown in FIG. 35D to FIG. 35G are denoted by like numerals as of FIG. 34D to FIG. 34G and the explanation thereof will not be repeated. Thus, the color filter 54 can be obtained.

In the method for manufacturing the solid-state imaging device, particularly the color filter thereof according to the present embodiment, since the resist mask 58 is completely removed after the green filter component material film 11Gm has been patterned, the step of removing the resist mask is eliminated. Thus, since the step of removing the resist mask is eliminated, the manufacturing steps can be simplified compared to the method for manufacturing of the color filter shown in FIG. 34A to FIG. 34G.

The manufacturing method of the color filter according to the present embodiment has the same advantages as the method described in the ninth embodiment.

Eleventh Embodiment

Method for Manufacturing Solid-State Imaging Device, Particularly Color Filter Thereof FIG. 36A to FIG. 36G show a manufacturing method of a solid-state imaging device, particularly a color filter thereof according to an eleventh embodiment of the present invention. The present embodiment is a modification of the manufacturing method of the color filter according to the ninth embodiment, and the color filter formed by the manufacturing method according to the present embodiment has the same configuration as that of the color filter shown in FIG. 33. The cross sections shown in FIG. 36A to FIG. 36G correspond to those taken along line a-a' (green-red row) and along line b-b' (green-blue row) of FIG. 33. The present embodiment differs from the embodiment in that the blue filter component material is formed of the aforesaid material whose solid content contains no photosensitive component. Incidentally, a material contains photosensitive component may also be used as the blue filter component material in the present embodiment.

Figure 36A:
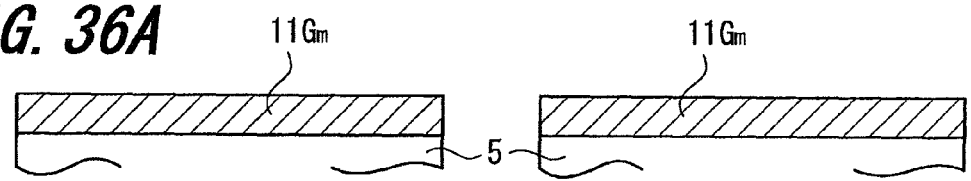
FIG. 36A to FIG. 36G show steps for forming a color filter according to an eleventh embodiment of the present invention.

The steps shown in FIG. 36A to FIG. 36E of the manufacturing method of the color filter according to the present embodiment are identical to those shown in FIG. 35A to FIG. 35E. Specifically, first, as shown in FIG. 36A, a filter component material film of the first color, such as a green filter component material film 11Gm, having a predetermined thickness is formed on the substrate 5.

Figure 36B:
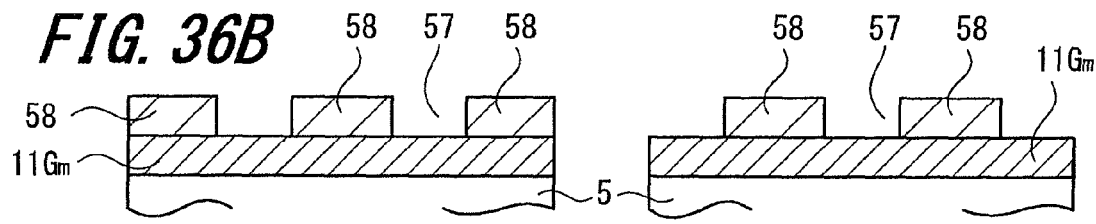

Thereafter, as shown in FIG. 36B, a resist mask 58 is formed on the green filter component material film 11Gm, the resist mask 58 having openings 57 formed in regions where the filter components of the second color and the filter components of the third color (for example, the red filter components and the blue filter components) are to be formed. The film thickness of the resist mask 58 is set so that no residual resist mask will be left after anisotropic dry etching has been performed to selectively remove the green filter component material film 11Gm in the next step shown in FIG. 36C.

Figure 36C:
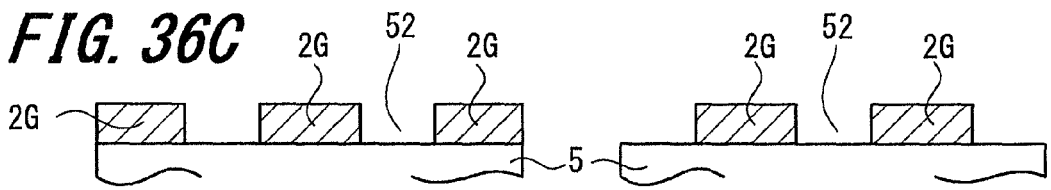
Figure 36D:
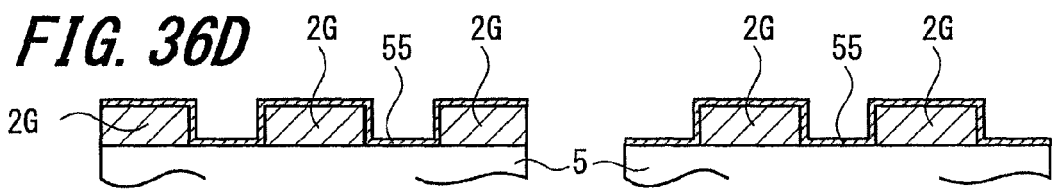

Next, as shown in FIG. 36C, the green filter component material film 11Gm are selectively removed by anisotropic dry etching through the resist mask 58, so that the green filter components 2G are formed. By performing the anisotropic dry etching, the green filter component material film 11Gm is patterned, and at the same time the resist mask 58 is completely removed. Openings 52 are formed in regions where the red filter components and the blue filter components are to be formed.

Incidentally, in the case where the resist mask 58 is left after the dry etching is performed, the residual resist mask may be removed using organic solvent.

Next, as shown in FIG. 34D, an inorganic film 55 is formed on the entire surface (including the surface of the green filter components 2G and inner wall surface of the openings 52).

Figure 36E:
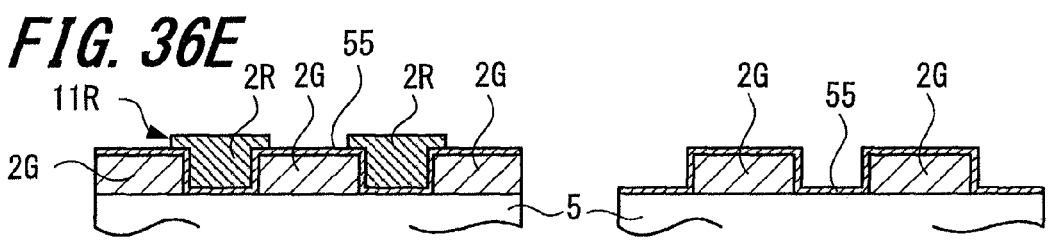

Thereafter, as shown in FIG. 36E, a red filter component material 11R (as filter component material of a second color) is coated on the entire surface, so that the openings 52 are filled with the coated red filter component material 11R. The red filter component material 11R is a photosensitive filter material. Thereafter, the red filter component material 11R is exposed and developed to form the red filter components 2R.

Figure 36F:
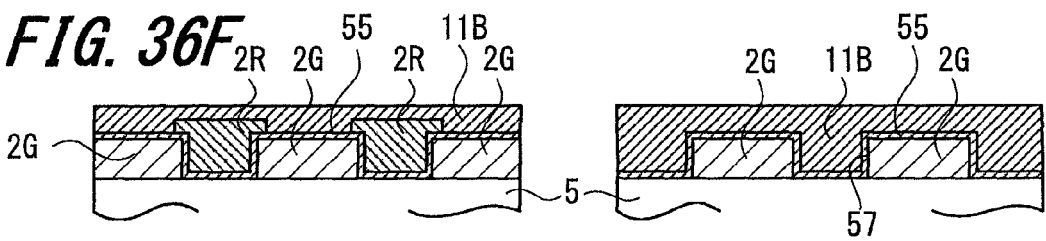

Thereafter, as shown in FIG. 36F, a film of a blue filter component material 11B (as filter component material of a third color) is formed on the entire surface. At this time, the blue filter component material 11B is made of the aforesaid material whose solid content contains photosensitive component or material whose solid content contains no photosensitive component.

Figure 36G:
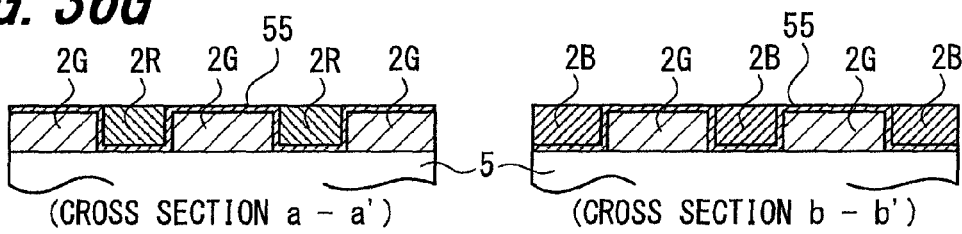

Thereafter, as shown in FIG. 36G, the red filter components 2R and the blue filter components 2B are planarized by etching back or chemical mechanical polishing (CMP) method until the surface of the inorganic film 55 is exposed.

In such a manner, a primary-color Bayer array color filter 54 having the inorganic film 55 is obtained.

In the method for manufacturing the solid-state imaging device, particularly the color filter thereof according to the present embodiment, since the resist mask 58 is completely removed after the green filter component material film 11Gm has been patterned, the step of removing the resist mask is eliminated. Thus, compared to the method for manufacturing of the color filter shown in FIG. 34A to FIG. 34G, in the case where a material contains photosensitive component is used as the blue filter component material (i.e., the filter component material of the third color), the exposure process and the resist mask removing process are eliminated, and therefore the manufacturing steps for forming the color filter can be simplified accordingly.

The manufacturing method of the color filter according to the present embodiment has the same advantages as the method described in the ninth embodiment.

Note that, in the eighth, ninth, tenth and eleventh embodiments, the forming order of the red filter components (as the filter components of the second color) and the blue filter components (as the filter components of the third color) may also be reversed.

Twelfth Embodiment

Example of Solid-State Imaging Device

Figure 37:
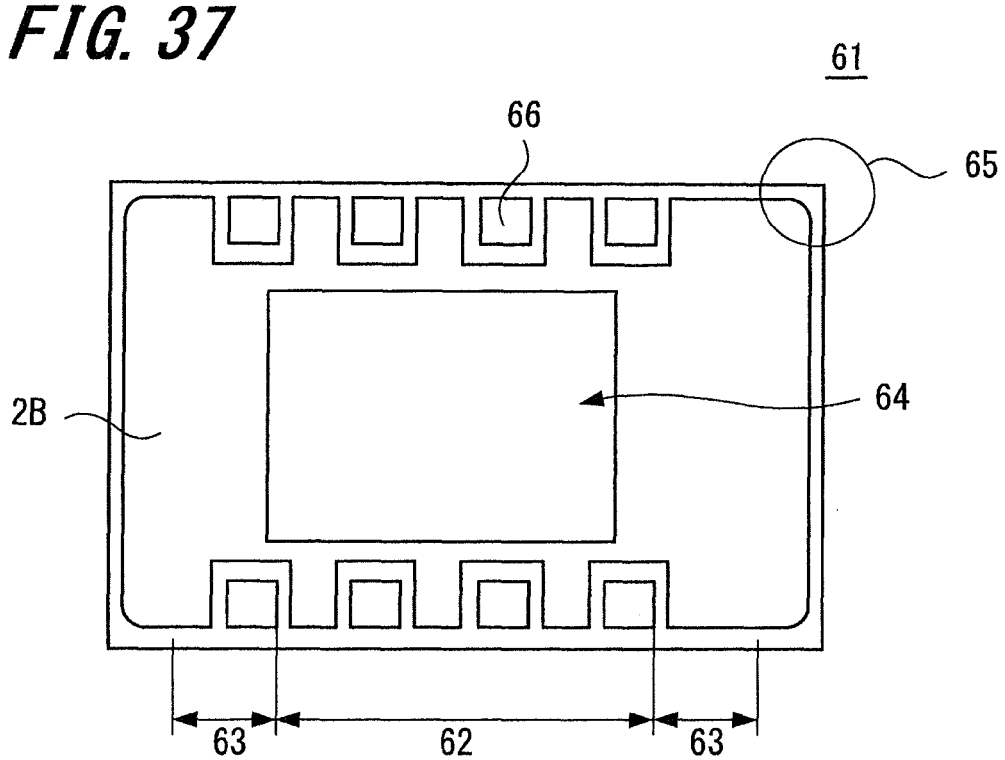
FIG. 37 shows the configuration of a solid-state imaging device according to a twelfth embodiment of the present invention.

FIG. 37 shows a solid-state imaging device 61 according to a twelfth embodiment of the present invention. The solid-state imaging device 61 according to the present embodiment includes an imaging region 62 and peripheral circuit portions 63. A color filter 64 is arranged in the imaging region 62. The color filter 64 is composed of any one of the color filters according to the aforesaid embodiments. Further, in the present embodiment, in order to reduce flare, the blue filter components 2B (or laminate films of the blue filter components 2B and the red filter components 2R) are extended from the imaging region 62 to the peripheral circuit portions 63 (to form flare preventive films). At this time, the corner portions of the ends of the blue filter components 2B or the aforesaid laminate films are rounded so as to have a curved shape. It is preferred that the corner portions near electrode pads of the blue filter components 2B or the aforesaid laminate films also be rounded to curved shape.

Figure 38:
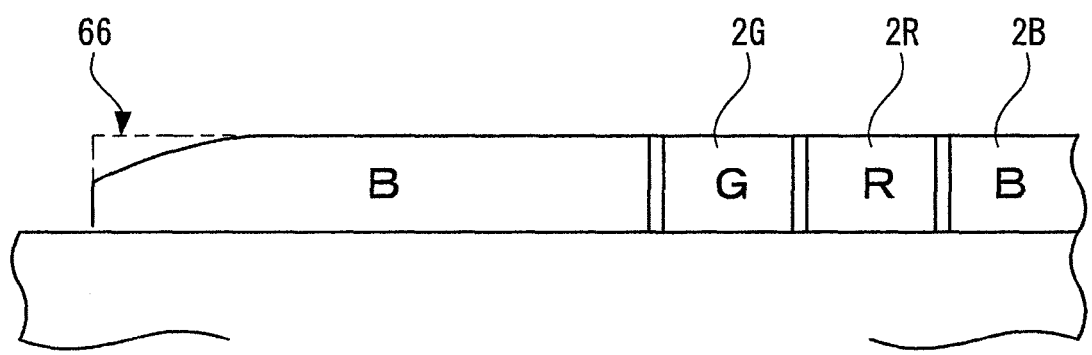
FIG. 38 is a view explaining problems of the solid-state imaging device.

In the aforesaid embodiments, when planarizing the filter components of each color by chemical mechanical polishing, in the case where the corner portions of the end portions of the filter components of each color is have a right angle, polishing pressure will concentrate at the corner portions 65, and therefore there is a concern that the corner portions 65 might be partially cut as shown in FIG. 38. If the corner portions 65 are partially cut, dust will be generated, and which will adversely affect the solid-state imaging device.

In the solid-state imaging device 61 according to the twelfth embodiment, by rounding the corner portions 65 of the end portions of the blue filter components 2B, which are extended to the peripheral circuit portion 63 for reducing flare, or the aforesaid laminate films, concentration of polishing pressure is reduced. Thus, the corner portions 65 are not polished, generation of dust is inhibited, and therefore a highly reliable solid-state imaging device can be provided. Note that, although an example in which there is a flare-preventing film is used here, the present embodiment is not limited thereto but can be applied to a configuration where in the region excluding the imaging region, the corner portions are formed into a right angled shape.

Thirteenth Embodiment

Though not shown in the drawings, the solid-state imaging device, particularly the color filter thereof according to an embodiment of the present invention may also be formed in the following manner. First, a hard mask is formed on the entire surface of a substrate, the hard mask having openings formed in regions where the filter components of the second color and the filter components of the third color (for example, the red filter components and the blue filter components) are to be formed. Thereafter, the red filter component material (as the filter component material of the second color) and the blue filter component material (as the filter component material of the third color) are selectively coated so as to be filled into the openings, so that the red filter components (as the filter components of the second color) and the blue filter components (as the filter components of the third color) are respectively formed. Thereafter, the hard mask is removed to form openings, and then the green filter component material (for example, the first component material of the second color) is coated so as to be filled into the openings, so that the green filter components are formed. In such a manner, a primary-color Bayer array color filter shown in FIG. 1 is formed wherein the red filter components and the blue filter components are each surrounded by the green filter components.

In the method for forming the solid-state imaging device, particularly the color filter thereof according to the present embodiment, the green filter components are self-aligned to the red filter components and blue filter components by using the hard mask. Thus, superposition error of the red filter components, the green filter components and the blue filter components will not be caused, and as a result, the red filter components, the green filter components and the blue filter components can be accurately formed without being superposed on each other. Further, since each of the green filter components 2G has four corners thereof connected to adjacent corners of other green filter components 2G so that the green filter components 2G are formed in one continuous piece, the green filter components 2G never peel off. Thus, processing accuracy of the color filter according to the present embodiment can be improved. Further, since the red, green and blue filter components are not superposed on each other, color mixture is inhibited. Further, since being restricted by the film thickness of the hard mask, the film thickness of the filter can be made small, and thereby the sensitivity characteristic can be improved.

Further, due to substantially the same reasons as described in the first, second, third and fourth embodiments, the green filter components 2G, the red filter components 2R and the blue filter components 2B have improved adhesion.

Fourteenth Embodiment

Figure 39:
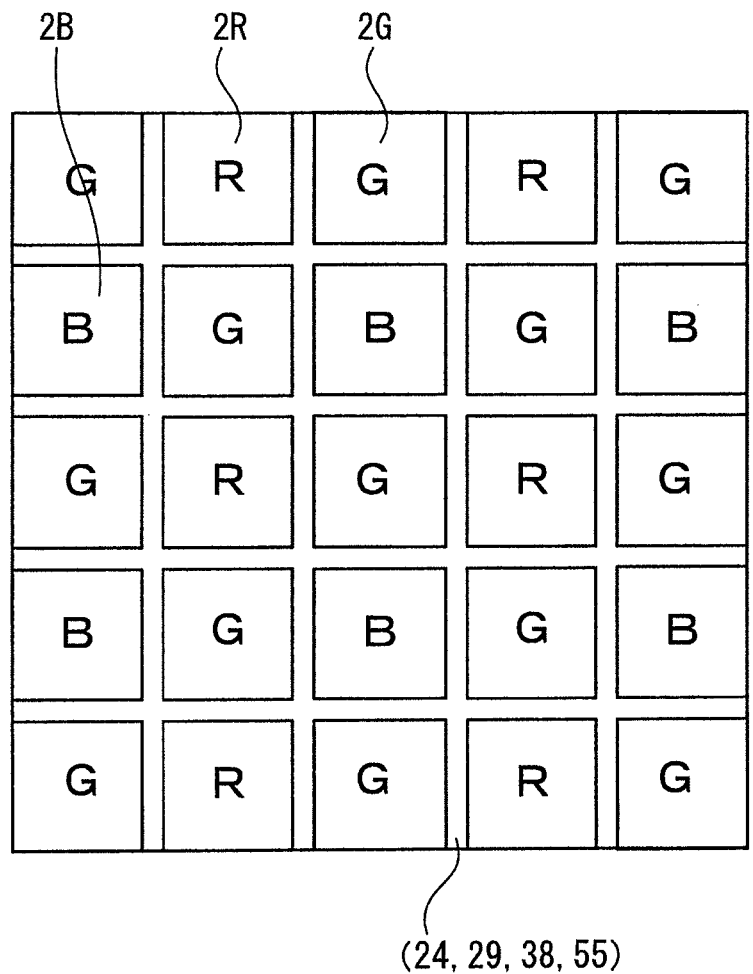
FIG. 39 shows the configuration of a color filter according to a fourteenth embodiment of the present invention.

Configuration Example of Solid-State Imaging Device, Particularly Color Filter Thereof FIG. 39 shows a solid-state imaging device, particularly a color filter thereof according to a fourteenth embodiment of the present invention. In a color filter 68 according to the present embodiment, the green filer components 2G, the red filter components 2R and the blue filter components 2B are each independently formed. Further, any one of the inorganic film 24 of the third and fourth embodiments, the light-shielding film 29 of the fifth embodiment, the light-shielding film 38 of the seventh embodiment, and the inorganic film 55 of the ninth to eleventh embodiments is continuously formed lengthwise and crosswise at the boundary between the green filter components 2G, the red filter components 2R and the blue filter components 2B. The forming method of the color filter 68 corresponds to that described in the third and fourth embodiments, the fifth embodiment, the seventh embodiment, and the ninth to eleventh embodiments.

In the color filter 68 according to the present embodiment, the red, green and blue filter components may also be formed by self-alignment. Further, advantages such as prevention of color mixture between pixels, improvement of light resistance of the filter components (in the embodiments wherein the inorganic film is formed on the filter components) and the like can be achieved.

An example of common conditions for forming the color filter according to any one of the aforesaid embodiments will be described below.

A pigment-internally-added type photopolymerizable negative resist, for example, is used as the material for forming the photosensitive filter components films, including the green filter component material film 11Gm. Film-forming conditions are as follows. A wafer is coated with the negative resist by spin-coating, then subjected to a pre-baking treatment, then exposed by a reduction projection type stepper using i-light as light source, and then subjected to a post-baking treatment, and thereby the film is formed.

The following is an example of conditions for forming the resist mask (i.e., conditions for forming the photoresist pattern). A novolac positive resist with a naphthoquinone azido photosensitive agent is used as the photoresist material. Film-forming conditions are as follows. The positive resist is coated by spin-coating, then subjected to a pre-baking treatment, and then subjected to a pattern-exposing process by a reduction projection type stepper using i-light as light source. Thereafter, a post-baking after exposure is performed. Thereafter, an aqueous solution of 2.38% of tetramethylammonium hydroxide (TMAH) is used to perform a paddle development, and then a post-baking is performed, and thereby the film is formed. Incidentally, a developer formed by adding surfactant into the aqueous solution of 2.38% of TMAH may also be used instead.

The following is an example of conditions for performing dry etching on the green filter component material film 11Gm. The etching process may be performed using one of the following etching apparatuses: microwave plasma etching apparatus, parallel plate type reactive ion etching apparatus, high pressure narrow gap type plasma etching apparatus, ECR (electron cyclotron resonance) type etching apparatus, transformer coupled plasma etching apparatus, inductively coupled plasma etching apparatus and the like. The etching process may also be performed using a high density etching apparatus such as a helicon wave plasma etching apparatus and the like. For example, when the inductively coupled plasma etching apparatus is used, the etching gas may be a fluorocarbon gas such as $CF_4$, $C_2F_6$, $C_3F_8$, $C_4F_8$, $CH_2F_2$, $CHF_3$ and the like, or a mixture gas formed by adding $O_2$, Ar, He, $N_2$ and the like into the fluorocarbon gas. As for the conditions for performing etching back by dry-etching method on the inorganic film (which contains the filter component material film of each color excluding the green filter component material film 11Gm before and after exposure and development), the etching gas may be the same gas or mixture gas as mentioned above, and the etching gas may also be a fluorocarbon gas such as $Cl_2$, $BCl_3$, HBr and the like, or a mixture gas formed by adding $O_2$, $N_2$ and the like into the fluorocarbon gas. In such a case, by detecting emission spectra of plasma caused by the dry-etching, etching end point can be detected.

The film thickness of the resist mask (photoresist film) in the tenth and eleventh embodiments is set so that no residual film of the resist mask will be left after the dry etching has been performed as described above. In the present embodiment, the patterning state of the green filter components was confirmed by SEM (Scanning Electron Microscope) photos. The result showed that excellent patterning state was obtained for both the material to which a pigment (as a colorant) is internally added and the material to which a dye (as a colorant) is internally added.

In the case where there is residual film of the resist mask left after the dry etching is performed, the residual resist mask may be removed using the following organic solvent, which has been listed previously. Examples of the organic solvent include: N-methyl-2-pyrroli-done, γ-butyrolactone, cyclopentanone, cyclohexanone, isophorone, N,N-dimethyl-acetamide, dimethylimidazolidinone, tetramethyl-urea, dimethyl sulfoxide, diethylene glycol dimethyl ether, diethylene glycol diethyl ether, diethyleneglycoldibutylether, propyleneglycol monomethylether, propyleneglycol monoethylether, dipropylene glycol monomethyl ether acetate, propyleneglycol monomethyletheracetate, methyl lactate, butyl lactate, methyl-1,3-butylene glycol acetate, 1,3-butylene glycol-3-monomethylether, methyl pyruvate, ethyl pyruvate, methyl-3-methoxypropionate and the like. These organic solvents can be used alone or as a mixed solvent of at least two thereof.

As dissolving and removing methods, these organic solvents can be used alone, or be used as a mixed solvent of at least two thereof. Further, treating methods are limited to those described above, but include other methods such as dip method.

Examples of the inorganic film formed on the color filter include, as described above, plasma SiO (P-SiO) film, plasma SiN (P-SiN) film, plasma SiON (P-SiON) film and the like. The inorganic film can be formed using plasma CVD (Chemical Vapor Deposition) method. In the case of forming a P-SiO film, $SiH_4$, $N_2O$ or $N_2$ may be used as the gas. In the case of forming a P-SiN film, $SiH_4$, $NH_3$ or $N_2$ may be used as the gas. At this time, the refractive index of the formed inorganic film is substantially 1.45 for P-Sio, and substantially 1.90 for P-SiN.

The on-chip microlenses are generally made of an acrylic resin, a polystyrenic resin, a novolak resin, or a polymerized resin thereof. The refractive indexs of these materials are substantially 1.48 to 1.62. Further, the refractive indexs of organic resins other than the aforesaid resins are all not higher than 1.9 (excluding resins into which metal oxide particulates are dispersed). Thus, it is preferred to make the refractive index of the inorganic film formed on the color filter equal to the refractive index of the on-chip microlenses, so that interface reflection is reduced. At this point, a P-SION film is formed by the plasma CVD film-forming method using $SiH_4$, $NH_3$, $N_2O$ or $N_2$ as the gas. The refractive index of the P-SION film can be adjusted in a range of 1.45 to 1.90 by changing mixing ratio of the gas. The P-SiN film, which can tightly cling to the material of the on-chip microlenses, may also be used as the inorganic film.

The film-forming temperature by the plasma CVD method can be set to 250° C. or lower, and preferably 200° C. or lower. The film thickness may be set to 150 nm or less. As for advantages of the inorganic film, in the case where the chemical mechanical polishing (CMP) method is used for planarizing the color filter, the inorganic film serves as a stopper; and in the case where the etching back method is used for planarizing the color filter, the inorganic film is used to detect the etching end point. Further, the inorganic film is also effective for preventing discoloration of the color filter when performing light irradiation, preventing interdiffusion of colorant between adjacent filter components and the like. Particularly, light resistance of dye-internally-added type color filter can be improved.

An example of preferable conditions for performing CMP on the color filter is described as follows. The pH of the slurry liquid is 7 to 14, the diameter of the slurry abrasive grain is 100 nm or less, and the concentration of the slurry abrasive grain is 5% by weight. A polishing pad is used in which, for example, a continuous foam polyurethane resin is used, the polish pressure is 5 psi or lower, and the rotating speed of the polishing head and polishing pad is 150 rpm or lower. These conditions are optimized to perform CMP. In such a case, as mentioned above, the inorganic film preferably serves as a stopper.

Figure 41:
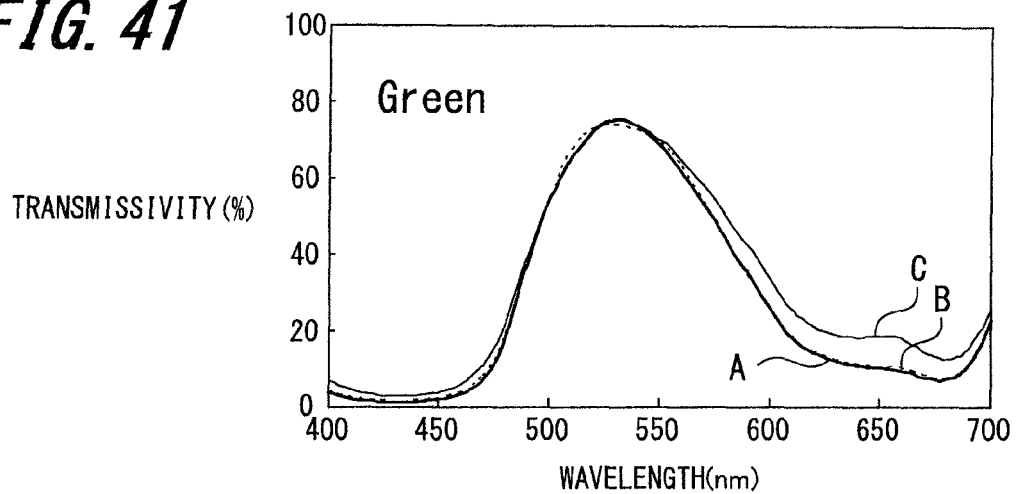
FIG. 41 is a spectral characteristic curve showing that light resistance of green filters is improved when an inorganic film is formed the color filter.
Figure 42:
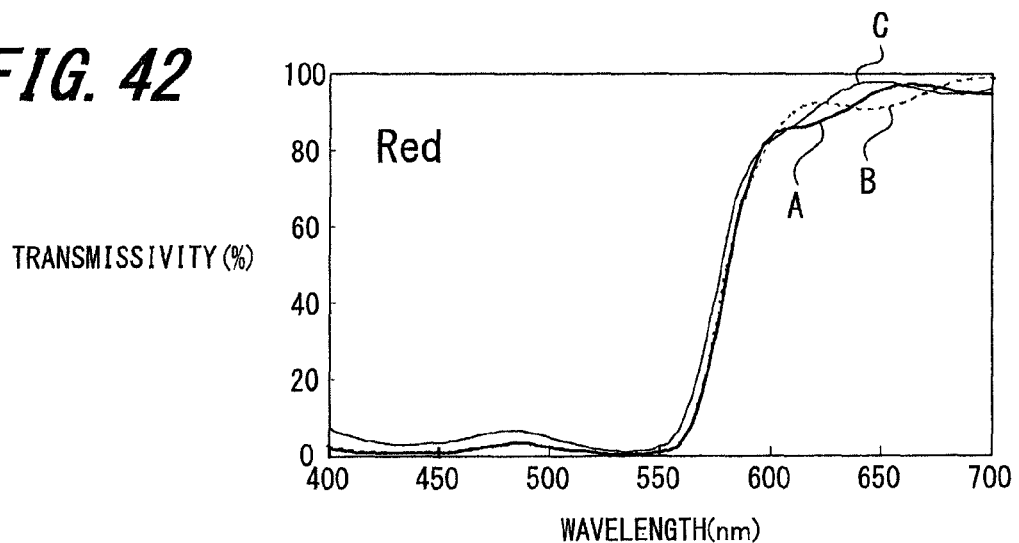
FIG. 42 is a spectral characteristic curve showing that light resistance of red filters is improved when an inorganic film is formed the color filter.
Figure 43:
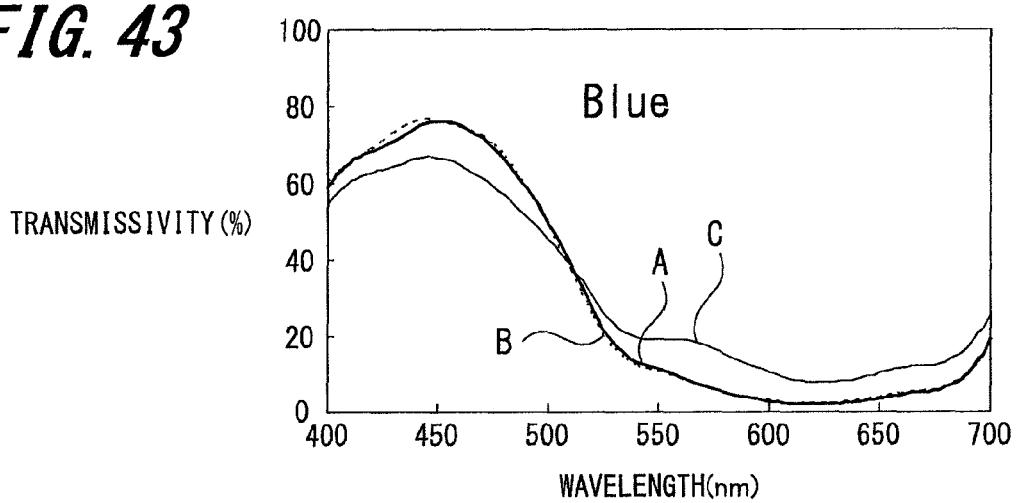
FIG. 43 is a spectral characteristic curve showing that light resistance of blue filters is improved when an inorganic film is formed the color filter.

FIG. 41 to FIG. 43 show that light resistance data (spectral characteristic) of the green filters, the red filters and the blue filters is improved when an inorganic film (a SiON film, for example) is form on the color filter by low temperature plasma film-forming method, wherein the film thickness is, for example, 100 nm, and the film-forming temperature is, for example, 180° C. The pigment is used as the colorant for each of the green filters, the red filters and the blue filters. In FIG. 41 to FIG. 43, heavy solid line A represents an initial value, broken line B represents a value corresponding to the state where the inorganic film is formed, and thin solid line C represents a value corresponding to the state where the inorganic film is not formed. It is shown in any one of FIG. 41 to FIG. 43 that light resistance is improved when the inorganic film is formed.

Table 1 shows evaluation results for red, green and blue filter in both the case where the inorganic film is formed and the case where the inorganic film is not formed. As evaluation conditions, a xenon light (which resembles the sunlight) of 2000000 lx·hr (lux·time) is irradiated. The evaluation results are expressed by spectral average change quantity (average value of spectral change quantity absolute values) Incidentally, when conducting the evaluation, an optical filter that cuts light of 380 nm or less is used, and the light passing through the filter is used to irradiate the specimen.

TABLE 1

|  | Red | Green | Blue |
| --- | --- | --- | --- |
| Having inorganic film | 3.27 | 3.87 | 7.32 |
| Having no inorganic film | 1.33 | 0.62 | 0.59 |

The unit used in Table 1 is %. Table 1 indicates average value of spectral change quantity absolute values (spectral average change quantity) of filter of each color in the wavelength ranged of 400 nm to 700 nm in the case where an inorganic film is formed as indicated by broken line B and in the case where an inorganic film is not formed as indicated by thin solid line C. As can be known from Table 1, in the case where an inorganic film (SiON film) is formed, the average change quantity is improved compared with the case where an inorganic film is not formed. Incidentally, although not shown in the drawings or table, it has been confirmed that the same advantages can be achieved to the case where an inorganic film (such as a $SiO_2$ film, a SiN film or the like) having a film thickness of, for example, 100 nm is formed on the color filter by low temperature plasma CVD film-forming method at a film-forming temperature of, for example, 180° C.

The present invention may also be applied to a surface irradiation type solid-state imaging device or a back irradiation type solid-state imaging device having the color filter 1 or the color filter 21. When the solid-state imaging device is, for example, a CMOS solid-state imaging device, the solid-state imaging device may be applied to, the present invention may be applied to a surface irradiation type solid-state imaging device wherein the light is incident from the side of the multilayered wiring layer, or a back irradiation type solid-state imaging device wherein the light is incident from the side opposite to the multilayered wiring layer. Particularly, in the back irradiation type solid-state imaging device, since there is substantially no peripheral circuit which has a large level difference from the pixel region surface excluding the imaging region, an embodiment of the present invention can further preferably be applied if the CMP method selected in the step of planarizing the color filter.

A configuration possible to be applied to the eighth, ninth, tenth and eleventh embodiments will be described as follows.

In the case where the filter components of the first color is formed by dry-etching, in order to increase the alignment accuracy, the green filter component material above the alignment mark is previously removed and then an accurate alignment of the pixel region is performed. The red filter components and the blue filter components formed thereafter are basically formed by being self-aligned to the green filter components. These steps can also be applied to the other embodiments.

Further, although not shown in the drawings, in order to increase the position accuracy of the resist mask formed at the time when forming the pattern to the green filter component material (i.e., in order to increase the alignment accuracy), the green filter component material above the alignment mark is previously removed. Alternatively, after the green filter component material film 11Gm has been formed, the green filter component material film 11Gm above the alignment mark is previously removed through the resist mask. Alternatively, the green filters are exposed and developed through an optical mask using a material containing photosensitive component, and thereby the green filter component material film 11Gm above the alignment mark is previously removed. The position accuracy of the green filter component material film 11Gm above the alignment mark may be less accurate than that in the imaging region. The alignment mark is formed on the scribe line or the like of the substrate 5.

Fifteenth Embodiment

Configuration of Electronic Device

The solid-state imaging device according to the aforesaid embodiments of the present invention can be applied to an electronic device such as a camera having a solid-state imaging device, a mobile device having a built-in camera, and other devices having a solid-state imaging device.

Figure 40:
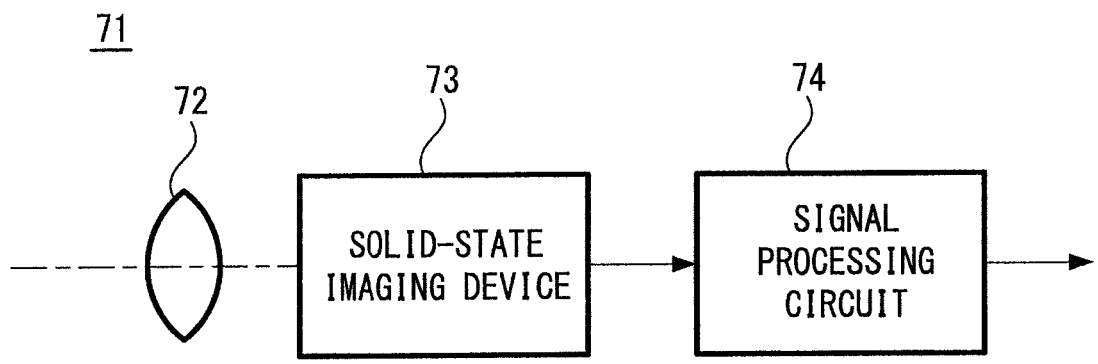
FIG. 40 schematically shows a configuration of an electronic device according to a fifteenth embodiment of the present invention.

FIG. 40 schematically shows a configuration of a camera (as an electronic device according to a fifteenth embodiment of the present invention), to which the aforesaid solid-state imaging device is applied. A camera 71 according to the present embodiment includes an optical system (optical lens) 72, a solid-state imaging device 73, and a signal processing circuit 74. The solid-state imaging device 73 is a solid-state imaging device having one of the aforesaid color filters. The optical system 72 focuses light of an image of an object (incident light) on an imaging plane of the solid-state imaging device 73. Thus, signal charges are accumulated in a photoelectric conversion element of the solid-state imaging device 73 for a predetermined period. The signal processing circuit 74 performs various kinds of signal processes for an output signal of the solid-state imaging device 73 and outputs the resultant signal. The camera 71 according to the present embodiment includes a module-type camera having modules of the optical system 72, the solid-state imaging device 73, and the signal processing circuit 74.

An embodiment of the present invention can be applied to the camera shown in FIG. 40 and a mobile device having a built-in camera typified by, for example, a mobile phone having a camera module.

Further, the camera shown in FIG. 40 can be structured as an imaging function module having an imaging function as modules of the optical system 72, the solid-state imaging device 73, and the signal processing circuit 74. An embodiment of the present invention can be applied to an electronic device having such an imaging function module.

In the electronic device according to this embodiment, since the color filter of the solid-state imaging device is formed with high accuracy, color mixture of the solid-state imaging device is inhibited, the sensitivity characteristic is improved, and the luminous shading is inhibited, an electronic device having high image quality and high performance can be provided.

The present application contains subject matter related to that disclosed in Japanese Priority Patent Application JP 2008-134698 filed in the Japan Patent Office on May 22, 2008, the entire content of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A manufacturing method of a solid-state imaging device, the method comprising:
    forming openings through a first resist mask to form a first etch mask, said first etch mask completely covering second and third portions of a hard mask, and thereafter;
    removing first portions of the hard mask during a first etch of the hard mask, said first etch mask exposing said first portions of the hard mask to said first etch, and thereafter;
    filling first openings in the hard mask with a first color filter component material, said first openings being where said first portions of the hard mask have been removed during said first etch, and thereafter;
    forming openings through a second resist mask to form a second etch mask, said second etch mask completely covering said third portions of the hard mask and said first color filter component material.

2. The manufacturing method of the solid-state imaging device according to claim 1, wherein said first etch is a dry etch.

3. The manufacturing method of the solid-state imaging device according to claim 1, wherein prior to the step of filling the first openings, the method further comprising:
    removing said first etch mask.

4. The manufacturing method of the solid-state imaging device according to claim 1, wherein a width for one of the openings through the second resist mask is smaller than a width for one of the second portions of the hard mask.

5. The manufacturing method of the solid-state imaging device according to claim 1, wherein said first color filter component material is not photosensitive.

6. The manufacturing method of the solid-state imaging device according to claim 1, further comprising:
    removing said second portions of the hard mask during a second etch of the hard mask, said second etch mask exposing said second portions of the hard mask to said second etch.

7. The manufacturing method of the solid-state imaging device according to claim 6, further comprising:
    filling second openings in the hard mask with a second color filter component material, said second openings being where said second portions of the hard mask have been removed during said second etch.

8. The manufacturing method of the solid-state imaging device according to claim 7, wherein prior to the step of filling the second openings, the method further comprising:
    removing said second etch mask.

9. The manufacturing method of the solid-state imaging device according to claim 7, wherein said second color filter component material is not photosensitive.

10. The manufacturing method of the solid-state imaging device according to claim 7, wherein a wavelength of maximum transmissivity for said second color filter component material is greater than a wavelength of maximum transmissivity for said first color filter component material.

11. The manufacturing method of the solid-state imaging device according to claim 7, further comprising:
    forming openings through a third resist mask to form a third etch mask, said third etch mask completely covering said first color filter component material and said second color filter component material.

12. The manufacturing method of the solid-state imaging device according to claim 11, wherein a width for one of the openings through the third resist mask is smaller than a width for one of the third portions of the hard mask.

13. The manufacturing method of the solid-state imaging device according to claim 11, further comprising:
    removing third portions of the hard mask during a third etch of the hard mask, said third etch mask exposing said third portions of the hard mask to said third etch.

14. The manufacturing method of the solid-state imaging device according to claim 11, further comprising:
    filling third openings in the hard mask with a third color filter component material, said third openings being where said third portions of the hard mask have been removed during said third etch.

15. The manufacturing method of the solid-state imaging device according to claim 14, wherein prior to the step of filling the third openings, the method further comprising:
    removing said third etch mask.

16. The manufacturing method of the solid-state imaging device according to claim 14, wherein said third color filter component material is not photosensitive.

17. The manufacturing method of the solid-state imaging device according to claim 14, wherein a wavelength of maximum transmissivity for said first color filter component material is greater than a wavelength of maximum transmissivity for said third color filter component material.

18. The manufacturing method of the solid-state imaging device according to claim 14, wherein a wavelength of maximum transmissivity for said second color filter component material is greater than a wavelength of maximum transmissivity for said third color filter component material.

19. The manufacturing method of the solid-state imaging device according to claim 1, wherein said first openings are formed in rows and columns of a color filter, said columns intersecting said rows.

20. The manufacturing method of the solid-state imaging device according to claim 19, wherein one of the second openings in one of the columns is formed between a first color filter component and a different first color filter component, said first color filter component and said different first color filter component being formed from said first color filter component material.

21. The manufacturing method of the solid-state imaging device according to claim 20, wherein said first color filter component is in contact with said different first color filter component.

22. The manufacturing method of the solid-state imaging device according to claim 20, wherein one of the third openings in one of the rows is between said first color filter component and an adjacent first color filter component, said adjacent first color filter component being formed from said first color filter component material.

* * * * *